US009357147B2

(12) United States Patent
Nishida et al.

(10) Patent No.: US 9,357,147 B2
(45) Date of Patent: May 31, 2016

(54) COLUMN A/D CONVERTER, COLUMN A/D CONVERSION METHOD, SOLID IMAGING DEVICE, AND CAMERA SYSTEM

(71) Applicant: Sony Corporation, Tokyo (JP)

(72) Inventors: Yuusuke Nishida, Fukuoka (JP); Yasuaki Hisamatsu, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 135 days.

(21) Appl. No.: 14/375,864

(22) PCT Filed: Feb. 20, 2013

(86) PCT No.: PCT/JP2013/054125
§ 371 (c)(1),
(2) Date: Jul. 31, 2014

(87) PCT Pub. No.: WO2013/129202
PCT Pub. Date: Sep. 6, 2013

(65) Prior Publication Data
US 2015/0326811 A1 Nov. 12, 2015

(30) Foreign Application Priority Data
Feb. 29, 2012 (JP) ................. 2012-044233

(51) Int. Cl.
*H04N 5/335* (2011.01)
*H04N 5/3745* (2011.01)
*H03K 4/08* (2006.01)
(Continued)

(52) U.S. Cl.
CPC ............ *H04N 5/37455* (2013.01); *H03K 4/08* (2013.01); *H03K 21/023* (2013.01); *H03M 1/002* (2013.01); *H03M 1/0617* (2013.01); *H03M 1/0845* (2013.01); *H03M 1/12* (2013.01); *H04N 5/3577* (2013.01); *H04N 5/378* (2013.01); *H03M 1/123* (2013.01); *H03M 1/56* (2013.01)

(58) Field of Classification Search
USPC ........................................................ 348/340
See application file for complete search history.

(56) References Cited

U.S. PATENT DOCUMENTS

2005/0242849 A1 11/2005 Muramatsu et al.
2008/0019472 A1 1/2008 Muramatsu et al.
(Continued)

FOREIGN PATENT DOCUMENTS

JP  2005-278135    10/2005
JP  2005-311933 A  11/2005
(Continued)

OTHER PUBLICATIONS

International Search Report: International Application No. PCT/JP2013/054125; Date of completion of search report: Mar. 15, 2013. (Form PCT/ISA/210).
(Continued)

*Primary Examiner* — Roberto Velez
*Assistant Examiner* — Stephen Coleman
(74) *Attorney, Agent, or Firm* — Michael Best & Friedrich LLP

(57) ABSTRACT

The present invention relates to a column A/D converter, column A/D conversion method, imaging device, and camera system that can reduce the amount of IR drop by dispersing the current consumed during the count operation, mitigate the counter characteristic degradation, readily reduce the amount of fluctuation in the power source voltage, and achieve operation at a low power source voltage. The column A/D converter includes a plurality of column processing units including an A/D conversion function, a plurality of counters configured to generate digital codes in response to a reference clock and arranged corresponding to each or a set of the column processing units, and a count start offset unit configured to trigger a pseudo count operation in each of the counters and to offset a count start code for at least two or more counters among the plurality of counters before the reference clock is supplied to the counters.

19 Claims, 40 Drawing Sheets

(51) Int. Cl.
*H03K 21/02* (2006.01)
*H03M 1/00* (2006.01)
*H03M 1/06* (2006.01)
*H03M 1/12* (2006.01)
*H04N 5/378* (2011.01)
*H03M 1/08* (2006.01)
*H04N 5/357* (2011.01)
*H03M 1/56* (2006.01)

(56) References Cited

U.S. PATENT DOCUMENTS

| | | |
|---|---|---|
| 2009/0046190 A1 | 2/2009 | Matsumoto |
| 2009/0084941 A1 | 4/2009 | Muramatsu et al. |

FOREIGN PATENT DOCUMENTS

| | | |
|---|---|---|
| JP | 2009-049459 A | 3/2009 |
| JP | 2009-118035 A | 5/2009 |
| JP | 2009-124269 A | 6/2009 |
| JP | 2011-234326 A | 11/2011 |
| JP | 2011-250395 A | 12/2011 |

OTHER PUBLICATIONS

Written Opinion of the International Searching Authority: International Application No. PCT/JP2013/054125; Date of Written Opinion: Mar. 26, 2013. (Form PCT/ISA/220 and PCT/ISA/237).

W. Yang et al. "An Integrated 800×600 CMOS Image System", ISSCC Digest of Technical Papers, pp. 304-305, Feb. 1999.

COLUMN A/D CONVERTER, COLUMN A/D CONVERSION METHOD, SOLID IMAGING DEVICE, AND CAMERA SYSTEM

TECHNICAL FIELD

The present invention relates to a column A/D converter, column A/D conversion method, solid imaging device, and camera system applicable to solid imaging devices such as CMOS image sensors.

BACKGROUND ART

A CMOS image sensor has been proposed that includes a pixel portion with multiple pixels arranged in a two-dimensional array in which image signals read from each pixel in this pixel portion are read sequentially per pixel column, and CDS or other processing is conducted on each column signal to be converted to and output as an image signal.

The CMOS image sensor has a floating diffusion (FD) amp including floating diffusion for each pixel. The output is normally a parallel column output type in which a certain row is selected in the pixel array and then simultaneously read in the column direction.

This is because it is difficult to obtain sufficient drive power from the 1-1) amp arranged in the pixel, which makes it desirable to lower the data rate and advantageous to use parallel processing.

Many different kinds of image signal reading (output) circuits for parallel column output type of CMOS image sensors have been proposed.

One of the most advanced forms of these is a type that is provisioned with an analog digital converter (hereinafter, referred to as ADC) per column to retrieve digital image signals.

CMOS image sensors equipped with such parallel column type of ADCs are disclosed, for example, in Non-Patent Literature 1 and Patent Literature 1.

FIG. 1 is a block diagram illustrating an example configuration of a solid imaging device (CMOS image sensor) equipped with parallel column ADCs.

As illustrated in FIG. 1, a solid imaging device 1 includes a pixel portion 2, a vertical scanning unit 3, a horizontal transfer scanning unit 4, and a column processing circuit group 5 made from a group of ADCs.

The solid imaging device 1 further includes a digital-analog converter (hereinafter, referred to as a DAC) 6 and an amp circuit (S/A) 7.

The pixel portion 2 is configured with a unit pixel 21, which includes a photodiode (photoelectric conversion element) and an internal pixel amp, arranged in a matrix form.

A column processing circuit 51 forming the ADC for each column are arranged in multiple columns in the column processing circuit group 5.

Each column processing circuit (ADC) 51 includes a comparator 51-1 that compares a reference signal RAMP (Vslop), which is a ramp waveform generated by the DAC 6 in which the reference signal changes in steps, and an analog signal obtained via a vertical signal line from pixels per row line.

Each column processing circuit 51 also includes a counter latch 51-2 that counts the comparison time of the comparator 51-1 and stores this count results.

The column processing circuit 51 includes a function to convert an n-bit digital signal and is disposed per vertical signal line (column line) 8-1 through 8-n, which configures the parallel column ADC block.

The output from each memory 51-2 is connected to a horizontal transfer scanning line 9 with a width of k bits, for example.

A k number of amp circuits 7 are arranged corresponding to the horizontal transfer scanning line 9.

FIG. 2 is a diagram illustrating a timing chart for the circuit in FIG. 1.

The analog signal (potential Vsl) read from the vertical signal line 8 is, for example, compared to the reference signal RAMP (Vslop) that changes in steps by the comparator 51-1 arranged per column in each column processing circuit (ADC) 51.

At this time, the levels of the analog potential Vsl and the reference signal RAMP (Vslop) intersect, which is counted by the counter latch 51-2 using a reference clock CK until the output of the comparator 51-1 inverts. As a result, the potential (analog signal) Vsl of the vertical signal line 8 is converted into a digital signal (AD conversion). In this case, the counter is configured as a full-bit ripple counter.

This AD conversion is performed twice per read.

For the first conversion, the reset level (P phase) of the unit pixel 21 is read by the vertical signal line 8 (-1 through -n), and AD conversion is executed.

Variances between pixels are included in this reset level P phase.

For the second conversion, the signal photoelectrically converted by each unit pixel 21 is read (D phase) by the vertical signal line 8 (-1 through -n), and AD conversion is executed.

Variances between pixels are also included in this D phase, and so correlated double sampling (CDS) may be implemented by executing the operation of subtracting the P phase level from the D phase level (D phase level-P phase level).

The converted digital signal is recorded by the counter latch 51-2, sequentially read by the horizontal (column) transfer scanning circuit 4 to the amp circuit 7 via the horizontal transfer scanning line 9, and ultimately output.

Parallel column output processing is performed in this way.

CITATION LIST

Patent Literature

Patent Literature 1: JP 2005-278135A
Patent Literature 2: JP 2011-234326A

Non-Patent Literature

Non-Patent Literature 1: W. Yang et al. "An Integrated 800× 600 CMOS Image System", ISSCC Digest of Technical Papers, pp. 304-305, February, 1999)

SUMMARY OF INVENTION

Technical Problem

As previously described and regarding a typical solid imaging device using the voltage slope method that reads parallel columns, a reference clock CK for determining AD resolution is input into a ripple counter arranged in all columns, and a count operation is performed for each column. In this case, the counter is configured as a full-bit binary code counter.

For this reason, as the clock frequency increases and the number of horizontal columns increases, the amount of power consumed by the counters in each column increases, which creates such problems as impairing use in products while simultaneously decreasing operational margins due to IR drop.

In addition, the load on the reference clock wiring is significant, which causes the clock duty to continually degrade as the reference clock frequency increases creating a limit on the AD resolution.

In response to this kind of situation, a column AD converter has been proposed that may significantly reduce power consumed by applying a composite counter that uses both lower-bit Gray codes and higher-bit binary codes (refer to Patent Literature 2).

However, as previously described, the column A/D converter with counters arranged in an array have the following disadvantages regarding composite counters using both lower-bit Gray codes and higher-bit binary codes and counters using full-bit binary codes.

As illustrated in FIG. 3 and FIG. 4, a rather significant internal power voltage fluctuation ΔV regarding the column A/D converter occurs from a power fluctuation ΔI that occurs due to IR drop from the simultaneous operation of the counter arranged in an array and an L component of the package (=−L×Δdi/Δt).

As illustrated in FIG. 3, the current in the column A/D converter increases instantly from the simultaneous and parallel operation of several thousand columns.

Methods to reduce this include measures to insulate against these effects such as the adding of pads to enhance the power source as well as enhancements to wiring, but this resulted in such disadvantages as increases in chip size and so on.

The present invention provides a column A/D converter, column A/D conversion method, imaging device, and camera system that make it possible to reduce the amount of IR drop by dispersing the current consumed during the count operation, mitigate the counter characteristic degradation, readily reduce the amount of fluctuation in the power source voltage, and achieve operation at a low power source voltage.

Solution to Problem

A column A/D converter according to a first aspect of the present invention includes a plurality of column processing units including an analog-digital (A/D) conversion function to convert analog signals into digital signals, a plurality of counters configured to generate digital codes in response to a reference clock and arranged corresponding to each or a set of the column processing units, and a count start offset unit configured to trigger a pseudo count operation in each of the counters and to offset a count start code for at least two or more counters among the plurality of counters before the reference clock is supplied to the counters.

A column A/D conversion method according to a second aspect of the present invention includes, when performing AD conversion regarding a plurality of column processing units each including an analog-digital (A/D) conversion function to convert analog signals into digital signals, and including a counter, triggering a pseudo count operation in the counter and offsetting a count start code for at least two or more counters among the plurality of counters before the reference clock is supplied to the counter, and generating digital codes in response to the reference clock in the counter and performing AD conversion using the digital codes.

A solid imaging device according to a third aspect of the present invention includes a pixel portion in which a plurality of pixels performing photoelectric conversion are arranged in a matrix, and a pixel signal reading unit configured to read pixel signals per unit of a plurality of pixels from the pixel portion. The pixel signal reading unit includes a column A/D converter to convert read analog signals into digital signals. The column A/D converter includes a plurality of column processing units including an analog-digital (A/D) conversion function to convert analog signals into digital signals, a plurality of counters configured to generate digital codes in response to a reference clock and arranged corresponding to each or a set of the column processing units, and a count start offset unit configured to trigger a pseudo count operation in the counters and to offset a count start code for at least two or more counters among the plurality of counters before the reference clock is supplied to the counters.

A solid imaging device according to the present invention includes a pixel portion in which a plurality of pixels performing photoelectric conversion are arranged in a matrix, a pixel signal reading unit configured to read pixel signals per unit of a plurality of pixels from the pixel portion, a first chip, and a second chip. The pixel signal reading unit includes a column A/D converter to convert read analog signals into digital signals. The column A/D converter includes a plurality of column processing units including an analog-digital (A/D) conversion function to convert analog signals into digital signals, a plurality of counters configured to generate digital codes in response to a reference clock and arranged corresponding to each or a set of the column processing units, and a count start offset unit configured to trigger a pseudo count operation in the counters and to offset a count start code for at least two or more counters among the plurality of counters before the reference clock is supplied to the counters. The first chip and the second chip are bonded having a laminated structure. The first chip is disposed with a signal line to transfer analog pixel signals discretized by the pixel array unit and time. The second chip is disposed with the pixel signal reading unit. Wiring between the first chip and the second chip is connected by the via.

A camera system according to a fourth aspect of the present invention includes a solid imaging device, and an optical system configured to image a subject on the solid imaging device. The solid imaging device includes a pixel portion in which a plurality of pixels performing photoelectric conversion are arranged in a matrix, and a pixel signal reading unit configured to read pixel signals per unit of a plurality of pixels from the pixel portion. The pixel signal reading unit includes a column A/D converter to convert read analog signals into digital signals. The column A/D converter includes a plurality of column processing units including an analog-digital (A/D) conversion function to convert analog signals into digital signals, a plurality of counters configured to generate digital codes in response to a reference clock and arranged corresponding to each or a set of the column processing units, and a count start offset unit configured to trigger a pseudo count operation in the counters and to offset a count start code for at least two or more counters among the plurality of counters before the reference clock is supplied to the counters.

A camera system according to the present invention includes a solid imaging device, and an optical system configured to image a subject on the solid imaging device. The solid imaging device includes a pixel portion in which a plurality of pixels performing photoelectric conversion are arranged in a matrix, a pixel signal reading unit configured to read pixel signals per unit of a plurality of pixels from the pixel portion, a first chip, and a second chip. The pixel signal reading unit includes a column A/D converter to convert read analog signals into digital signals. The column A/D converter includes a plurality of column processing units including an analog-digital (A/D) conversion function to convert analog signals into digital signals, a plurality of counters configured to generate digital codes in response to a reference clock and arranged corresponding to each or a set of the column processing units, and a count start offset unit configured to trigger a pseudo count operation in the counters and to offset a count start code for at least two or more counters among the plurality of counters before the reference clock is supplied to the counters. The first chip and the second chip are bonded having a laminated structure. The first chip is disposed with a signal line to transfer analog pixel signals discretized by the pixel array unit and time. The second chip is disposed with the pixel signal reading unit. Wiring between the first chip and the second chip is connected by the via.

Advantageous Effects of Invention

According to the present invention, the amount of IR drop may be reduced by dispersing the current consumed during the count operation, mitigating the counter characteristic degradation, readily reducing the amount of fluctuation in the power source voltage, and achieving operation at a low power source voltage.

DESCRIPTION OF EMBODIMENTS

Figure 1:
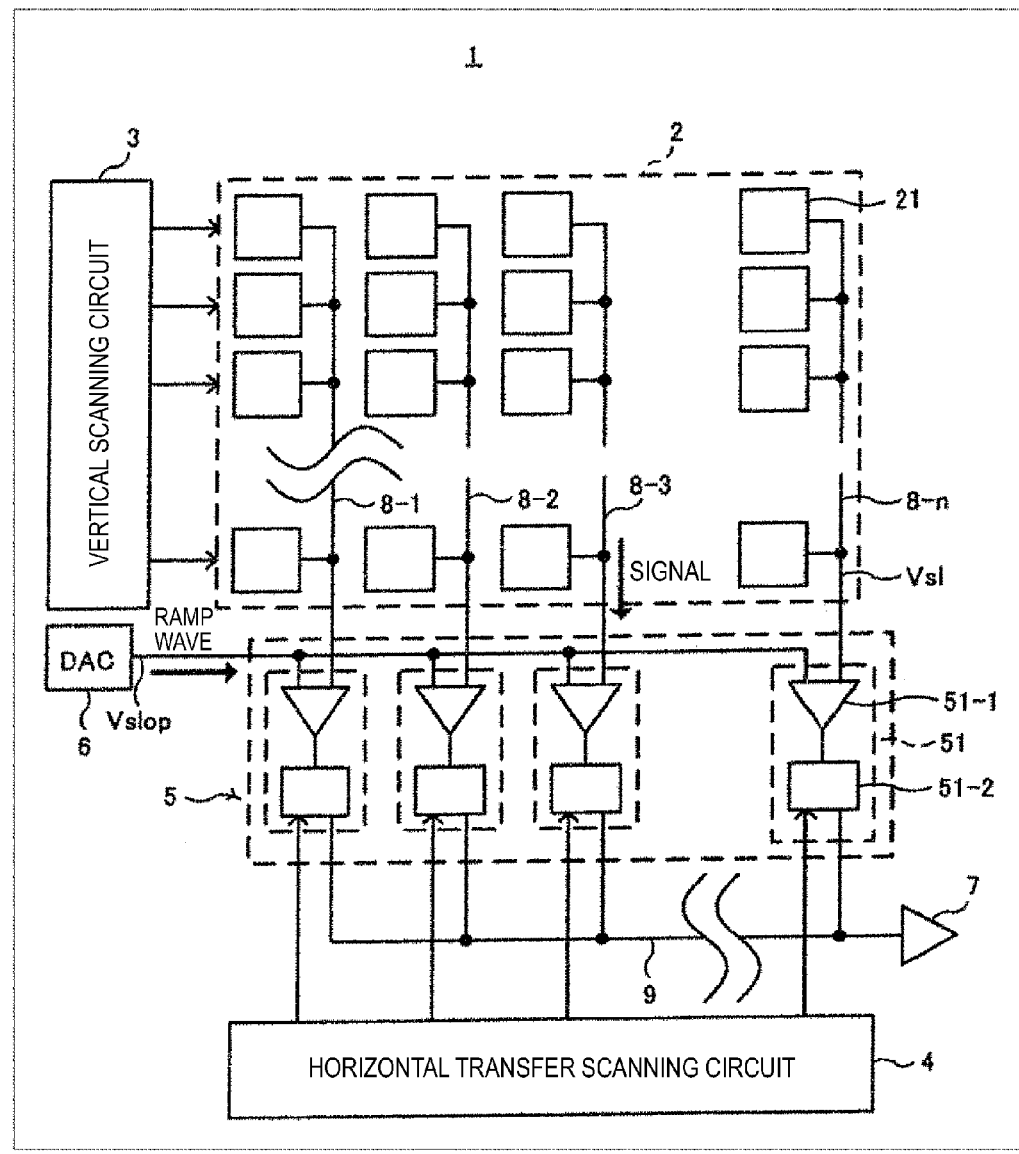
FIG. 1 is a block diagram illustrating an example configuration of a solid imaging device (CMOS image sensor) equipped with parallel column ADCs.

Hereafter, the embodiments of the present technology will be described with reference to the drawings. Note that, in this specification and the drawings, elements that have substantially the same function and structure are denoted with the same reference signs, and repeated explanation is omitted.

The description will follow this sequence.
1. Overview of semiconductor device
1.1 Configuration example of first arrangement of the semiconductor device
1.2 Configuration example of second arrangement of the semiconductor device
1.3 Configuration example of third arrangement of the semiconductor device
2. Overview of solid imaging device
2.1 Basic configuration example of the solid imaging device
2.2 Overall configuration example of solid imaging device equipped with parallel column ADCs
2.3 Basic configuration example of first column ADC
2.4 Configuration example of Gray code counter
2.5 Overview of control to intentionally offset counter start code
2.6 First configuration example of counter start offset unit
2.7 Second configuration example of counter start offset unit
2.8 Configuration example of lower-bit latch unit and higher-bit ripple counter
2.9 Basic configuration example of second column ADC
3.1 Configuration example of first arrangement of the solid imaging device
3.2 Configuration example of second arrangement of the solid imaging device
3.3 Configuration example of second arrangement of the solid imaging device
4. Configuration example of camera system <1. Overview of Semiconductor Device>

Figure 5:
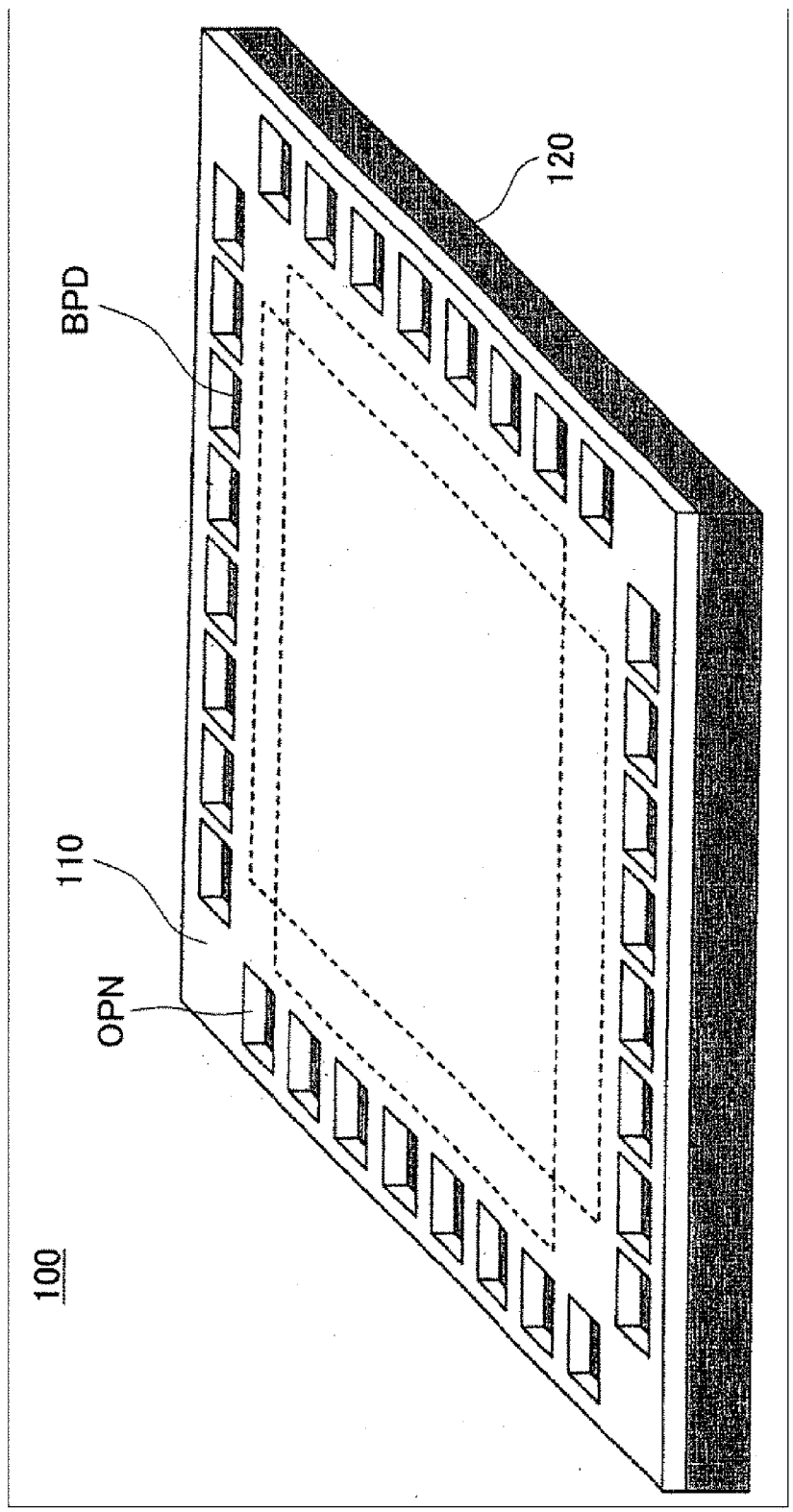
FIG. 5 is a diagram illustrating an example of a laminated structure of a semiconductor device according to an embodiment of the present technology.

FIG. 5 is a diagram illustrating an example of a laminated structure of a semiconductor device according to the present embodiment.

A semiconductor device 100 according to the present embodiment includes multiple sensors that include photoelectric conversion elements arranged in an array.

Hereafter, a configuration example of a semiconductor device having such a configuration will be described followed by a description of a configuration example of a CMOS image sensor, which is a solid imaging device as an example of the semiconductor device.

Specific configuration examples of a single slope type of AD converter applicable to solid imaging devices will also be described that is capable of reducing errors affecting the input waveform, improve accuracy without increasing the current consumed, noise, or area, and is capable of preventing AD conversion errors and image degradation.

As illustrated in FIG. 5, the semiconductor device 100 has a laminated structure with a first chip (upper chip) 110 and a second chip (lower chip) 120.

The laminated first chip 110 and second chip 120 are electrically connected by a via (through contact (silicon) via, or TC(S)V) formed on the first chip 110.

This semiconductor device 100 is formed as a semiconductor device with a laminated structure by lamination at the wafer level, and then being cut out with dicing equipment.

Regarding the laminated structure with two chips (upper and lower), the first chip 110 is configured with an analog chip (sensor chip) in which multiple sensors are arranged in an array.

The second chip 120 is configured with a logic chip (digital chip) including a circuit to quantize the analog signal transferred from the first chip 110 via the TCV and a signal processing circuit.

A bonding pad BPD and input and output circuit are formed on the second chip 120, and an opening OPN for a wire bond to the second chip 120 is formed on the first chip 110.

In addition, the semiconductor device 100 having the two-chip laminated structure according to the present embodiment has the following distinctive configuration.

The electrical connection between the first chip 110 and the second chip 120 is made, for example, through a via (TCV).

The position of the arrangement of the TCV (via) is between the edges of the chips or the pad and the circuit region.

Control signals and a power supply TCV are concentrated mainly in the four locations at the chip corners, for example, which may reduce the signal wiring region of the first chip 110.

By reducing the number of wiring layers in the first chip 110, power line resistance is increased, and enhancements for noise reduction and stabilizing the supply of power to the first chip 110 may be performed using the wiring of the second chip 120 by effectively arranging the TCV to resolve the problem of increases in the IR-drop.

<1.1 Configuration Example of First Arrangement of the Semiconductor Device>

Figure 6:
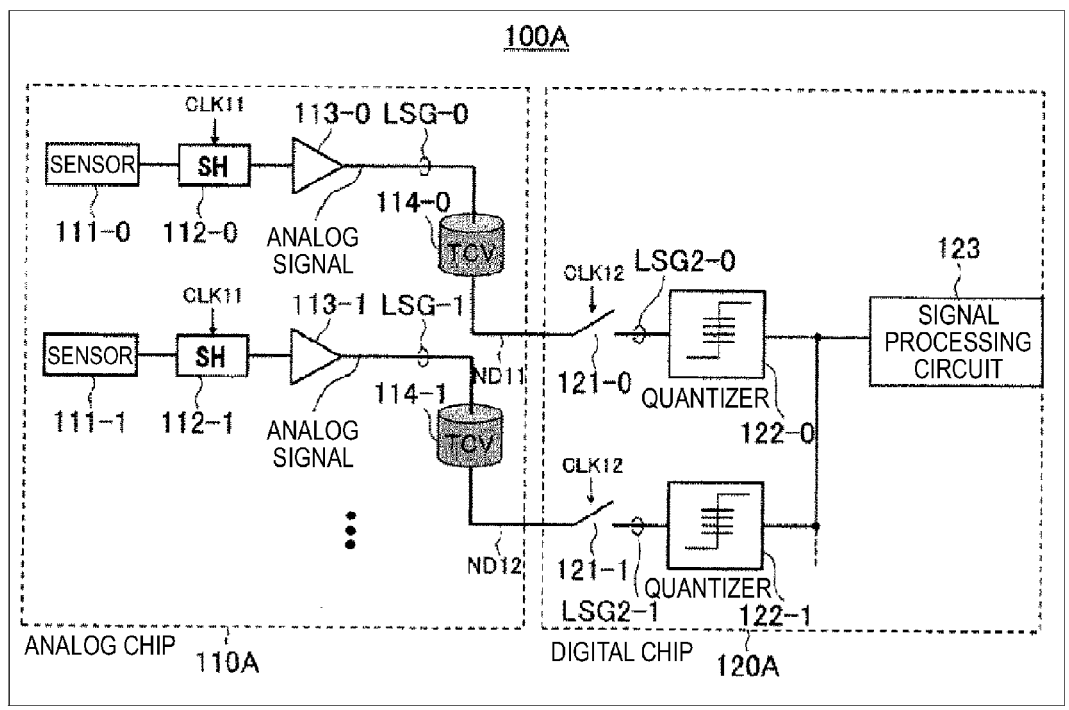
FIG. 6 is a diagram illustrating an example configuration of a first arrangement of a circuit regarding the semiconductor device according to the present embodiment.

FIG. 6 is a diagram illustrating an example configuration of a first arrangement of a circuit regarding the semiconductor device according to the present embodiment.

A semiconductor device 100A in FIG. 6 illustrates a first chip 110A and a second chip 120A extending two-dimensionally so that the arrangement of circuits and other portions of the first chip 110A and the second chip 120A having a laminated structure may be readily understood.

The first chip 110A is formed with multiple sensors 111 (-0, -1, . . . ) arranged in an array and a first signal line LSG1 (-0, -1, . . . ) to transmit the analog signal (sensor signal) output by each sensor 111 (-0, -1, . . . ).

Regarding the first chip 110A, a sample and hold (SH) circuit 112 (-0, -1, . . . ) to sample the sensor signals from each sensor 111 (-0, -1, . . . ) with a first clock CLK 11 is disposed in the first signal line LSG1 (-0, -1, . . . ). The first signal line LSG1 (-0, -1, . . . ) is disposed with an amplifier (amp) 113 (-0, -1, . . . ) to amplify the sensor signal output from each sample and hold (SH) circuit 112 (-0, -1, . . . ).

A TCV 114 (-0, -1, . . . ) is also formed on the first chip 110A to electrically connect the first signal line LSG1 (-0, -1, . . . ) to the second chip 120A as well as transmit the sensor signals.

Though not illustrated, a TCV for power and control signals is also formed on the first chip 110A.

The second chip 120A is formed with a second signal line LSG2 (-0, -1, . . . ) connected to each TCV 114 formed on the first chip 110A.

A sampling switch 121 (-0, -1, . . . ) to sample the sensor signals transmitted by the TCV 114 with a second clock CLK 12 is disposed in each second signal line LSG2 (-0, -1, . . . ).

Each second signal line LSG2 (-0, -1, . . . ) is disposed with a quantizer 122 (-0, -1, . . . ) to quantize the signals sampled by the sampling switch 121 (-0, -1, . . . )

The second chip 120A is disposed with a signal processing circuit 123 to perform digital calculation processing on the signals quantized by each quantizer 122 (-1, -2, . . . ).

Regarding the semiconductor device 100A, the signal output from each sensor 111 is sampled and held by the SH circuit 112 and transmitted to the amp 113 via the TCV 114.

In this case, the amp may be omitted if the power of the signal output from the SH circuit 112 and from the sensor 111 is sufficiently strong.

The signal transmitted via the TCV 114 is sampled by the sampling switch 121 on the second chip 120A, which is a logic chip (digital chip), and then quantized in the voltage direction using the quantizer 122. In this way, calculation processing is performed on the digitized data by the signal processing circuit 123.

According to the present technology, the signal transmitted through the TCV 114 is discretized in the temporal direction, which is a continuous signal in the voltage direction, that is to say, a discrete time analog signal.

In this case, the signal interference is also generated from the adjacent TCV 114.

However, interference between each TCV may be avoided by appropriately controlling the timing of the first clock CLK 11, which controls the timing of the sample and hold function at the SH circuit 112, and the second clock CLK 12, which controls the sampling of the discrete time analog signal.

FIG. 7A through 7C are diagrams illustrating a temporal relationship between signals of the semiconductor device according to the present embodiment.

FIG. 7A illustrates the signal waveform of a node ND 11 to which the signal transmitted through the TCV is supplied.

FIG. 7B illustrates the first clock CLK 11, and FIG. 7C illustrates the second clock CLK 12.

Now, the description will focus on the node ND 11 and the discrete time analog signal transmitted through the TCV 114.

The timing of the first clock CLK 11 used is common at the SH circuit 112 connected to all sensors 111, and so, ideally, the time for the signal transition to a node ND 12 adjacent to the node ND 11 is synchronized.

However, when the timing to output the signal from the sensor to the node ND 11 and the node ND 12 is offset due to signal wiring delay, for example, spikes in the signal caused by interference are generated as illustrated in FIG. 7A.

However, the signal regarding the period for the transmission of one data unit is already time discretized by the SH circuit 112, and so the signal has a constant value during this period, and the signal settles to a desired value after a sufficient amount of time elapses.

By performing a drive so that sampling is performed using the second clock CLK 12 at this timing when the value has sufficiently settled, errors generated by interference from the TCV 114 may be reduced to a negligible level.

<1.2 Configuration Example of Second Arrangement of the Semiconductor Device>

Figure 8:
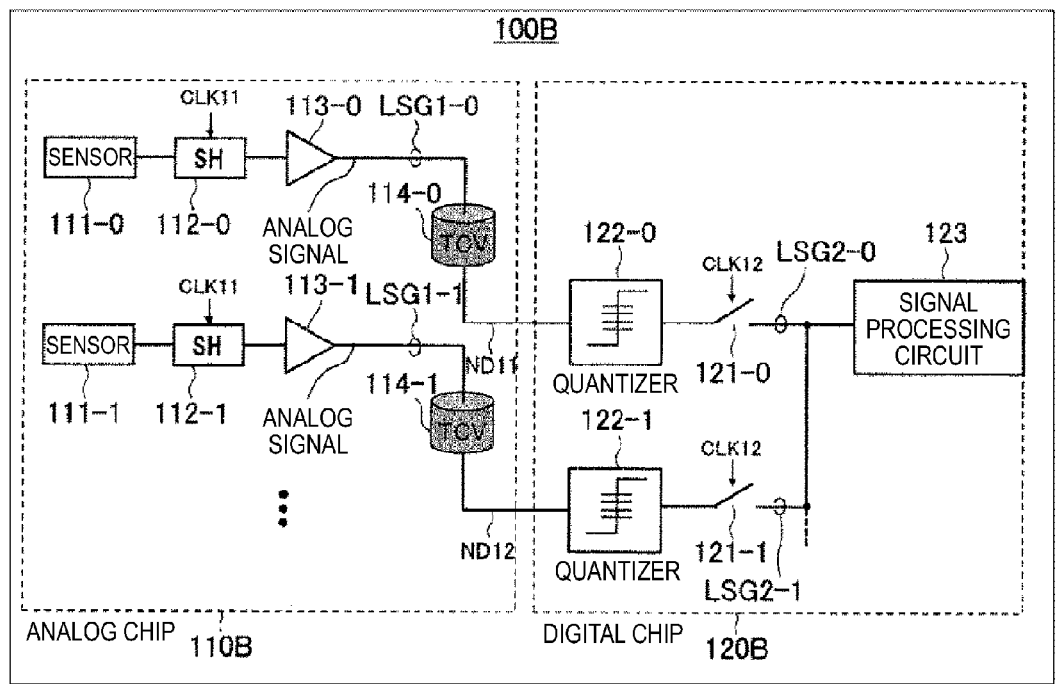
FIG. 8 is a diagram illustrating an example configuration of a second arrangement of a circuit regarding the semiconductor device according to the present embodiment.

FIG. 8 is a diagram illustrating an example configuration of a second arrangement of a circuit regarding the semiconductor device according to the present embodiment.

Figure 2:
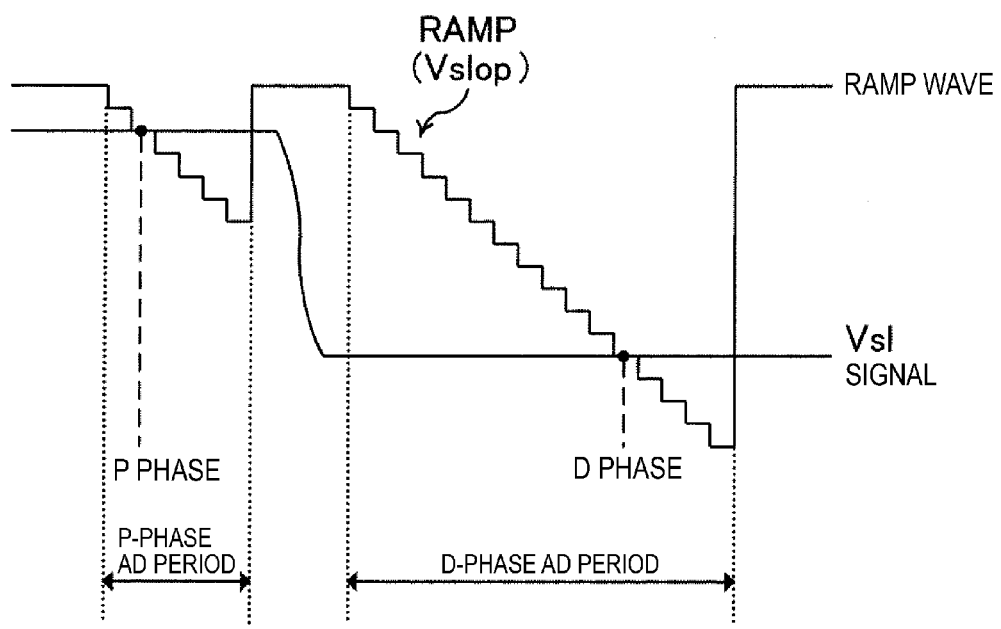
FIG. 2 is a diagram illustrating a timing chart for the circuit in FIG. 1.

The following describes the differences between the semiconductor device 100A in FIG. 2 and a semiconductor device 100B in FIG. 8.

That is to say, regarding a second chip 120B, the position of arrangement (connecting position) of the sampling switch 121 (-0, -1, . . . ) disposed in each second signal line LSG2 (-0, -1, . . . ) and the quantizer 122 (-0, -1, . . . ) are reversed.

According to the present technology, the sequence of the sampling and quantization at the timing from the second clock CLK 12 may be switched with quantization during the continuous time while the sampling switch 121 is connected to the quantizer 122.

In this case, the operation of the sampling switch 121 is implemented by provisioning a flip-flop for each signal.

According to the configuration as in FIG. 6, when the sampling switch 121 is off (power is cut), a kT/C noise is generated, which has the potential to create a problem. However, this kT/C noise is not generated with the configuration in FIG. 8.

<1.3 Configuration Example of Third Arrangement of the Semiconductor Device>

Figure 9:
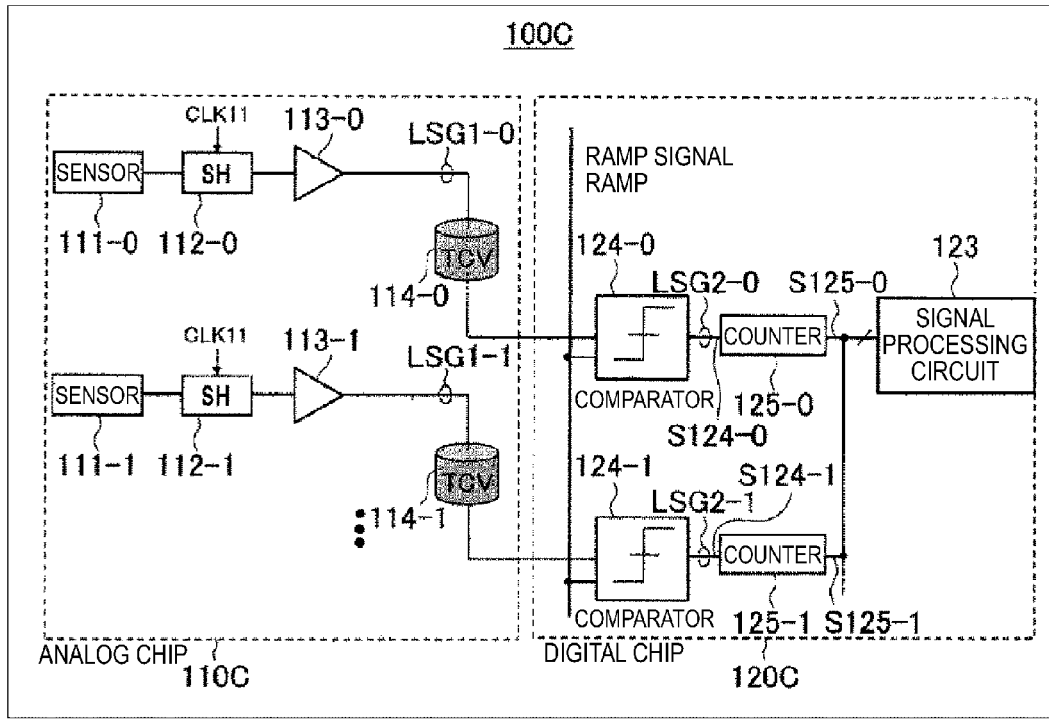
FIG. 9 is a diagram illustrating an example configuration of a third arrangement of a circuit regarding the semiconductor device according to the present embodiment.

FIG. 9 is a diagram illustrating an example configuration of a third arrangement of a circuit regarding the semiconductor device according to the present embodiment.

Figure 7:
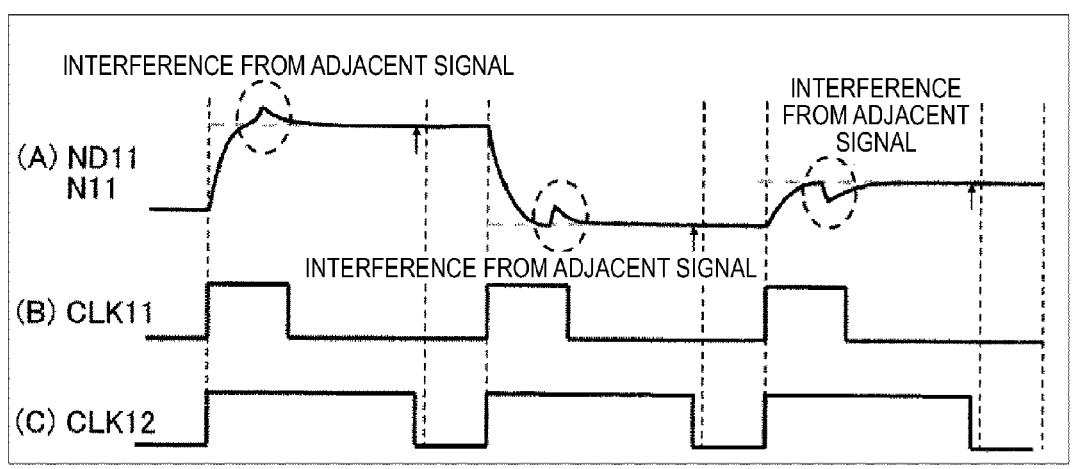
FIG. 7 is a diagram illustrating a temporal relationship between signals of the semiconductor device according to the present embodiment.

The following describes the differences between the semiconductor device 100A and 100B in FIG. 6 and FIG. 7 and a semiconductor device 100C in FIG. 9.

That is to say, regarding a second chip 120C, a comparator 124 (-0, -1, . . . ) and a counter 125 (-0, -1, . . . ) are provisioned in place of the sampling switch and the quantizer.

Regarding the second chip 120C, the comparator 124 compares a ramp signal RAMP and the sensor signal transmitted through the TCV 114 to convert from the voltage axis to the time axis, and then time information is quantized by the counter 125.

Figure 10:
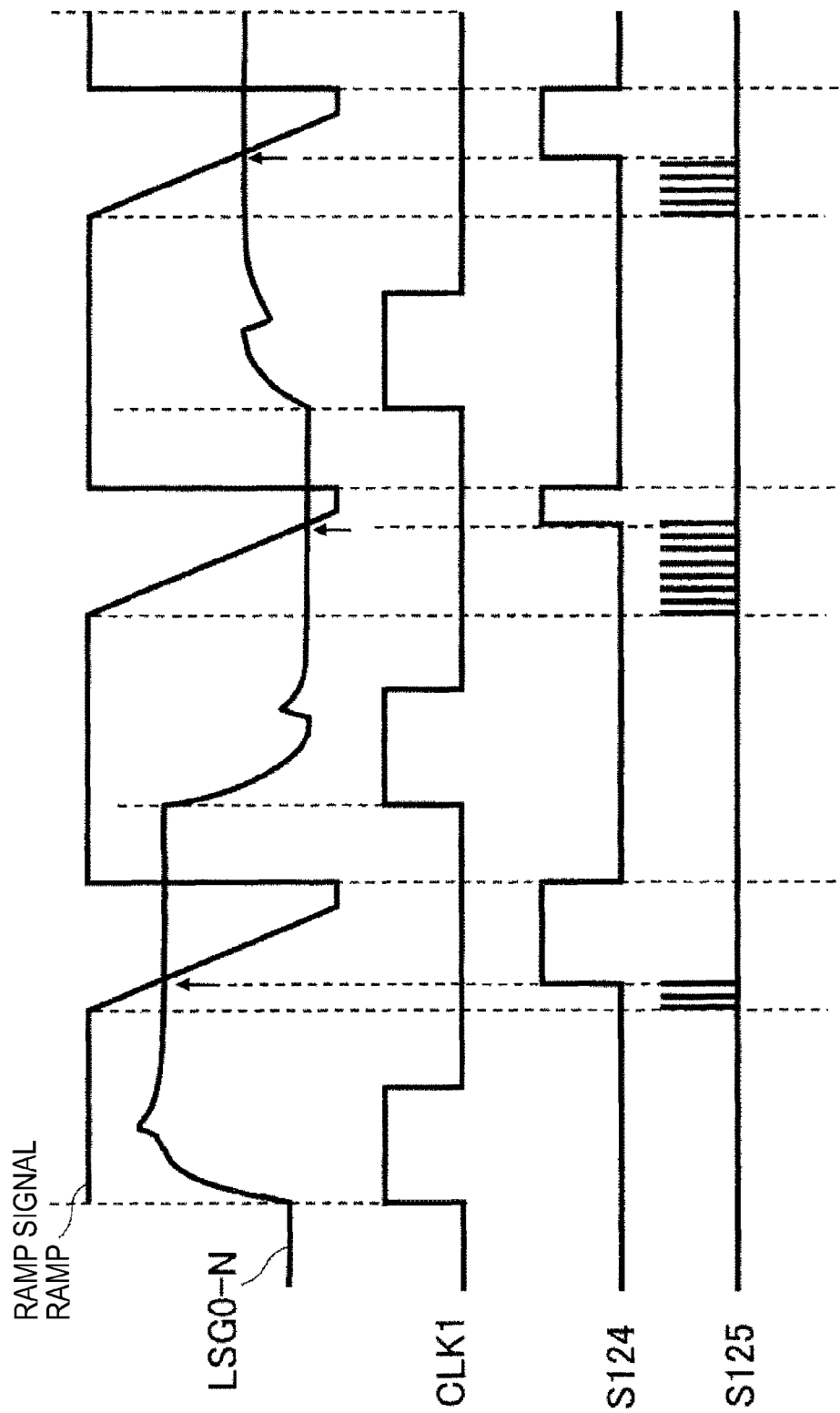
FIG. 10 is a diagram illustrating that interference from adjacent columns may be reduced in the waveform of the temporal axis during operation of the semiconductor in FIG. 9.

FIG. 10 illustrates that interference from adjacent columns may be reduced using the same principle as that in FIG. 7 in this case. Regarding the configuration in FIG. 9, the AD conversion operation is performed by comparison with the ramp signal RAMP, and then converting this time into a digital value at the counter 125. Therefore, signals are not input into the AD converter during the time that the ramp wave and the counter 125 are not operating.

As illustrated in FIG. 10, by starting the transition of the ramp wave and the operation of the counter after a signal output LSGO-N has sufficiently settled, errors due to interference from adjacent TCVs similar to that in FIG. 7 may be reduced.

<2. Overview of Solid Imaging Device>

A configuration example of a CMOS image sensor, which is the solid imaging device functioning as an example of the semiconductor device according to the present embodiment, will be described.

<2.1 Basic Configuration Example of the Solid Imaging Device>

Figure 11:
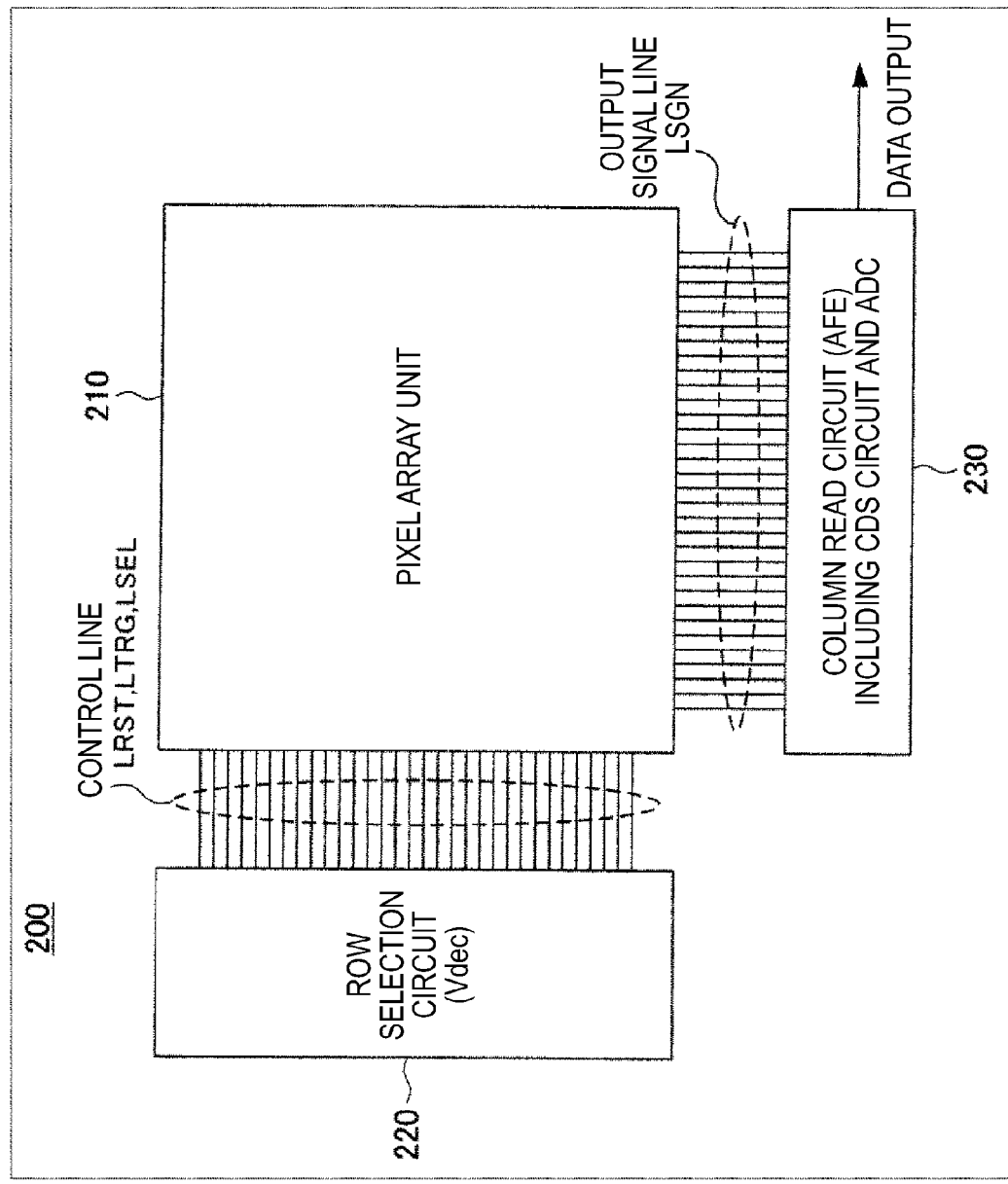
FIG. 11 is a diagram illustrating an example of a basic configuration of a solid imaging device (CMOS image sensor) according to the present embodiment.

FIG. 11 is a diagram illustrating an example of a basic configuration of a solid imaging device (CMOS image sensor) according to the present embodiment.

A CMOS image sensor 200 in FIG. 11 includes a pixel portion 210, a row selection circuit (Vdec) 220, and a column read circuit (AFE) 230.

In addition, a pixel signal reading unit is formed by the row selection circuit 220 and the column reading circuit 230

The laminated structure in FIG. 5 is adopted for the CMOS image sensor 200 functioning as the semiconductor device.

According to the present embodiment and regarding this laminated structure, basically the pixel portion 210 is arranged on the first chip 110, and the row selection circuit 220 and column reading circuit 230 forming the pixel signal reading unit are formed on the second chip 120.

In addition, a pixel drive signal, analog read signal from the pixel (sensor), power voltage, and so on are exchanged between the first chip 110 and the second chip 120 via a TCV formed on the first chip 110.

Multiple pixel circuits 210A are arranged two-dimensionally (matrix) by an M number of rows×an N number of columns in the pixel portion 210.

Figure 12:
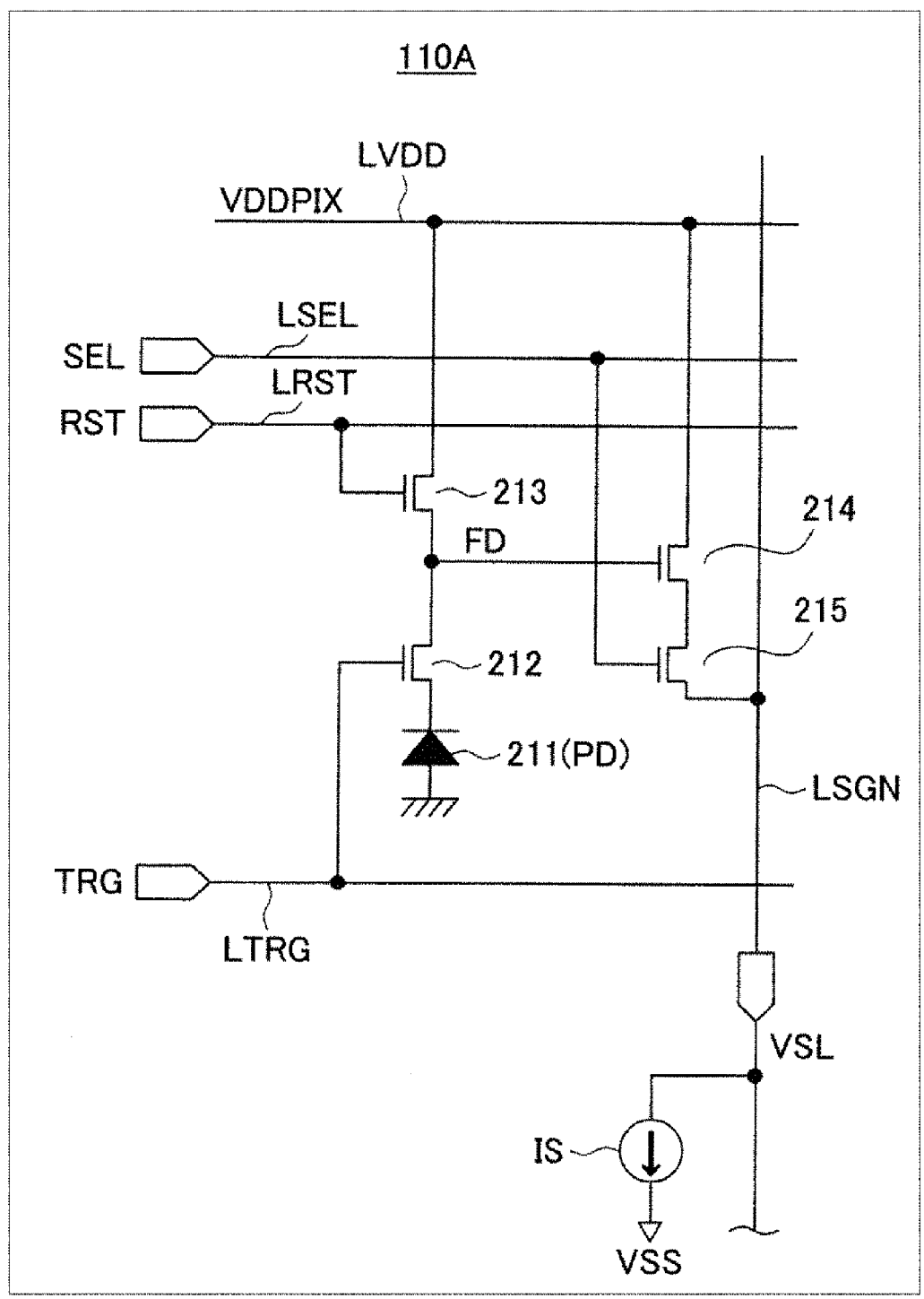
FIG. 12 is a diagram illustrating an example of a pixel of the CMOS image sensor configured by four transistors according to the present embodiment.

FIG. 12 is a diagram illustrating an example of a pixel of the CMOS image sensor configured by four transistors according to the present embodiment.

The pixel circuit 210A includes a photoelectric conversion element (hereinafter, referred to as PD) 211 made from photodiodes (PD), for example.

In addition, the pixel circuit 210A includes four transistors as active elements for each photoelectric conversion element (light-receiving unit) 211, a transfer transistor (transfer gate) 212, a reset transistor 213, an amplifying transistor 214, and a selection transistor 215.

The photoelectric conversion element 211 photoelectrically converts incident light into an amount of voltage (electrons in this case) corresponding to the amount of light.

The transfer transistor 212 functioning as a transfer element is connected between the photoelectric conversion element 211 and a floating diffusion FD functioning as an input node, and is supplied with a transfer signal TRG which is a control signal to a gate (transfer gate), via a transfer control line LTRG.

As a result, the transfer transistor 212 transfers electrons photoelectrically converted by the photoelectric conversion element 211 to the floating diffusion FD.

The reset transistor 213 is connected between a power line LVDD that supplies a power voltage VDD and the floating diffusion FD, and supplies a reset signal RST, which is a control signal to a gate, via a reset control line LRST.

As a result, the reset transistor 213 functioning as a reset element resets the potential of the floating diffusion FD to the potential of the power line LVDD.

A gate for the amplifying transistor 214 functioning as an amplifying element is connected to the floating diffusion FD. That is to say, the floating diffusion FD functions as an input node for the amplifying transistor 214 functioning as an amplifying element.

The amplifying transistor 214 and the selection transistor 215 are connected in series between the signal line LSGN and the power line LVDD, which supplies the power voltage VDD In this way, the amplifying transistor 214 is connected to the signal line LSGN via the selection transistor 215, and configures a source follower and a constant current source IS external to the pixel portion.

A selection signal SEL, which is a control signal corresponding to an address signal, is supplied to a gate to the selection transistor 215 via a selection control line LSEL to turn on the selection transistor 215.

When the selection transistor 215 is turned on, the amplifying transistor 214 amplifies the potential of the floating diffusion FD and outputs voltage corresponding to this potential to the signal line LSGN. The voltage output from each pixel via the signal line LSGN is output to the column reading circuit 230.

These operations may be performed simultaneously for each row of pixels as the gates for the transfer transistor 212, the reset transistor 213, and the selection transistor 215 are connected in units of rows.

The reset control line LRST, the transfer control line LTRG, and the selection control line LSEL wired in the pixel portion 210 are wired in units of each row in the pixel array as a set.

Each of the control lines LRST, LTRG, and LSEL are provisioned every M number.

The reset control line LRST, the transfer control line LTRG, and the selection control line LSEL are driven by the row selection circuit 220.

As previously described, the pixel portion 210 having such a configuration is formed on the first chip 110 including the signal wiring and control wiring.

According to the present embodiment, the amplifying transistor 214 arranged on the first chip 110 and the constant current source IS forming the source follower are disposed to the second chip 120 side.

The row selection circuit 220 controls the operation of pixels arranged in an arbitrary number of rows in the pixel portion 210. The row selection circuit 220 controls pixels via the control lines LSEL, LRST, and LTRG.

The row selection circuit 220 performs pixel drive control, for example, by switching the exposure method every row between a rolling shutter method that performs exposure and a global shutter method that performs exposure before pixel drive in accordance with a shutter mode switching signal.

The column reading circuit 230 receives data for pixel rows read and controlled by the row selection circuit 220 via the signal line LSGN, and transfers this to a downstream signal processing circuit.

The column reading circuit 230 includes a CDS circuit and an analog-digital converter (ADC).

[Overall Configuration Example of Solid Imaging Device Equipped with Parallel Column ADCs]

Though the solid imaging device (CMOS image sensor) according to the present embodiment is not particularly limited, it may be configured as a solid imaging device (CMOS image sensor) equipped with parallel column type analog-digital conversion devices (hereinafter, referred to as ADCs), for example.

Hereafter, configuration examples of a solid imaging device (CMOS image sensor) equipped with parallel column type ADCs will be described.

First, an example of the overall configuration of the solid imaging device equipped with parallel column ADCs will be described. Afterwards, a first solid imaging device (CMOS image sensor) including a first column ADC in which composite counters using lower-bit Gray codes and higher-bit binary codes is arranged in an array will be described.

Afterwards, a second solid imaging device (CMOS image sensor) including a second column ADC in which full-bit binary code counters are arranged in an array will be described.

According to the present embodiment, the first and second ADCs in which multiple counters are arranged in an array have a configuration with the following features.

That is to say, according to the present embodiment, the amount of IR drop due to counter operation is reduced, the amount of fluctuation in power source voltage is reduced, and operation at a low power source voltage is readily achieved.

For example, the configuration may include a logical sum (OR) taken from the code offset path and clock supply path of the multiple counters arranged in an array, and a pseudo count operation is performed before the counter clock supply to intentionally offset the count start code.

As a result, by dispersing the current consumed during the count operation, the amount of IR drop may be reduced and counter characteristic degradation may be mitigated, which improves image quality.

By intentionally offsetting the count start code, advantages include a reduction in the IR drop, a reduction in the amount of fluctuation in power source, and an improvement in the ability of operation at a low power source voltage.

As will be described later, the control to intentionally offset the count start code is simple and is processed during the period outside the count operation, which has no effect on counter characteristics and enables simple maintenance.

In addition, circuits do not have to be provisioned for each array, and so there is little impact on size.

<2.2 Overall Configuration Example of Solid Imaging Device Equipped with Parallel Column ADCs>

Figure 13:
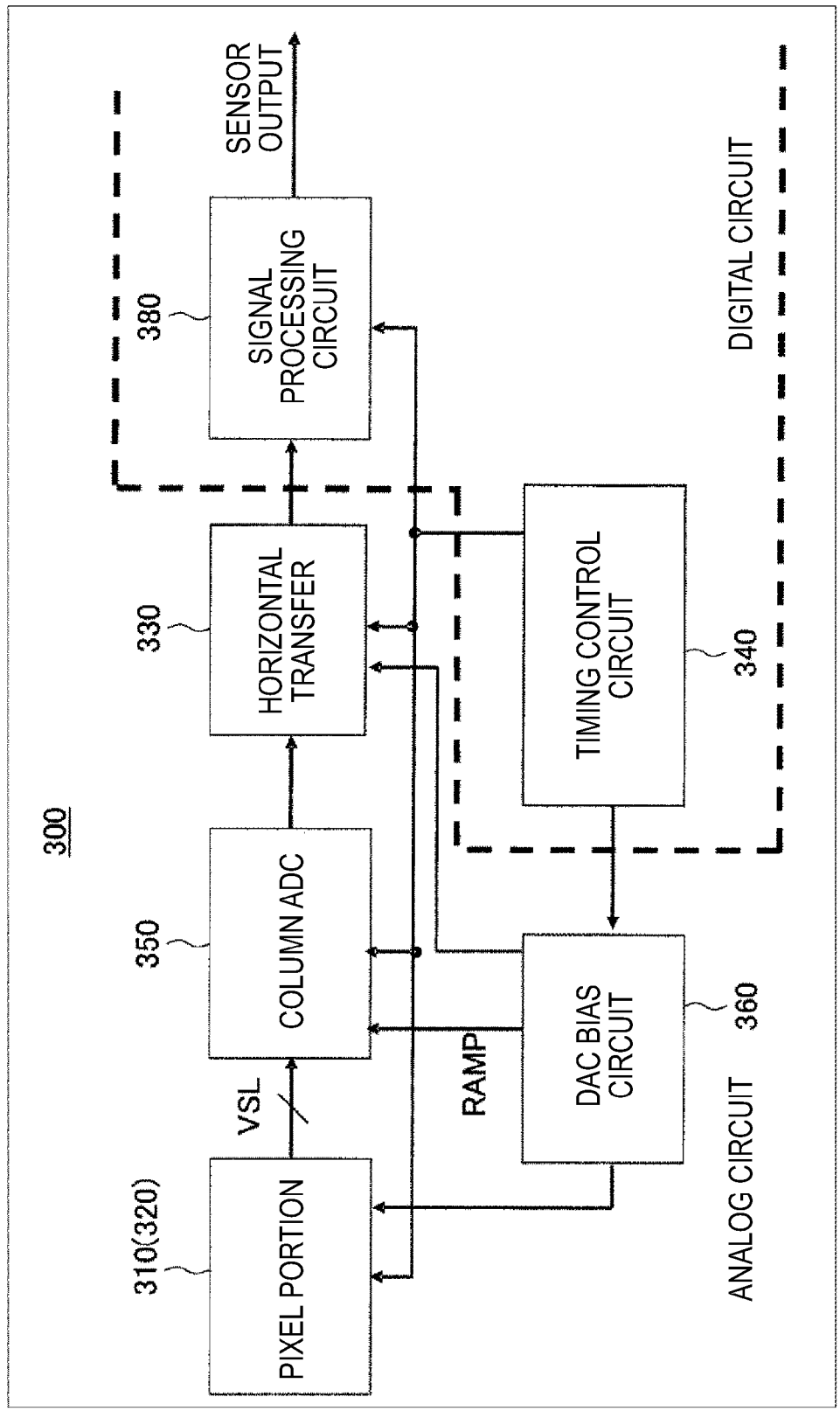
FIG. 13 is a block diagram illustrating an example configuration of a solid imaging device (CMOS image sensor) equipped with parallel column ADCs according to the present embodiment.

FIG. 13 is a block diagram illustrating an example configuration of a solid imaging device (CMOS image sensor) equipped with parallel column ADCs according to the present embodiment.

Figure 14:
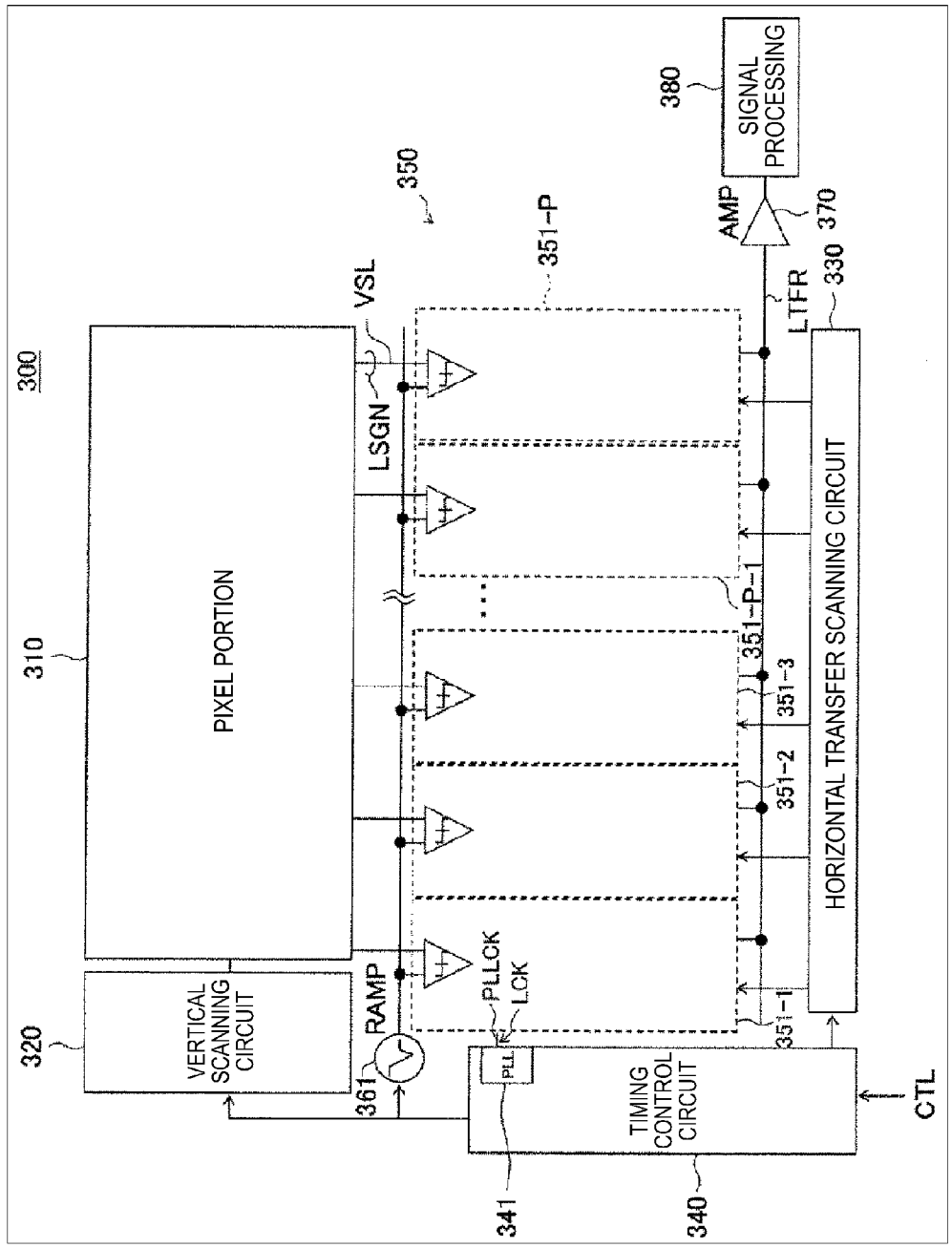
FIG. 14 is a block diagram more specifically illustrating the main portion of the solid imaging device (CMOS image sensor) equipped with parallel column ADCs in FIG. 13.

FIG. 14 is a block diagram more specifically illustrating the main portion of the solid imaging device (CMOS image sensor) equipped with parallel column ADCs in FIG. 13.

As illustrated in FIG. 13 and FIG. 14, a solid imaging device 300 includes a pixel portion 310 as an imaging unit, a vertical scanning circuit 320, a horizontal transfer circuit 330, a timing control circuit 340, and a column ADC 350 as a pixel signal reading unit. The pixel signal reading unit is configured including the vertical scanning circuit 320 and other components.

The solid imaging device 300 includes a DAC and bias circuit 360 which includes a D/A converter 361, an amp circuit (S/A) 370, and a signal processing circuit 380.

Among these configuration elements, the pixel portion 310, the vertical scanning circuit (row selection circuit) 320, the column ADC 350, the DAC and bias circuit 360, and the amp circuit (S/A) 370 are configured by analog circuits.

The timing control circuit 340 and the signal processing circuit 380 are configured by digital circuits.

As previously described, the column ADC 350 according to the present embodiment has a configuration with the following features.

The column ADC 350 includes a configuration that takes a logical sum (OR) from the code offset path and the clock supply path of the multiple counters arranged in an array, and a pseudo count operation is performed before the counter clock supply to intentionally offset the count start code.

As a result, by dispersing the current consumed during the count operation, the amount of IR drop may be reduced and counter characteristic degradation may be mitigated, which improves image quality.

By intentionally offsetting the count start code, advantages include a reduction in the IR drop, a reduction in the amount of fluctuation in power source, and an improvement in the ability of operation at a low power source voltage.

As will be described later, the control to intentionally offset the count start code is simple and is processed during the period outside the count operation, which has no effect on counter characteristics and enables simple maintenance.

In addition, circuits do not have to be provisioned for each array, and so there is little impact on size.

The pixel portion 310 includes an a internal pixel amp and a photoelectric conversion (photodiode) in which pixels are arranged, for example, in a two-dimensional matrix with an m number of rows and an n number of columns as illustrated in FIG. 12.

In addition, the solid imaging device 300 is disposed with the following circuit as a control circuit for sequentially reading the signals from the pixel portion 310.

That is to say, the solid imaging device 300 is disposed with the timing control circuit 340 functioning as a control circuit to generate an internal clock, the vertical scanning circuit (row selection circuit) 320 to control row addresses and row scans, and the horizontal transfer circuit 330 to control column addresses and vertical scans.

The timing control circuit 340 generates the timing signal used for the signal processing by the pixel portion 310, the vertical scanning circuit 320, the horizontal transfer circuit 330, the column ADC 350, the DAC and bias circuit 360, and the signal processing circuit 380.

In addition, the timing control circuit 340 includes a PLL circuit 341.

The PLL circuit 341 generates a reference clock PLLCK at a frequency of 900 MHz, for example, used in the count operation of the column ADC 350.

The PLL circuit 341 outputs to a clock supply line LCK, which supplies a clock to the Gray code counter arranged in each of the multiple columns in the column ADC 350 or the full-bit binary counter.

The pixel portion 310 photoelectrically converts video and screen images for each pixel by photon accumulation and extraction using a line shutter, and outputs an analog signal VSL to the column ADC 350 functioning as a column processing circuit group.

The column ADC 350 performs AD conversion on the analog output of the pixel portion 310 at each column unit using a reference signal (ramp signal) RAMP, performs digital CDS, and outputs several bits of digital signal.

The horizontal transfer circuit 330 performs simultaneous parallel transfer for several channels to ensure a transfer rate.

The downstream signal processing circuit 380 corrects vertical line defects and point defects, performs signal clamp processing, parallel-serial conversion, compression, encoding, addition, averaging, intermittent operation, and other signal processing.

Regarding the solid imaging device 300 according to the present embodiment, the digital output from the signal processing circuit 380 is sent as ISP and base band LSI input.

Hereafter, the configuration and functions of a column ADC 150 that has a configuration with features according to the present embodiment will be described in detail.

<2.3 Basic Configuration Example of First Column ADC>

Figure 15:
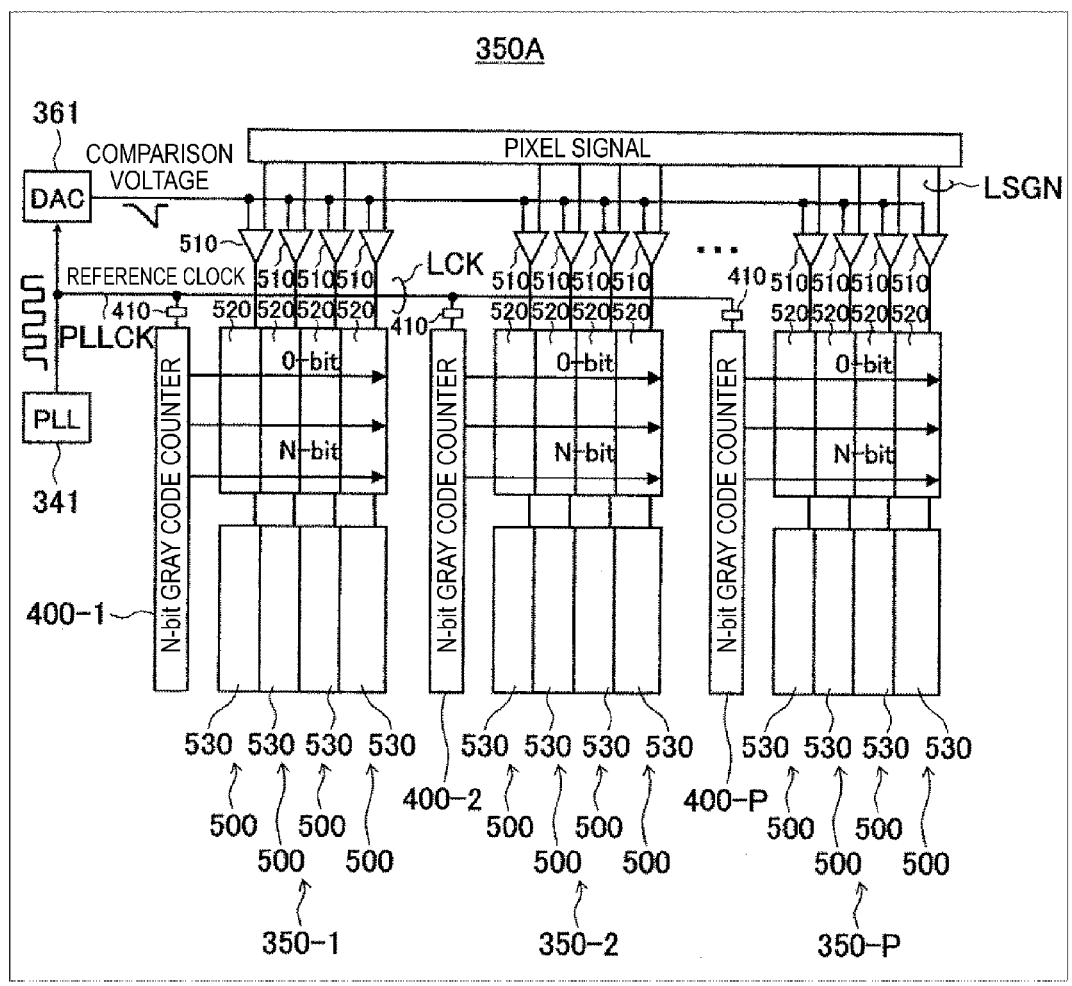
FIG. 15 is a first diagram illustrating an example of a basic configuration of a first column ADC (column A/D converter) according to the present embodiment.
Figure 16:
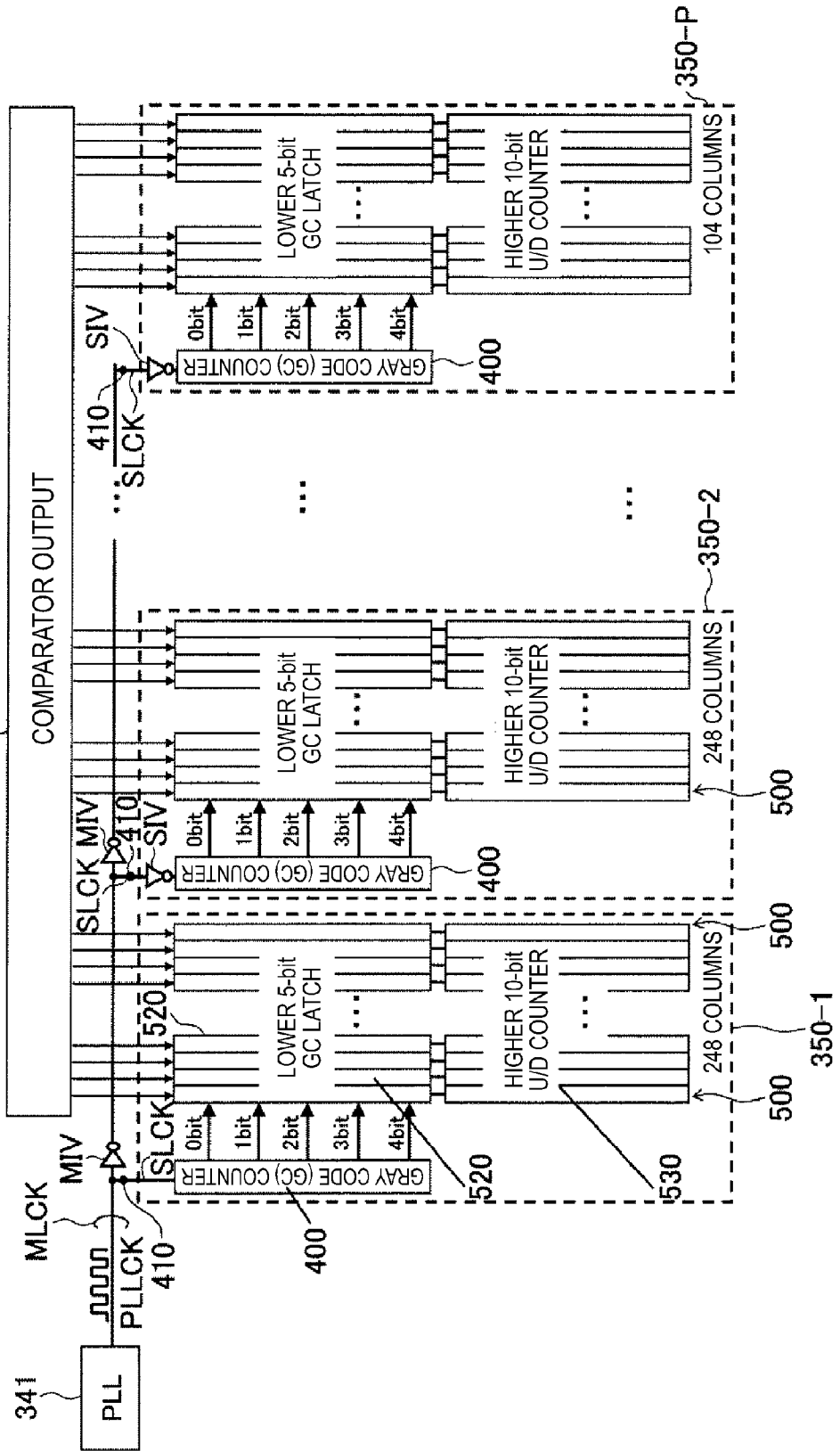
FIG. 16 is a second diagram illustrating an example of a basic configuration of a first column ADC (column A/D converter) according to the present embodiment.

FIG. 15 and FIG. 16 are diagrams illustrating examples of a basic configuration of a first column ADC (column A/D converter) 350A according to the present embodiment.

The first column ADC 350A is configured as follows as most of the power consumed in normal column ADCs is due to the lower bits of ripple counters in each column.

The first column ADC 350A does not perform lower-bit counter operations in each column and instead adopts a configuration in which output codes from an N-bit Gray code counter, which counts in synchronization with the reference clock PLLCK and is provisioned in a one-per-many columns arrangement output codes, are latched at each column. As a result, the AC conversion value is determined.

Regarding the first column ADC 350A according to the present embodiment, the reference clock PLLCK generated by the PLL circuit 341 in the timing control circuit 340 is only input into several units of the Gray code counter.

For this reason, the wiring load is light and the operating frequency may be increased.

According to the present embodiment, a count start code offset unit 410 is arranged on the clock input line to the Gray code counter so that the count start code is intentionally offset by a code offset path in order to perform a pseudo count operation before the clock supply.

In addition, regarding the column ADC 350A according to the present embodiment, the power consumed may be suppressed slightly as lower-bit count operations are not performed every column.

Regarding the first column ADC 350A and the higher bits of the counter, ripple counter operations may be performed using codes (clocks) for the Nth bit of counter output.

As a result, inter-column digital correlated double sampling (CDS) may be performed, which enables suppression of the horizontal transfer wiring area.

In addition, the first column ADC 350A may have a configuration that performs a so-called vertical (V) direction addition within columns regarding the latched lower bits by arranging an adder or similar in columns.

The first column ADC 350A according to the present embodiment enables suppression of the power consumed to approximately ⅛ of that compared to a full-bit ripple counter method with the same temporal resolution.

The first column ADC 350A according to the present embodiment is configured as an ADC with an N number of lower bits and an M number of higher bits.

The first column ADC 350A according to the present embodiment is configured as an ADC, for example, with 5 lower bits and 10 higher bits.

The first column ADC 350A includes multiple ADC blocks 351-0 through 350-P including multiple columns That is to say, the first column ADC 150A is divided into multiple ADC blocks with each block including multiple columns.

The first column ADC 350A is disposed with one of Gray code counters 300-1 through 300-P in each ADC block 350-1 through 350-P. The Gray code counters 300-1 through 200-P function as code conversion counters.

Each column is disposed with a column processing unit 500 that performs comparison processing for each column, lower-bit latches, and higher-bit count operations.

The column processing unit 500 includes a comparator 510 that compares the reference signal RAMP (Vslop), which is a ramp waveform that changes inclination and is generated by the DAC 161, and the analog signal VSL obtained via the vertical signal line LGSN from pixels in each row line.

The column processing unit 500 includes a lower-bit latch unit 520 for the lower N bits that receives output from the comparator 510 and count results from Gray code counters 400-1 through 400-P, and latches the count value.

The column processing unit 500 includes a higher-bit counter unit 530 for the upper bits that receives latch output from the latch circuit for the most significant lower bit from the lower-bit latch unit 520, and performs count operations.

In addition, the column processing unit 500 includes a bit inconsistency prevention circuit 540 to prevent bit inconsistencies between the output of the latch circuit for the most significant lower bit and the ripple counter circuit for the least significant higher bit.

The latch counter unit is formed by the lower-bit latch unit 520 and the higher-bit ripple counter 530.

In addition, a first counter is formed by the Gray code counter 400 and the lower-bit latch unit 520, and a second counter is formed by the higher-bit ripple counter 530.

According to the present embodiment, the reference signal RAMP is generated as a ramp waveform that changes linearly, for example, over time and depending on the voltage value.

The comparator 510 in each column processing unit 500 compares this reference signal RAMP and the analog signal VSL read on the vertical signal line LSGN from pixels according to the specified address in the pixel portion 310.

In this case, the comparator 510 outputs an output signal VCO at a high level until the reference signal PAMP and the analog signal VSL match, and then changes the output signal VCO from a high level to a low level when these signals match.

According to the present embodiment, the changing of the output signal VGC from the comparator 510 acts as a trigger to operate latches for Gray codes GC [0] through GC "4" in the lower-bit latch unit 520.

<2.4 Configuration Example of Gray Code Counter>

Each Gray code counter 400 receives the reference clock PLLCK at a frequency fn (MHz), for example, which is generated by the PLL circuit 141 in the timing control circuit 140 and propagated on a clock supply line LPLLCK, and generates an N-bit Gray code GC, which is a digital code.

The multiple N-bit Gray codes GC are formed as codes that transition between a logical [0] and a logical [1] of only one bit.

The Gray code counter 400 according to the present embodiment receives the reference clock PLLCK at the frequency fn, performs the count operation, and generates a 5-bit (=N) Gray code GC [0] through GC [4] from the divided frequency.

The Gray code counter 400 generates the least significant Gray code GC [0] at the frequency (½) fn, the Gray code GC [1] at the frequency (¼) fn, and the Gray code GC [2] at the frequency (⅛) fn in MHz The Gray code counter 400 generates the Gray code GC [3] at the frequency (1/16) fn and the most significant Gray code GC [4].

Each Gray code counter 400 supplies the generated Gray codes to the lower-bit latch unit 520 for the portion of the multiple columns included in the same ADC blocks 150-1 through 150-P.

The Gray code counter 400 generates a binary code PG [0] through PG [4] at the falling edge of the input reference clock PLLCK, and generates an input clock and a binary code PG [0] through PG [4].

It then resynchronizes each bit to a clock CK at the same frequency as the reference clock PLLCK and an inverted signal XCK, and outputs the Gray codes GC [0] through GC [4].

Each Gray code counter 400 supplies the generated Gray codes to the lower-bit latch unit 520 for the portion of the multiple columns included in the same ADC blocks 150-1 through 150-P.

[Transmission of the Reference Clock PLLCK]

According to the present embodiment, a configuration as illustrated in FIG. 7 is adopted to prevent the degradation of the duty of the reference clock PLLCK transmitted through the clock supply line LCK.

That is to say, a main inverter MIV is used one by one as a repeater by one CMOS buffer in a main clock supply line MLCK wired from the output unit of the PLL circuit 141 throughout the columns.

In addition, a secondary inverter SIV functioning as an inverting circuit is selectively arranged on a secondary clock supply line SLCK that branches to the Gray code counter 400 of each ADC block 150-1 through 150-P so that the reference clock PLLCK is supplied as positive logic.

According to the example in FIG. 7, the secondary inverter SIV is not arranged in the secondary clock supply line SLCK as there is no passage through the main inverter MIV functioning as a repeater on the Gray code counter 400-1 for the ADC block 150-1.

According to the example in FIG. 7, the secondary inverter SIV is arranged in the secondary clock supply line SLCK as there is passage through the main inverter MIV functioning as a repeater on the Gray code counter 400-2 for the ADC block 150-2.

The remaining ADC blocks area configured similarly.

By adopting such a configuration, degradation of the duty of the high-speed reference clock PLLCK at the frequency fn (MHz) may be prevented while being transmitted to the Gray code counter 400, which is the supply destination, maintained at 50%.

<2.5 Overview of Control to Intentionally Offset Counter Start Code>

Figure 17:
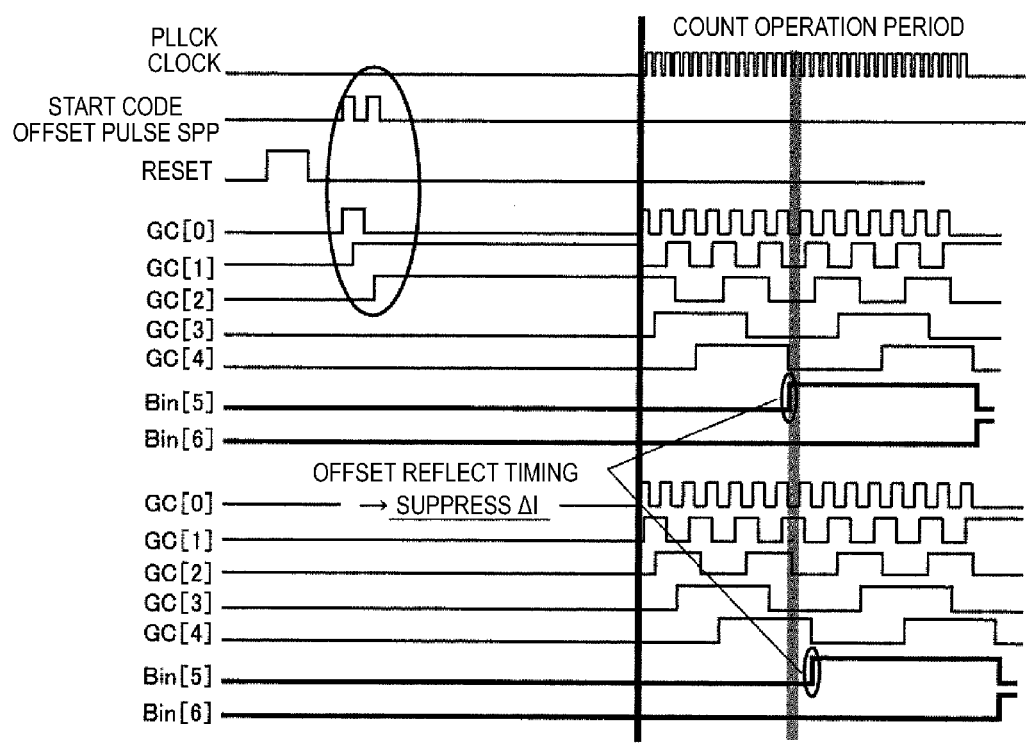
FIG. 17 is a diagram illustrating a specific timing chart of control that intentionally offsets the count start code applied to the first column ADC.

FIG. 17 is a diagram illustrating a specific timing chart of control that intentionally offsets the count start code applied to the first column ADC.

Figure 18:
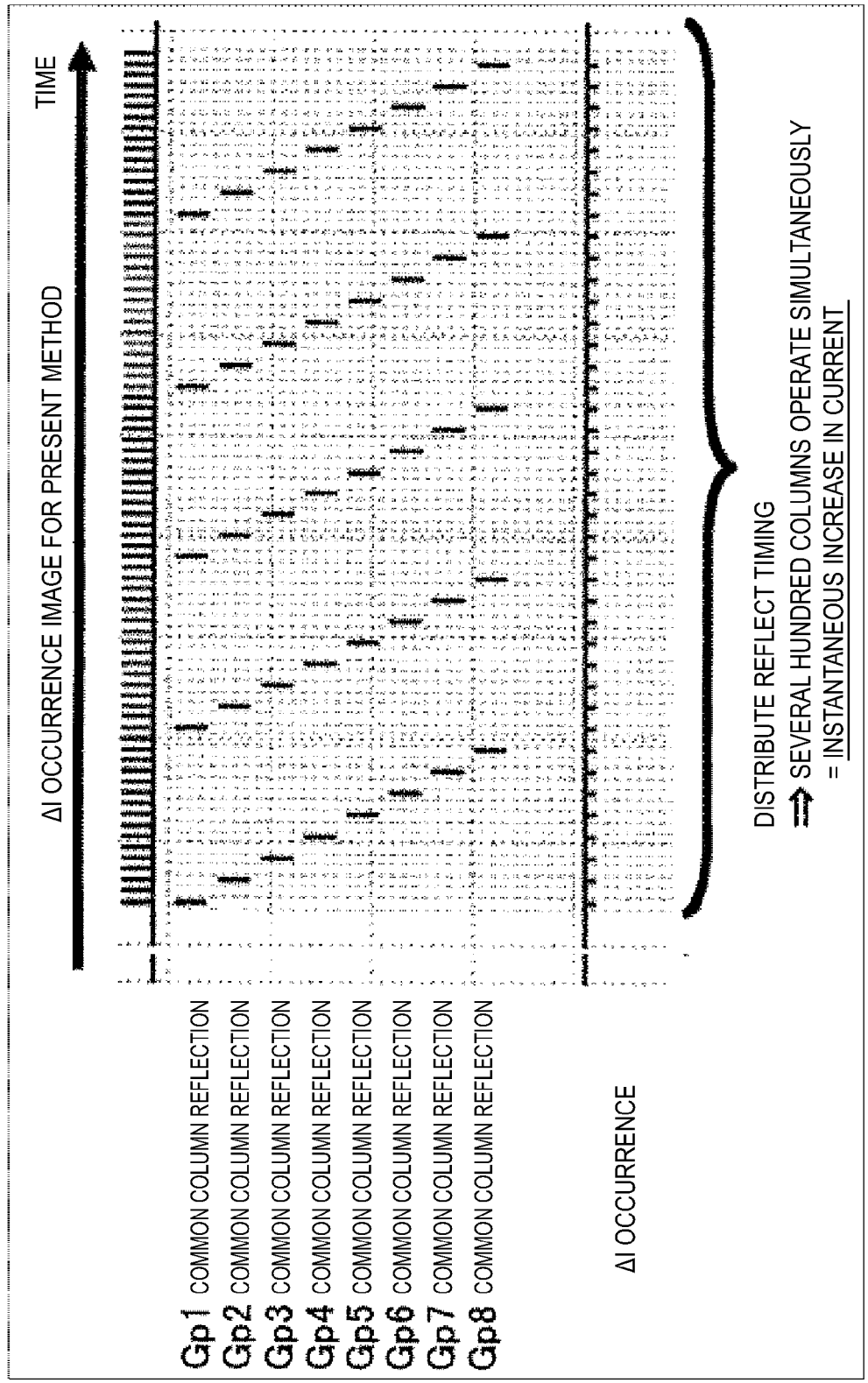
FIG. 18 is a diagram conceptually illustrating that the instantaneous current is averaged and reduced when several thousand columns operate simultaneously and in parallel by offsetting the timing as illustrated in FIG. 17.

FIG. 18 is a diagram conceptually illustrating that the instantaneous current is averaged and reduced when several thousand columns operate simultaneously and in parallel by offsetting the timing as illustrated in FIG. 17.

Figure 19:
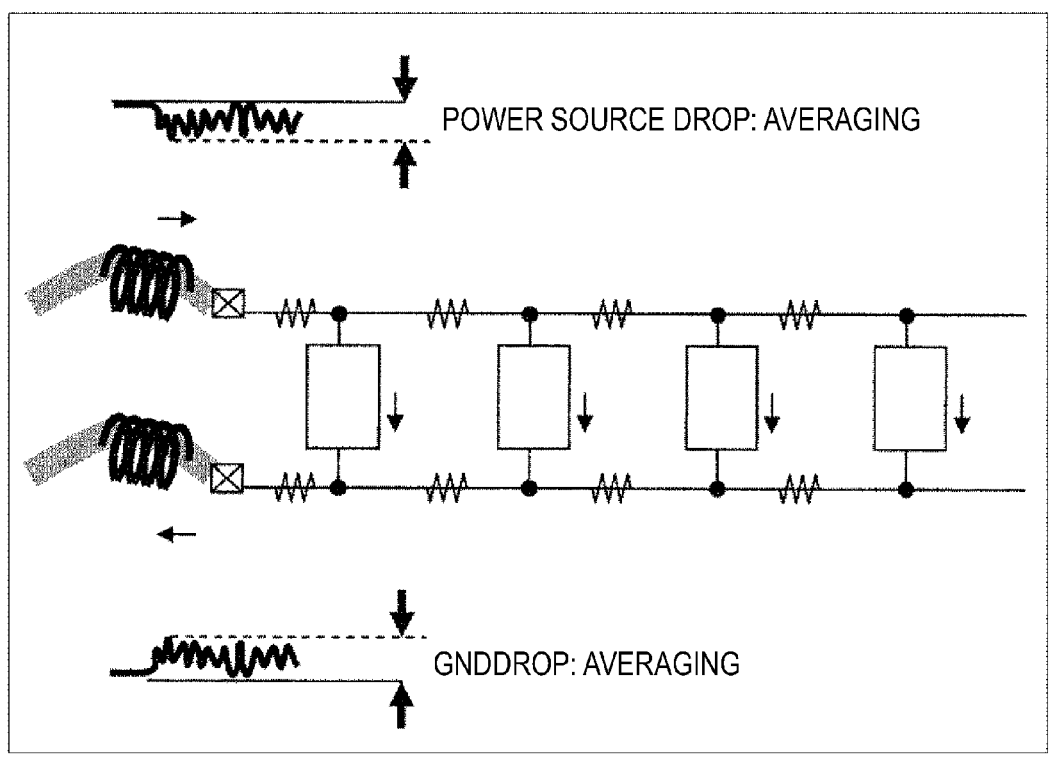
FIG. 19 is a diagram describing that current drop is averaged when counters arranged in an array operate simultaneously by offsetting the timing as illustrated in FIG. 17.

FIG. 19 is a diagram describing that current drop is averaged when counters arranged in an array operate simultaneously by offsetting the timing as illustrated in FIG. 17.

Figure 20:
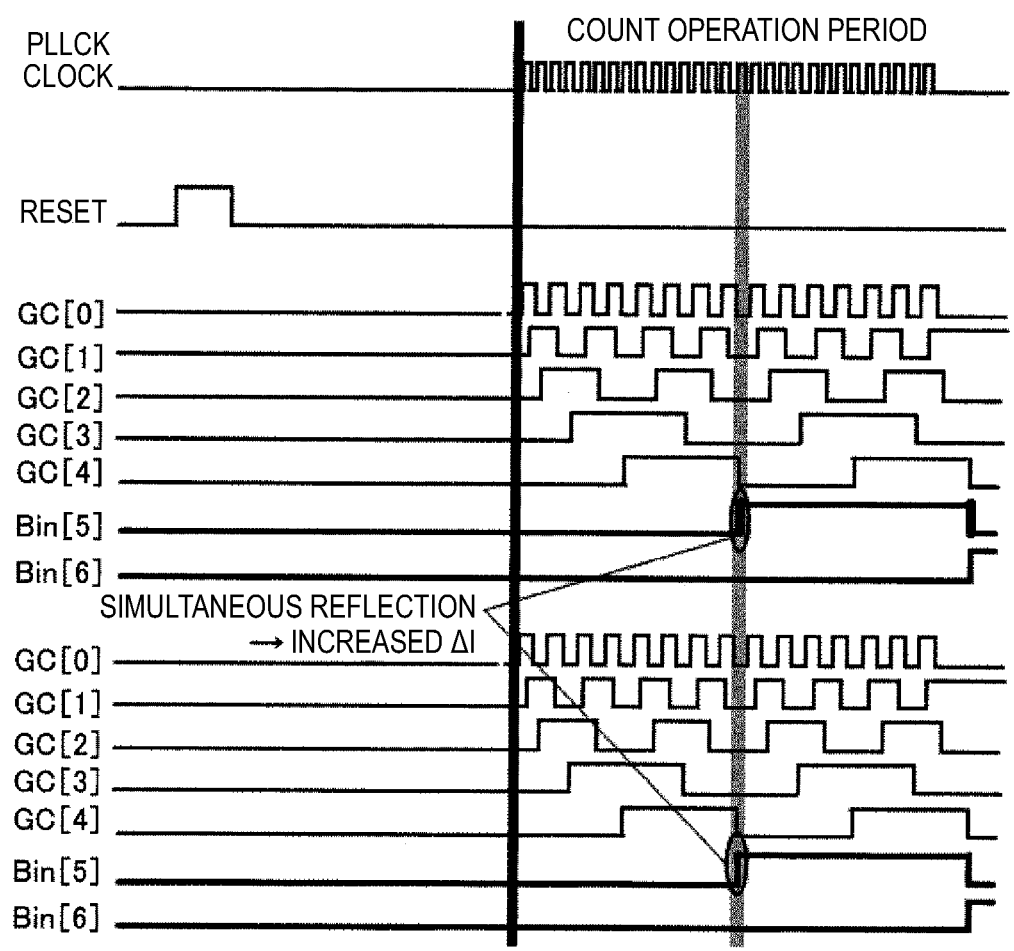
FIG. 20 is a diagram illustrating a specific timing chart when control intentionally offsets the counter start code as a comparison.

FIG. 20 is a diagram illustrating a specific timing chart when control intentionally offsets the counter start code as a comparison.

After a reset timing for the counter circuit (Gray code counter according to the present example), the control to intentionally offset the count start code inputs a different pulse value for each of a group of multiple columns functioning as a group beforehand, which is a simple method to offset the count start code.

In this case, for example, a generated start code offset pulse SPP is supplied to each count start offset unit 410 with a different pulse value under the control of the timing control circuit 340.

Due to this control and as illustrated in FIG. 18 and FIG. 19, regarding the composite counter using lower-bit Gray codes and higher-bit binary codes, a clock reflect timing is distributed to the higher-bit binary codes of the counter circuits corresponding to the multiple columns. For this reason, power fluctuations during counting may be suppressed.

In addition, the timing of the simultaneous operation to change the counter circuits (Gray code counter according to the present example) corresponding to the multiple columns from all zeroes to all ones, which has the most significant power fluctuation, is distributed in the same way.

This point is advantageous for both the composite counter using lower-bit Gray codes and higher-bit binary codes and the full-bit binary code counter.

Incidentally, as illustrated in FIG. 20, the following disadvantages exist when not performing the control to intentionally offset the count start code.

Figure 3:
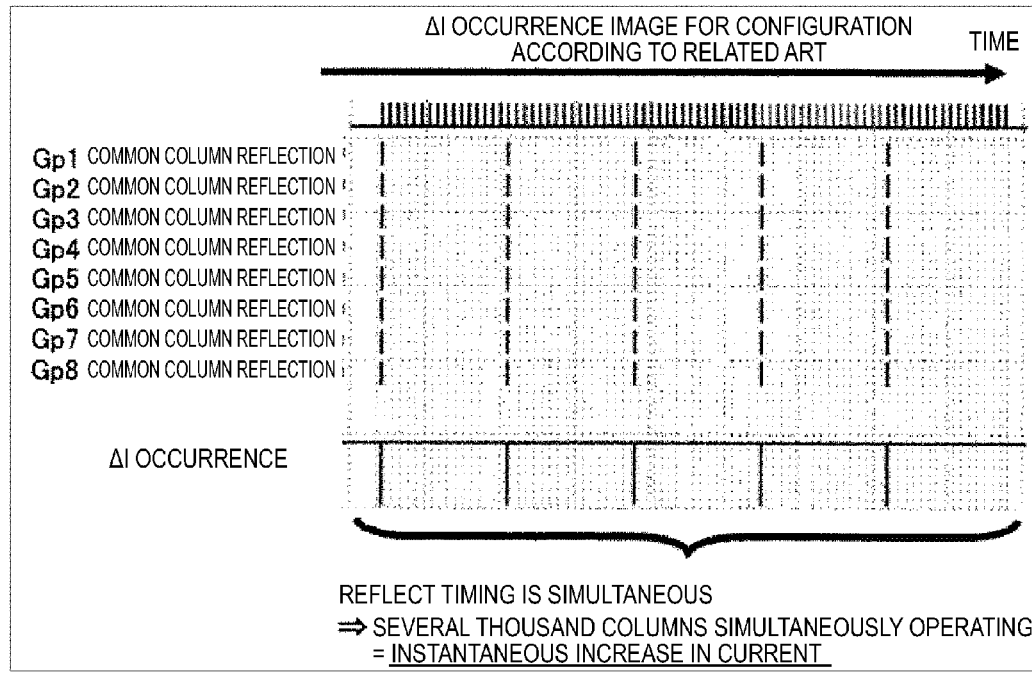
FIG. 3 is a diagram conceptually illustrating current in the column A/D converter increases instantly from the simultaneous and parallel operation of several thousand columns.
Figure 4:
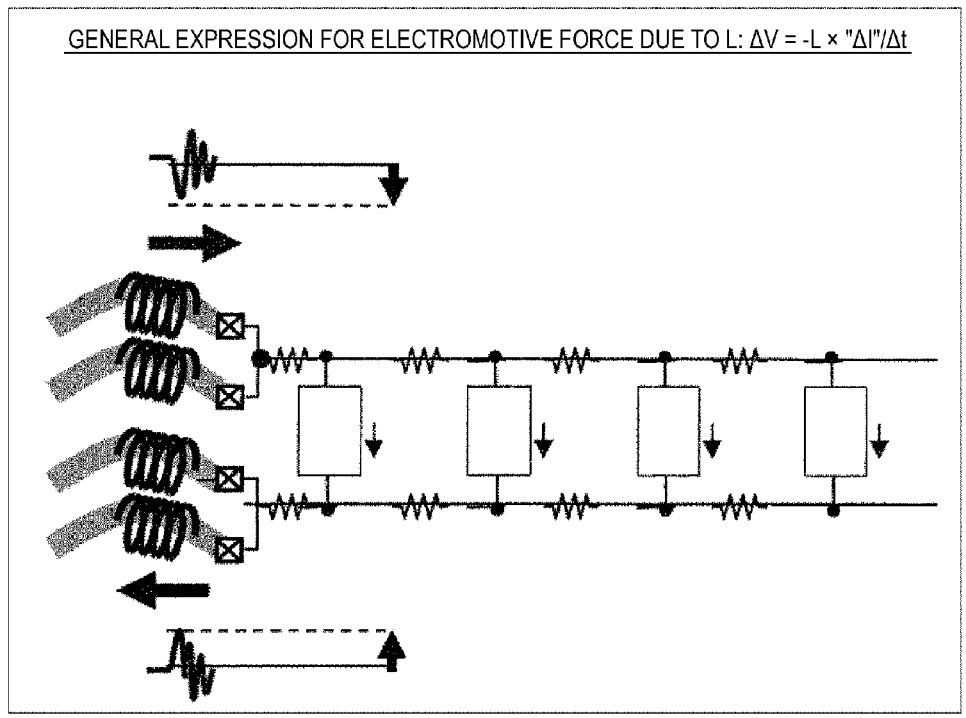
FIG. 4 is a diagram describing a rather significant internal power voltage fluctuation ΔV regarding the column A/D converter occurs from a power fluctuation ΔI that occurs due to the simultaneous operation of the counter arranged in an array and an L component of the package.

As illustrated in FIG. 3 and FIG. 4, a rather significant internal power voltage fluctuation $\Delta V$ regarding the column A/D converter occurs from a power fluctuation $\Delta I$ that occurs due to IR drop from the simultaneous operation of the counter arranged in an array and an L component of the package $(=-L \times \Delta di/\Delta t)$.

As illustrated in FIG. 3, the current in the column A/D converter increases instantly from the simultaneous and parallel operation of several thousand columns.

<2.6 First Configuration Example of Counter Start Offset Unit>

Figure 21:
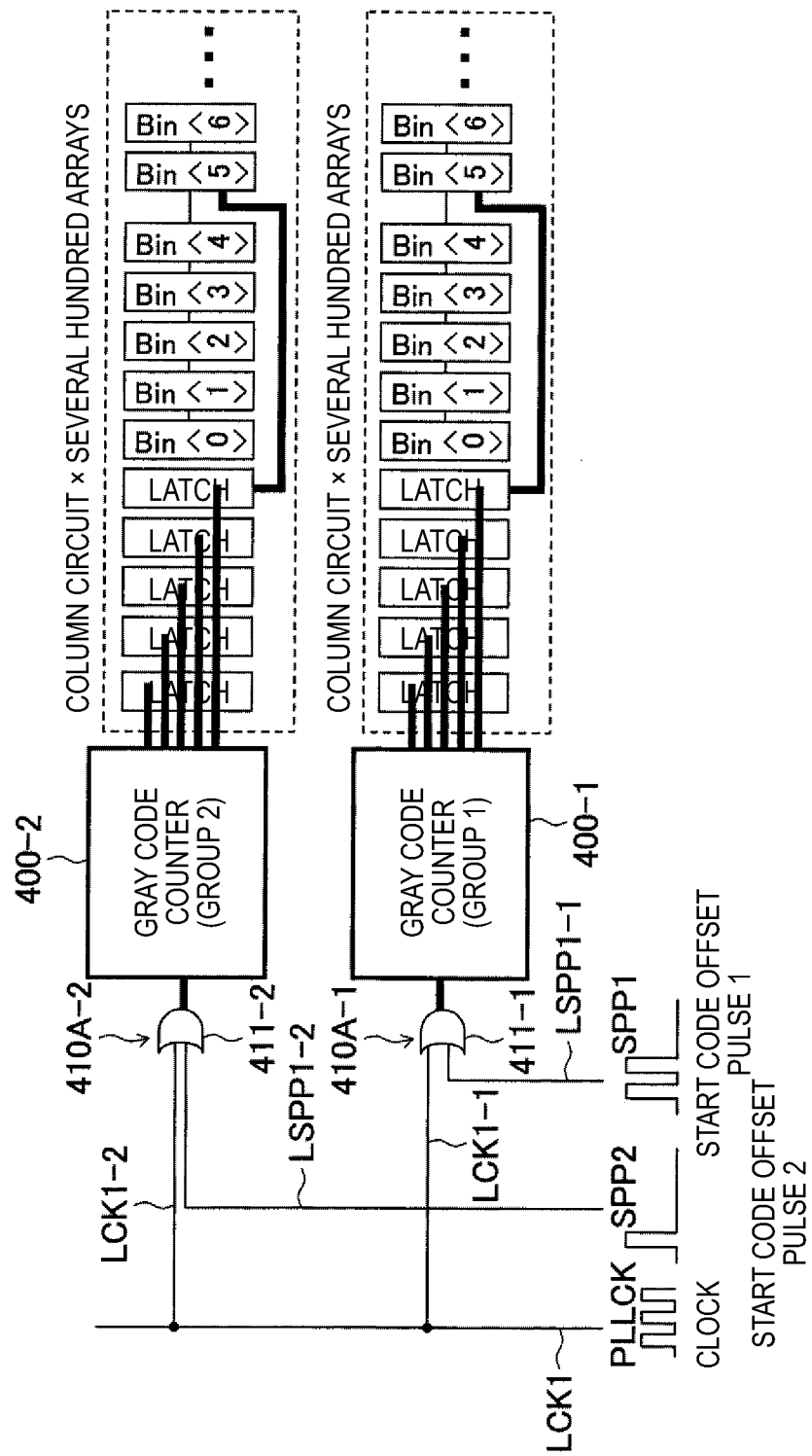
FIG. 21 is a diagram illustrating an example of a first configuration of a count start offset unit applied to the first column ADC according to the present embodiment.

FIG. 21 is a diagram illustrating an example of a first configuration of a count start offset unit according to the present embodiment.

Figure 22:
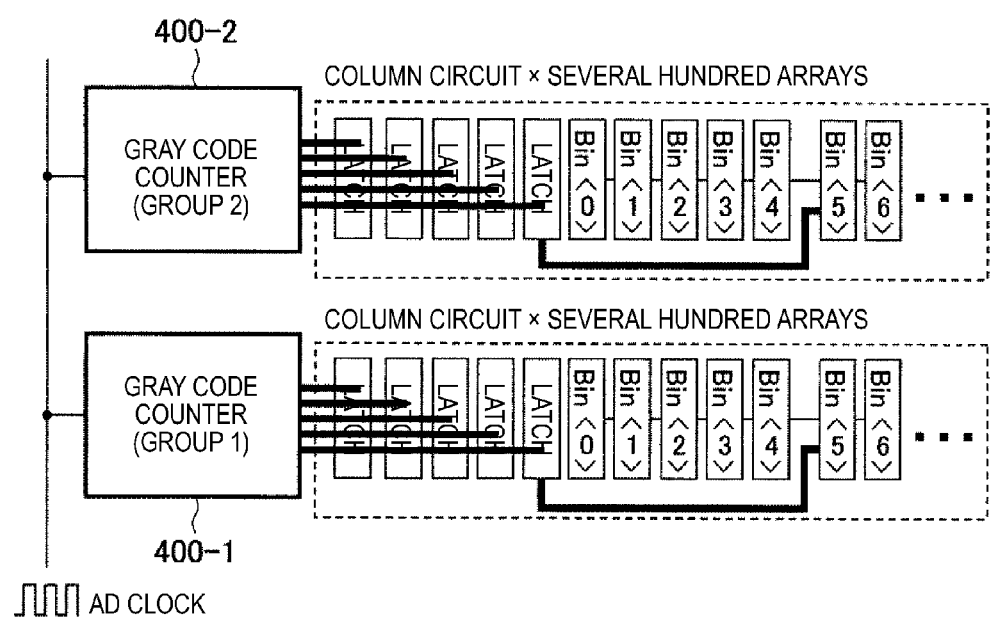
FIG. 22 is a diagram illustrating a clock supply unit for a Gray code counter when not waiting for the count start offset unit as a comparison.

FIG. 22 is a diagram illustrating a clock supply unit for a Gray code counter when not waiting for the count start offset unit as a comparison.

For ease of understanding, the examples illustrated in FIG. 21 and FIG. 22 include two Gray code counters.

According to the first configuration example, a clock supply path LCK1 and a code offset path LSPP1 are provisioned in the Gray code counter (counter circuit), and logical sum (OR) circuits 411-1 and -2 are disposed to enable a logical sum on both paths of the count start offset circuits 410A-1 and 410A-2.

In addition, code offset pulses SPP1 and SPP2 generated externally with different pulse values are propagated to each code offset path LSPP1-1 and LSPP1-2 corresponding to each group. According to the example in FIG. 21, the pulse value of the code offset pulse SPP1 is two, and the pulse value for the code offset pulse SPP2 is one.

In this way, according to the first configuration example, a logical OR is taken from the code offset path and the clock supply path of the multiple counters arranged in an array, and a pseudo count operation is performed before the counter clock supply to intentionally offset the count start code.

According to the first configuration example, regarding the composite counter for lower-bit Gray codes and higher-bit binary codes, a clock reflect timing is distributed to the higher-bit binary codes of the counter circuits corresponding to the multiple columns by this control. For this reason, power fluctuations during counting may be suppressed.

In addition, the timing of for the simultaneous operation to change the counters corresponding to the multiple columns from all zeroes to all ones, which has the most significant power fluctuation, is distributed in the same way.

Incidentally, as illustrated in FIG. 22 and according to the configuration that does not include the count start offset circuit, the pseudo count operation is not performed, and so the Gray code counter 400 arranged in an array simultaneously operates in parallel. As a result, a rather significant internal power voltage fluctuation $\Delta V$ regarding the column A/D converter occurs from a power fluctuation ΔI that occurs due to IR drop from this and an L component of the package (=−L×Δdi/Δt).

The current in the column A/D converter increases instantly from the simultaneous and parallel operation of several thousand columns.

<2.7 First Configuration Example of Counter Start Offset Unit>

Figure 23:
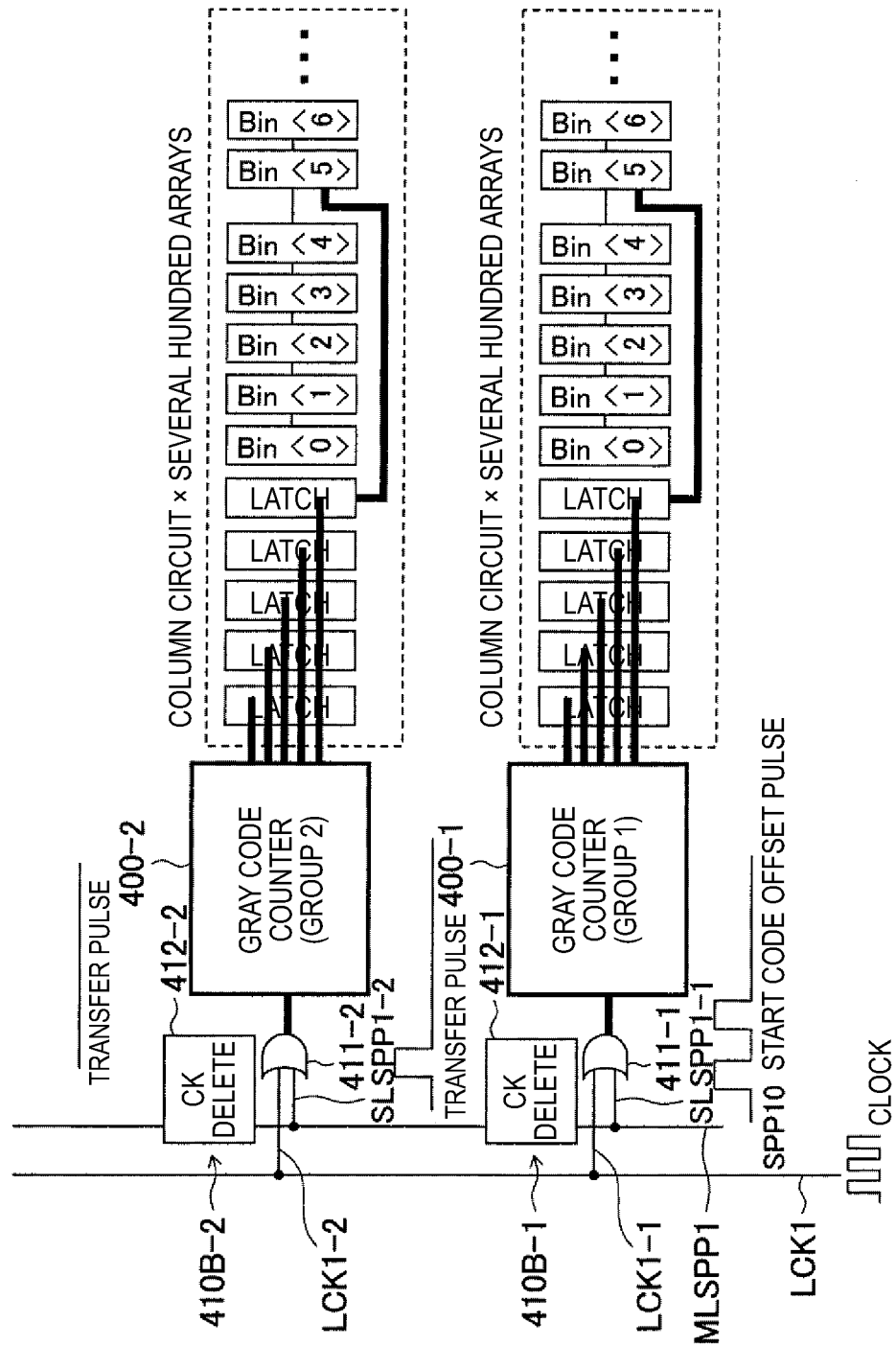
FIG. 23 is a diagram illustrating an example of a second configuration of a count start offset unit applied to the first column ADC according to the present embodiment.

FIG. 23 is a diagram illustrating an example of a second configuration of a count start offset unit according to the present embodiment.

According to the second configuration example, a code offset pulse SPP10 including multiple pulses is propagated to one main code offset path MLSPP1.

The main code offset path MLSPP1 branches to a secondary code offset path SLSSP1-1 and -2 at the input stage of the OR circuit 411-1 and -2 for each group.

According to the configuration in FIG. 23, the pulse value adjustment unit 412-1, 412-2, . . . are also disposed to adjust (delete) the number of pulses before the branched region of the main code offset path MLSPP1.

Regarding the configuration in FIG. 23, a pulse value of 16 code offset pulses SPP10, for example, are propagated to the main code offset path MLSPP1 under the control of the timing control circuit 340, for example. Then, two pulses are removed by the first-stage pulse value adjustment unit 412-1, for example, and 14 pulses of the code offset pulses are branched to the secondary offset path SLSSP1-1 and supplied to the OR circuit 411-1.

The code offset pulse SPP10 in which the pulse value has been reduced to 14 is further reduced by two pulses, for example, by the next-stage pulse adjustment unit 412-2, and 12 pulses of the code offset pulses are branched to the secondary offset path SLSSP1-2 and supplied to the OR circuit 411-2.

In this way, according to the second configuration example, the pulse value is reduced at every branching, and the pseudo count operation is performed before the counter clock supply to intentionally offset the count start code.

Figure 24:
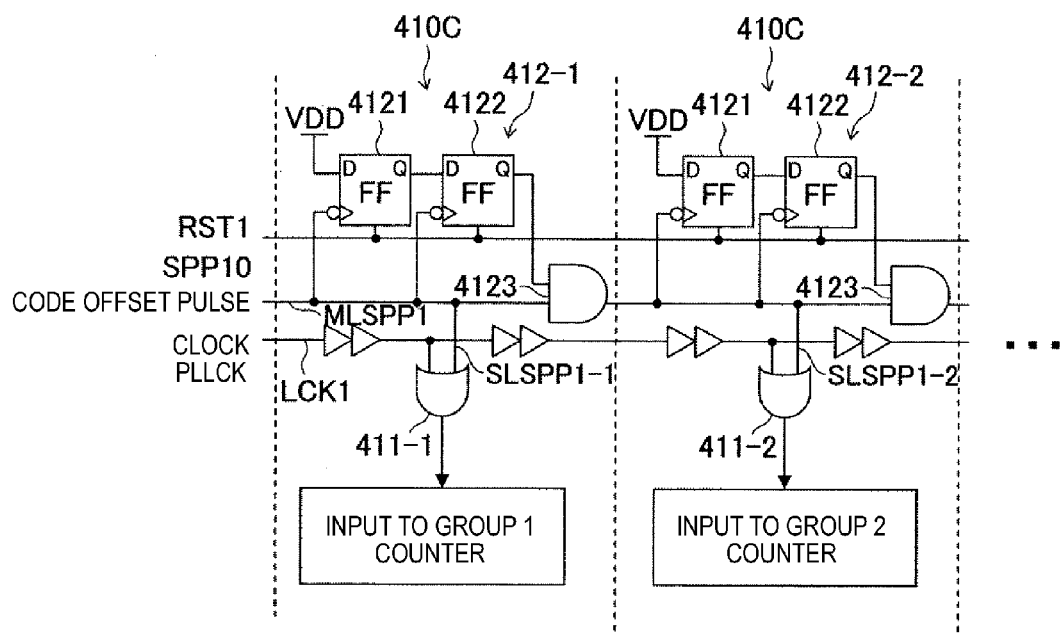
FIG. 24 is a circuit diagram illustrating an example of a specific configuration including a pulse count adjusting unit in the count start offset unit according to the present embodiment.

FIG. 24 is a circuit diagram illustrating an example of a specific configuration including a pulse count adjusting unit in the count start offset unit according to the present embodiment.

The pulse value adjustment unit 412 regarding a count start offset unit 410C in FIG. 24 is configured including a cascaded flip-flop (FF) 4121 and 4122, and a 2-input AND (logical product) circuit 4123.

Regarding the pulse value adjustment unit 412, the negative clock input terminal of the flip-flop 4121 and 4122 are connected to the main code offset path MLSSP1, which propagates the code offset pulse SPP10.

Regarding the flip-flop 4121, a D input is connected to a power source potential VDD, a Q output is connected to the D input of the next-stage flip-flop 4122, and the output of the flip-flop 4122 is connected to one input of the AND circuit 4123.

In addition, the other input and output of the AND circuit 4123 are connected to the main code offset path MLSPP1. That is to say, the AND circuit 4123 is inserted into the main code offset path MLSPP1.

The count start offset unit 410C having such a configuration is simple and has little effect on size as an enabler configured by the flip-flop 4121 and 4122 and the OR circuit 411 is disposed as one unit per group.

The example in FIG. 24 is a simple circuit configuration in which a single pulse generated externally is input into only group 1, and then the pulse value is reduced internally before being transferred downstream.

Though the example described a case in which the pulse is gradually reduced as the second configuration example, the present technology may also apply a configuration in which the pulse is gradually increased.

[CDS Reading Method when Adopting Control to Intentionally Offset the Count Start Code]

Figure 25:
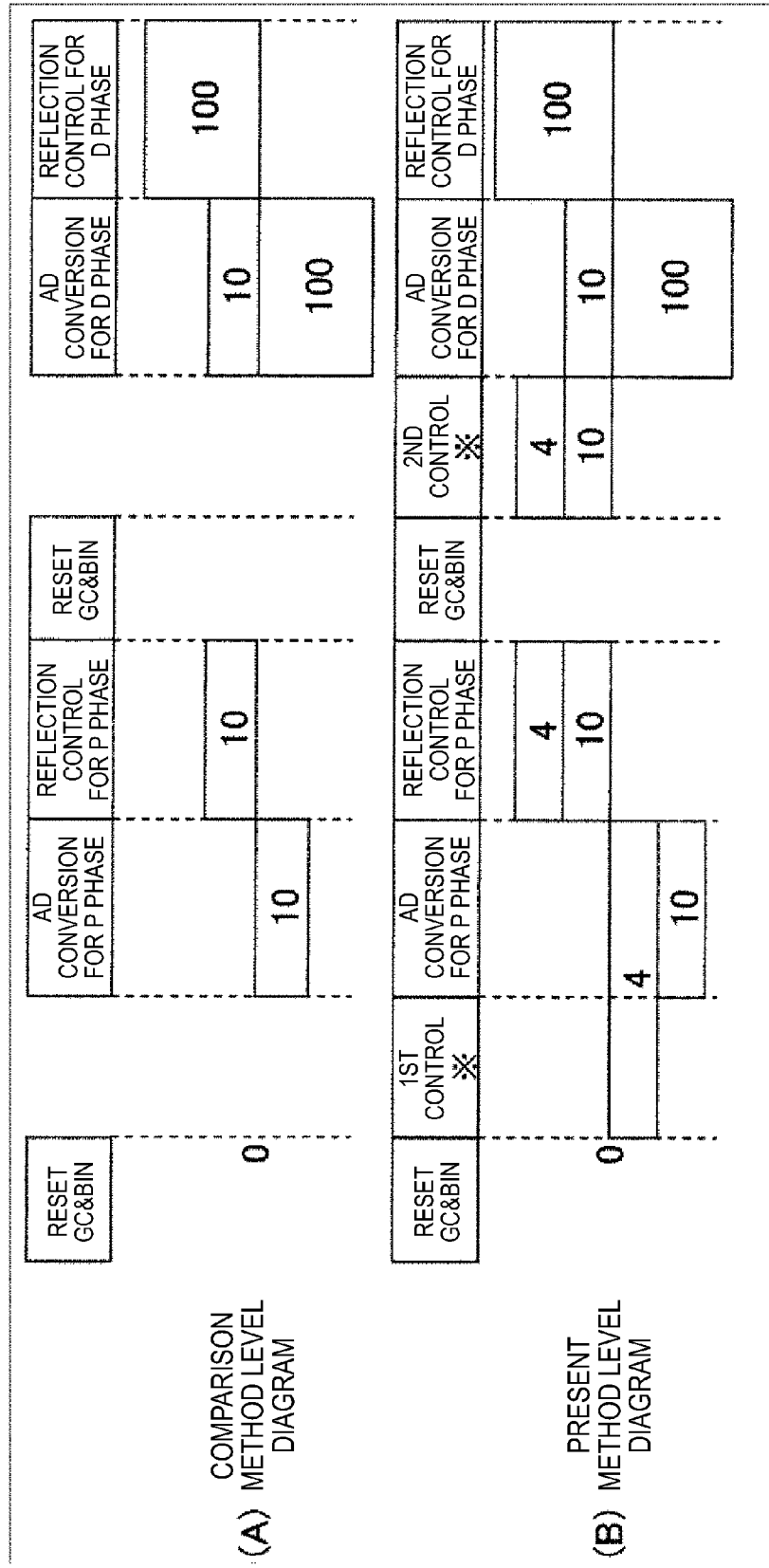
FIG. 25 is a diagram schematically illustrating a CDS read method when adopting and not adopting the control that intentionally offsets the counter start code.

FIGS. 25 (A) and (B) are diagrams schematically illustrating a CDS read method when adopting and not adopting the control that intentionally offsets the counter start code.

FIG. 25 (A) illustrates the case when not adopting the control to intentionally offset the count start code, and FIG. 25 (B) illustrates the case when adopting the control to intentionally offset the count start code.

It is possible for the control to intentionally offset the count start code to read only the original signal by implementing a reset before reading the reference (first control in the drawing), and then implementing control before reading the post-transfer signal (second control in the drawing).

<2.8 Configuration Example of Lower-Bit Latch Unit and Higher-Bit Ripple Counter>

The lower-bit latch unit 520 includes a function to latch Gray codes GC [0] through GC [4] generated by the Gray code counter 400 for the same ADC blocks 150-1 through 150-P as a trigger to invert the output of the comparator 510 for the same column to a low level.

Figure 26:
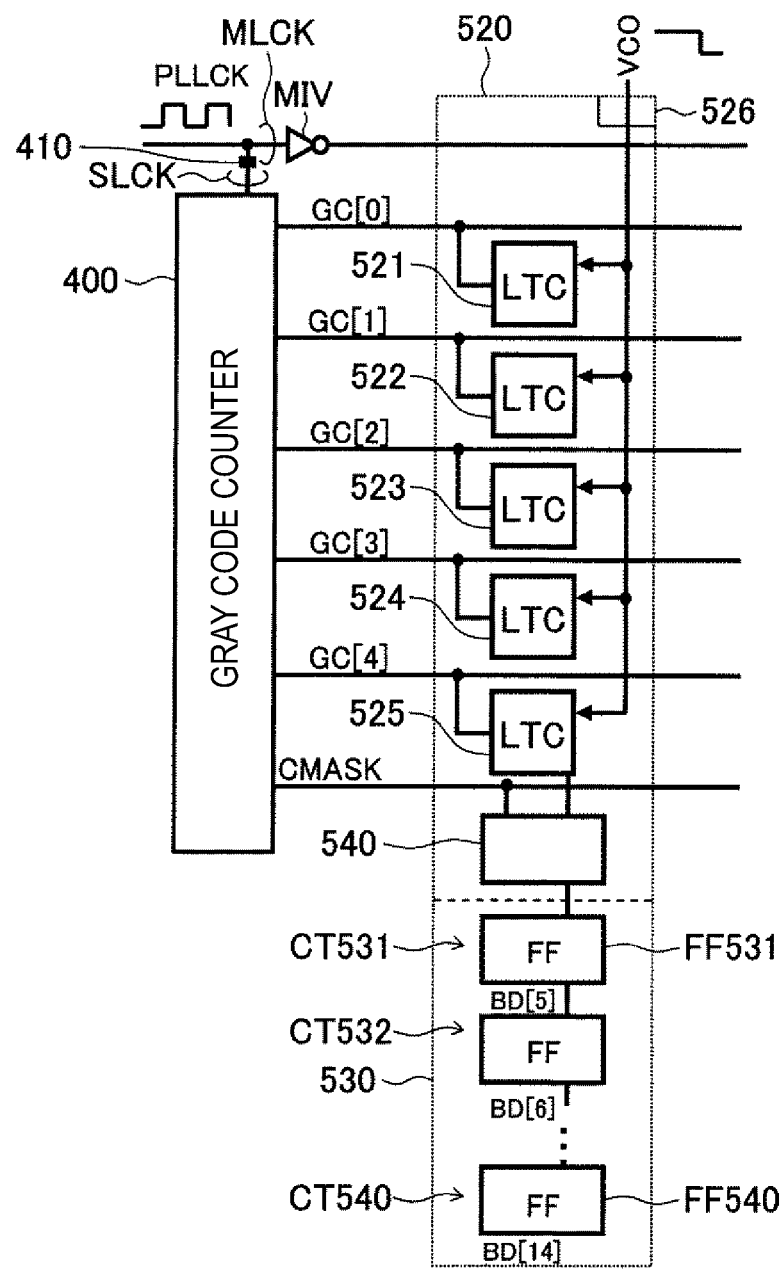
FIG. 26 is a diagram illustrating the relationship between the output of the Gray code counter and the basic arrangement of the lower-bit latch unit and the higher-bit ripple counter according to the present embodiment.
Figure 27:
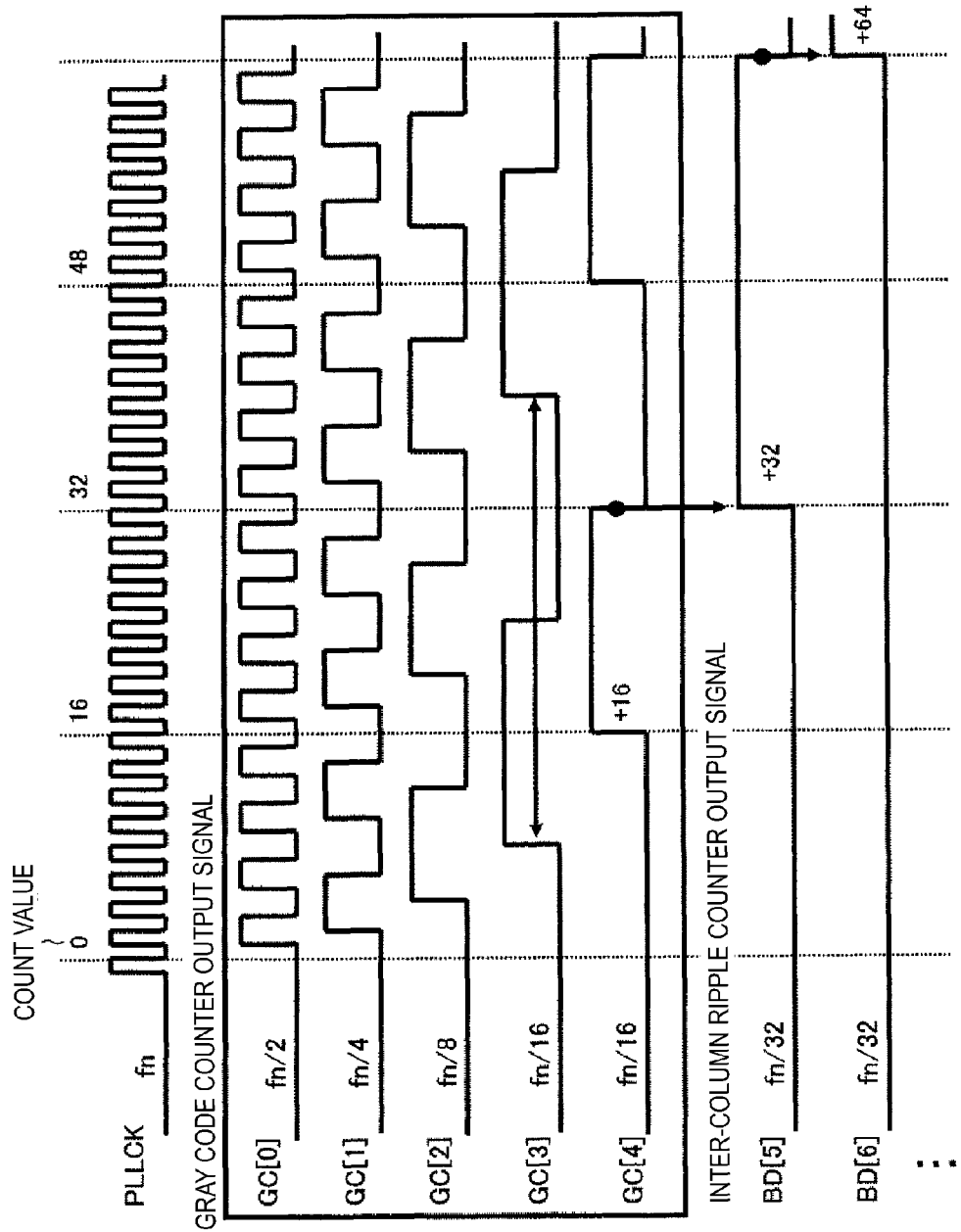
FIG. 27 is a diagram illustrating an example of output of the Gray code latched to the lower-bit latch unit and the higher-bit ripple counter according to the present embodiment.

FIG. 26 is a diagram illustrating the relationship between the output of the Gray code counter and the basic arrangement of the lower-bit latch unit and the higher-bit ripple counter according to the present embodiment.

Figure 28:
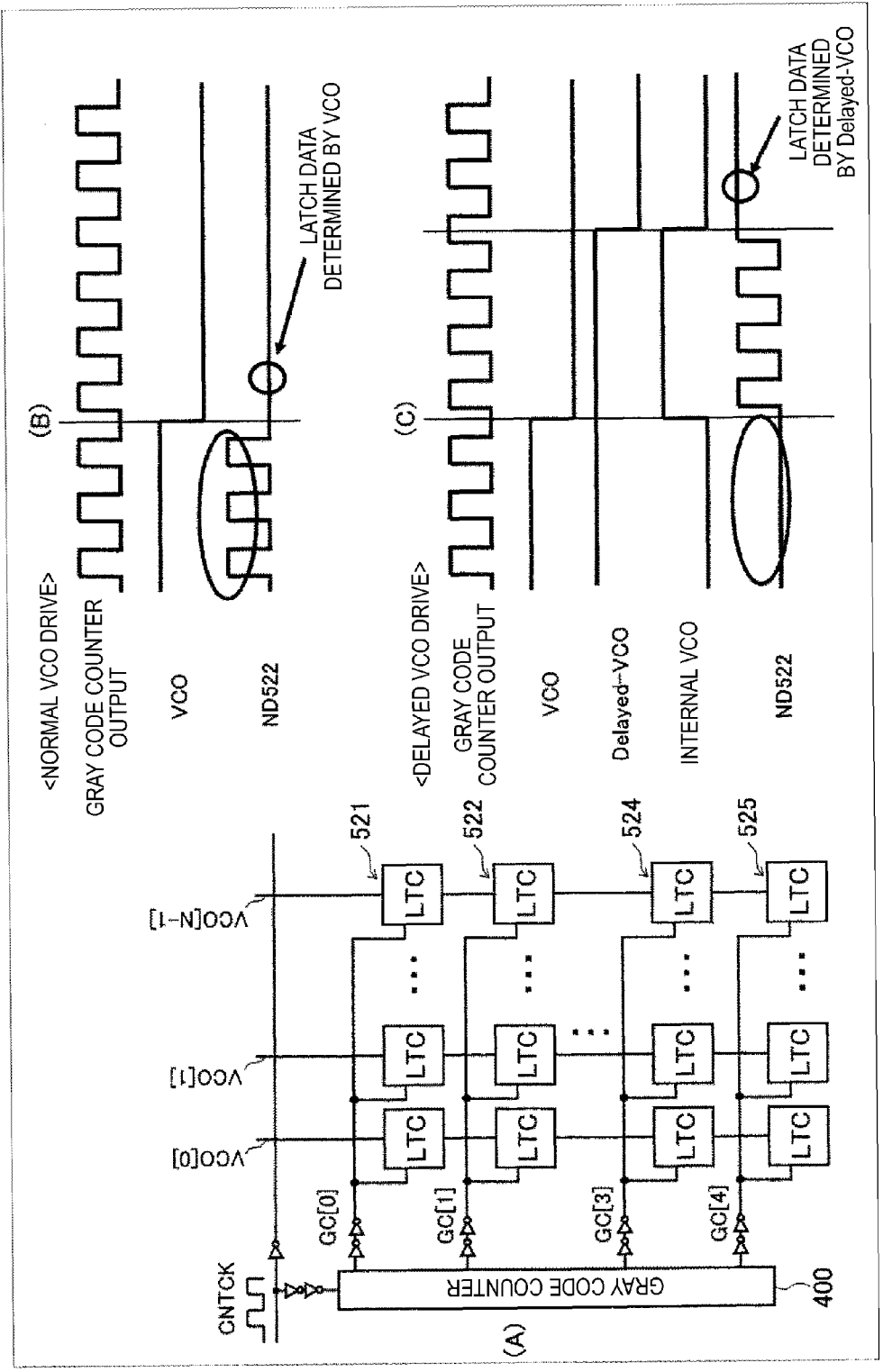
FIG. 28 is a diagram describing a delayed VCO drive, which is the preferable drive method used in latch processing regarding the lower-bit latch unit according to the present embodiment.

FIG. 28 is a diagram illustrating an example of output of the Gray code latched to the lower-bit latch unit and the higher-bit ripple counter according to the present embodiment.

[Configuration Example of Lower-Bit Latch Unit]

The lower-bit latch unit 520 disposed in each column includes lower-bit latch circuits (LTC) 521 through 525 (52N) that latches each Gray code GC [0] through GC [4] and a comparator output and input unit (VCO) 526.

The lower-bit latch circuit 521 retrieves and latches the Gray code GC [0] from the Gray code counter 400.

The lower-bit latch circuit 522 retrieves and latches the Gray code GC [1] from the Gray code counter 400.

The lower-bit latch circuit 523 retrieves and latches the Gray code GC [2] from the Gray code counter 400.

The lower-bit latch circuit 524 retrieves and latches the Gray code GC [3] from the Gray code counter 400.

The lower-bit latch circuit 525 retrieves and latches the Gray code GC [4] from the Gray code counter 400.

The output from the lower-bit latch circuit 525, which is the most significant, is supplied to a ripple counter CT 331, which is the most significant in the higher-bit counter unit 530 for the higher M bits, via a bit inconsistency prevention circuit 540.

In addition, each lower-bit latch circuit 521 through 525 includes a function to transfer output latch data during the P phase for CDS to a data transfer line LTRF.

In this case, P-phase data processing is performed at the downstream signal processing circuit 380.

[Delayed VCO Drive]

FIG. 28 (A) through (C) are diagrams describing a delayed VCO drive, which is the preferable drive method used in latch processing regarding the lower-bit latch unit according to the present embodiment.

FIG. 28 (A) schematically illustrates the lower-bit latch unit regarding one ADC block.

FIG. 28 (B) illustrates timing for normal VCO drive when not delaying the output signal VCO from the comparator 510.

FIG. 28 (C) illustrates timing for delayed VCO drive when delaying the output signal VCO from the comparator 510.

As illustrated in FIG. 28 (B), in the case of normal VCO drive without delaying the output signal VCO from the comparator 510, the power consumed is significant as a latch node ND 522 toggles from the timing of the falling edge of the signal VCO until data is determined.

As illustrated in FIG. 28 (C), in the case of delayed VCO drive when delaying the output signal VCO from the comparator 510, latching begins an n number of seconds after the timing of the falling edge of the signal VCO. As a result, it is possible to suppress the power consumed as the latch node 522 does not toggle until the edge timing of the signal VCO In the case of the delayed VCO drive, a delay element is disposed in the VCO input unit 526, for example, which makes it possible to configure manually.

[Configuration Example of Higher-Bit Counter Unit]

The higher-bit counter unit 530 is arranged to the output side of the lower-bit latch unit 520 having such a configuration through the bit inconsistency prevention circuit 540 that prevents bit inconsistencies.

The higher-bit counter unit 530 is configured with cascaded M-bit (M=10 according to the present example) ripple counters (binary counter) CT 531 through CT 540.

The ripple counters CT 531 through CT 540 are formed as up-down (U/D) counters.

As illustrated in FIG. 9, the higher-bit counter unit 530 is counted by the least-significant ripple counter CT 531 at the timing of the falling edge of the Gray code GC [N (=4)] latched by the lower-bit latch circuit 525, which is the most significant in the lower-bit latch unit 520.

Next, the next-stage ripple counter CT 532 is counted at the timing of the falling edge of the output signal from the previous-stage ripple counter CT 531.

Thereafter, the count operation is similarly performed at the timing of the falling edge of the signal output from the previous-stage ripple counter.

[Specific Configuration Example of Ripple Counter]

Figure 29:
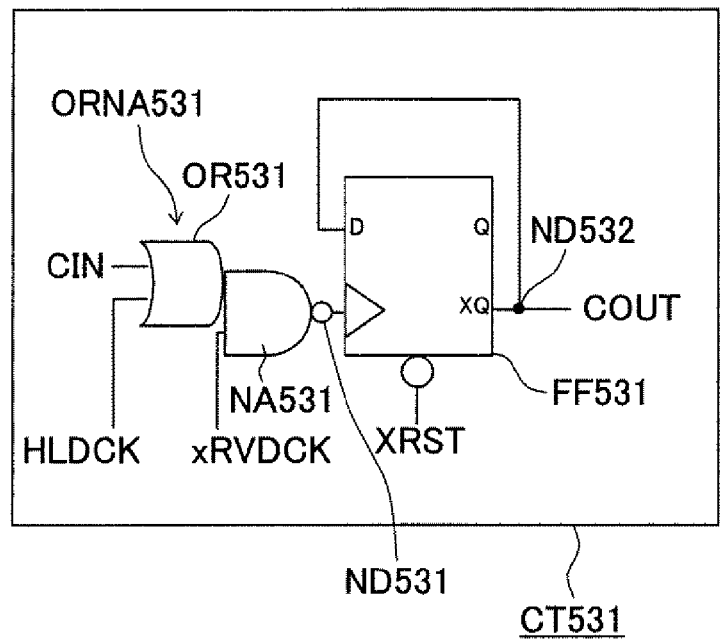
FIG. 29 is a circuit diagram illustrating an example of a specific configuration of the higher-bit ripple counter according to the present embodiment.

FIG. 29 is a circuit diagram illustrating an example of a specific configuration of the higher-bit ripple counter according to the present embodiment.

The higher-bit ripple counter in FIG. 29 represents a common circuit configuration of the ripple counters CT 531 through CT 540.

In this case, the ripple counter 531 will be described as the example.

The ripple counter CT 531 is configured by a flip-flop FF 531 and an ORNAND gate ORNA 531 disposed to the clock input stage of the flip-flop FF 531.

A previous-stage carry out COUT is input to a first input terminal of an OR gate OR 531 of the ORNAND gate ORNA 531 as a carry in CIN (clock input), and a first external control signal HLDCK is supplied to a second input terminal.

The output of the OR gate OR 531 is supplied to a first input terminal of an NAND gate NA 531, and a second external control signal xRVDCK is supplied to a second input terminal.

The output of the NAND gate NA 531 is connected to a clock node ND 531 of the flip-flop FF 531.

Latch data from an output node ND 532 is supplied to a Q input side of the flip-flop FF 531 when an output node ND 531 of the ORNAND gate ORNA 531 is at a low level.

Regarding the flip-flop FF 531, when the node ND 531 is at a high level, the latch data from the output node ND 532 has an inverted level to the level of the Q input side.

The ripple counter CT 531 having such a configuration also has a data inversion function when switching the P phase and the D phase.

Figure 30:
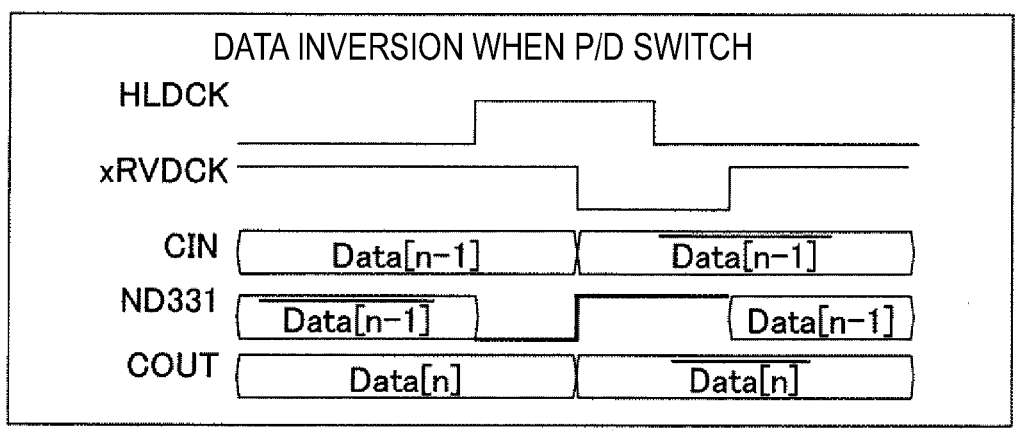
FIG. 30 is a diagram describing a data inversion function when switching the P phase and D phase regarding the ripple counter in FIG. 29.

FIG. 30 is a diagram describing a data inversion function when switching the P phase and D phase regarding the ripple counter CT 531 in FIG. 29.

Data during the P phase corresponds to a first data, and data during the D phase corresponds to a second data.

The ripple counter CT 531 in FIG. 29 directly controls the clock lines of each bit from the exterior, which enables data inversion of all bits to be achieved by a one-time forced adding of only the desired rising or falling edge for the count operation (data inversion).

According to the present example, the level of the node ND 531 may be switched from a low level to a high level by switching the second external control signal xRVDCK from a high level to a low level at a state in which the first external control signal HLDCK is maintained at a high level.

As a result, data may be inverted.

Figure 31:
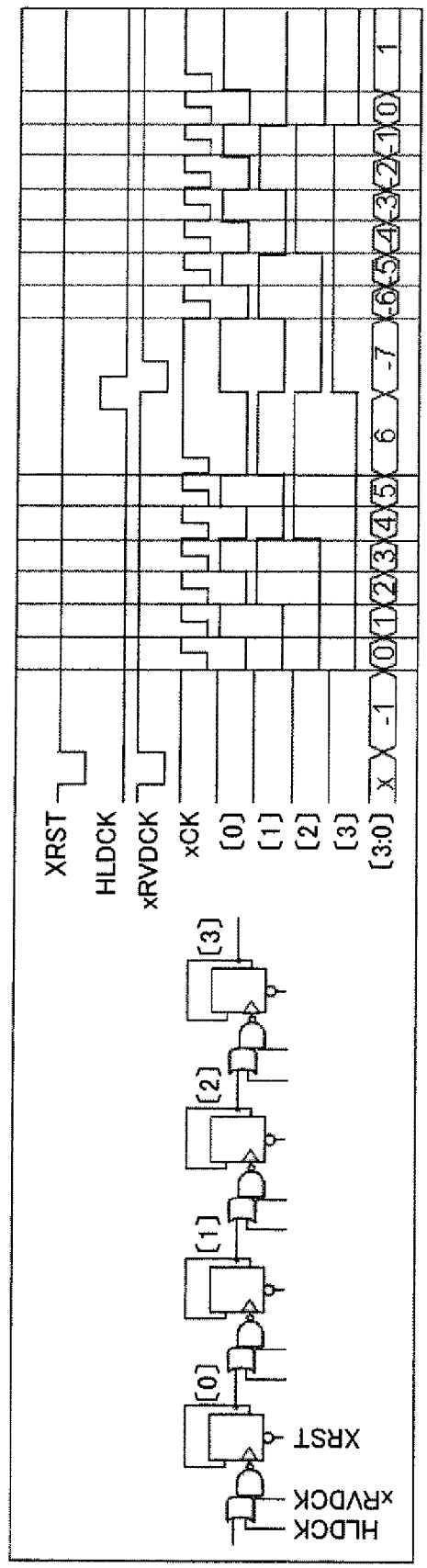
FIG. 31 is a diagram illustrating an example of a timing chart including state transitions of output data when four ripple counters are cascaded.

FIG. 31 is a diagram illustrating an example of a timing chart including state transitions of output data when four ripple counters are cascaded.

According to this example, a count-up operation is performed, and the second external control signal xRVDCK is switched from a high level to a low level at a state in which the first control signal HLDCK is maintained at a high level to perform the data inversion after the count value becomes [6].

As a result, a down count is switched from [−7].

In this way, the higher-bit counter 530 includes a function to perform higher-bit CDS processing for each column.

Therefore, regarding each column processing unit 500, the latched data for the lower 5 (N) bits of Gray codes GC [0] through GC [4] is output to the data transfer line LTRF, and the data processed by CDS by the ripple counter in each column for the higher 10 (M) bits are also output to the data transfer line LTRF.

This data is supplied to a signal processing circuit 180 via a data transfer line LTR, where complete CDS is performed.

Figure 32:
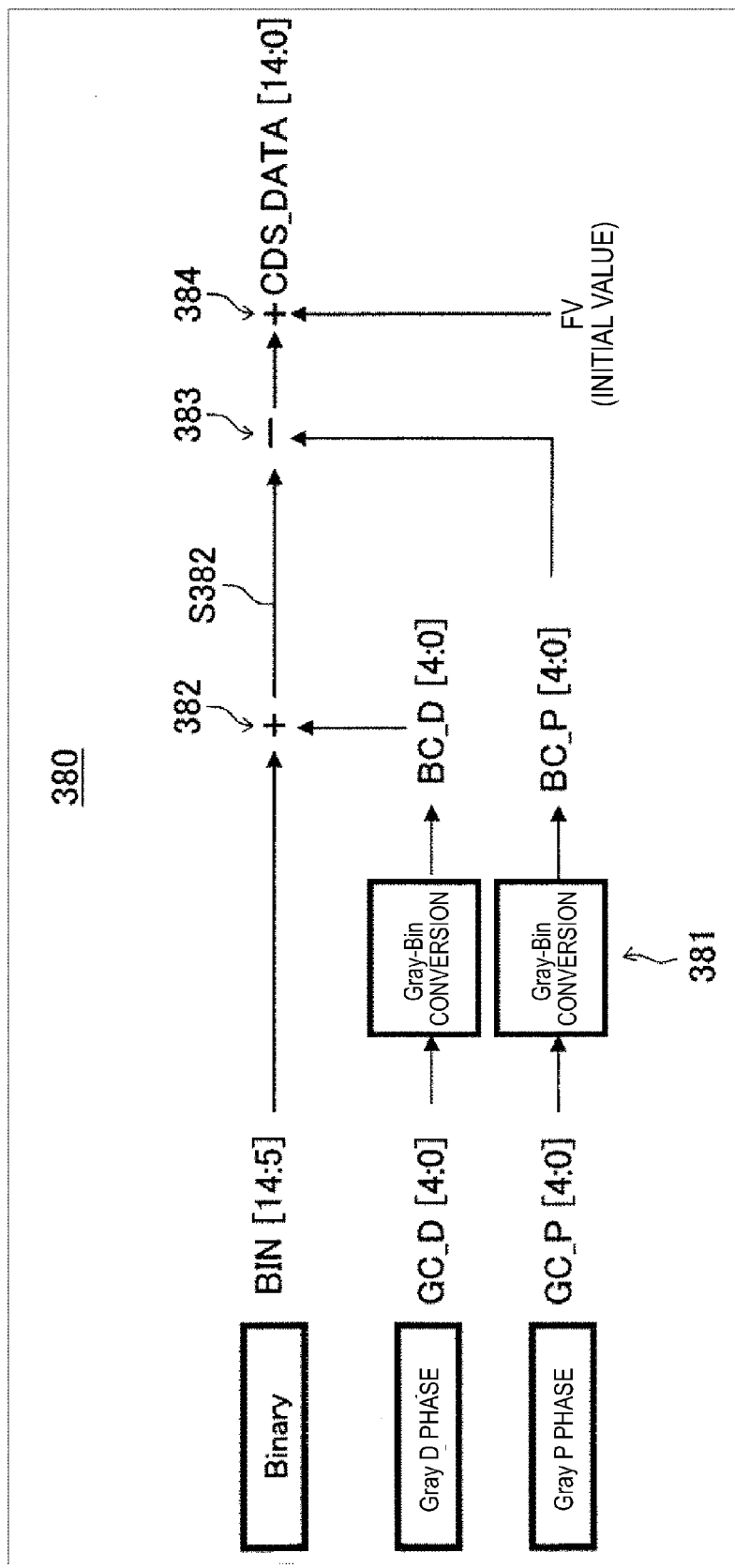
FIG. 32 is a diagram schematically illustrating a CSD calculation processing regarding a downstream signal processing unit according to the present embodiment.

FIG. 32 is a diagram schematically illustrating a CSD calculation processing regarding a downstream signal processing unit according to the present embodiment.

Figure 33:
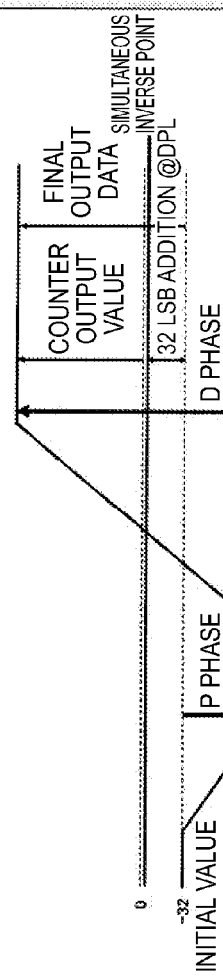
FIG. 33 is a diagram illustrating a specific example of the CDS calculation processing of binary data and Gray codes according to the present embodiment.

FIG. 33 is a diagram illustrating a specific example of the CDS calculation processing of binary data and Gray codes according to the present embodiment.

For simplification, the control to intentionally offset the count start code has been described with reference to FIG. 25, and so this description will be omitted regarding the following description of the CDS calculation processing.

As basically illustrated in FIG. 32, higher bits BIN [14:5], which is binary data previously processed by CDS, P-phase Gray code GC_P [4:0], and D-phase Gray code GC_D [4:0] are input into the signal processing circuit 380.

The signal processing circuit 380 includes a conversion circuit 181 to convert Gray codes into binary codes.

The conversion circuit 381 converts the P-phase Gray code GC_P [4:0] into a binary code BCP [4:0]

The conversion circuit 381 converts the D-phase Gray code GC_D [4:0] into a binary code BCD [4:0].

The signal processing circuit 380 adds the higher bits BIN [14:5] and the D-phase binary code BC_D [4:0] in an adding unit 382.

In addition, the signal processing circuit 380 subtracts the P-phase binary code BC_P [4:0] from an adding result S182 of the adding unit 382 in a subtracting unit 383.

Furthermore, the signal processing circuit 380 obtains a data CDS_DATA [14:10] completely processed by CDS calculation by adding an initial value FV (32 according to the present embodiment) to the subtracting result from the subtractor in an adding unit 384.

According to the example in FIG. 33, the P-phase and D-phase count is performed from a reset initial value of −32 to ultimately perform the aforementioned CDS calculation on the lower Gray codes in the signal processing circuit (DPU) 380.

This calculation may be expressed as illustrated here.

CDS data=binary data+*D*-phase Gray data-*P*-phase Gray data+32digits

That is to say,

CDS_DATA[14:0]=BIN [14:5]+*BC_D* [4:0]−*BC_P* [4:0]+32

In addition, it is possible to enable a configuration such that CDS processing is performed by adding the latch data for the lower-bit latch circuits 521 through 525 in the columns.

Figure 34:
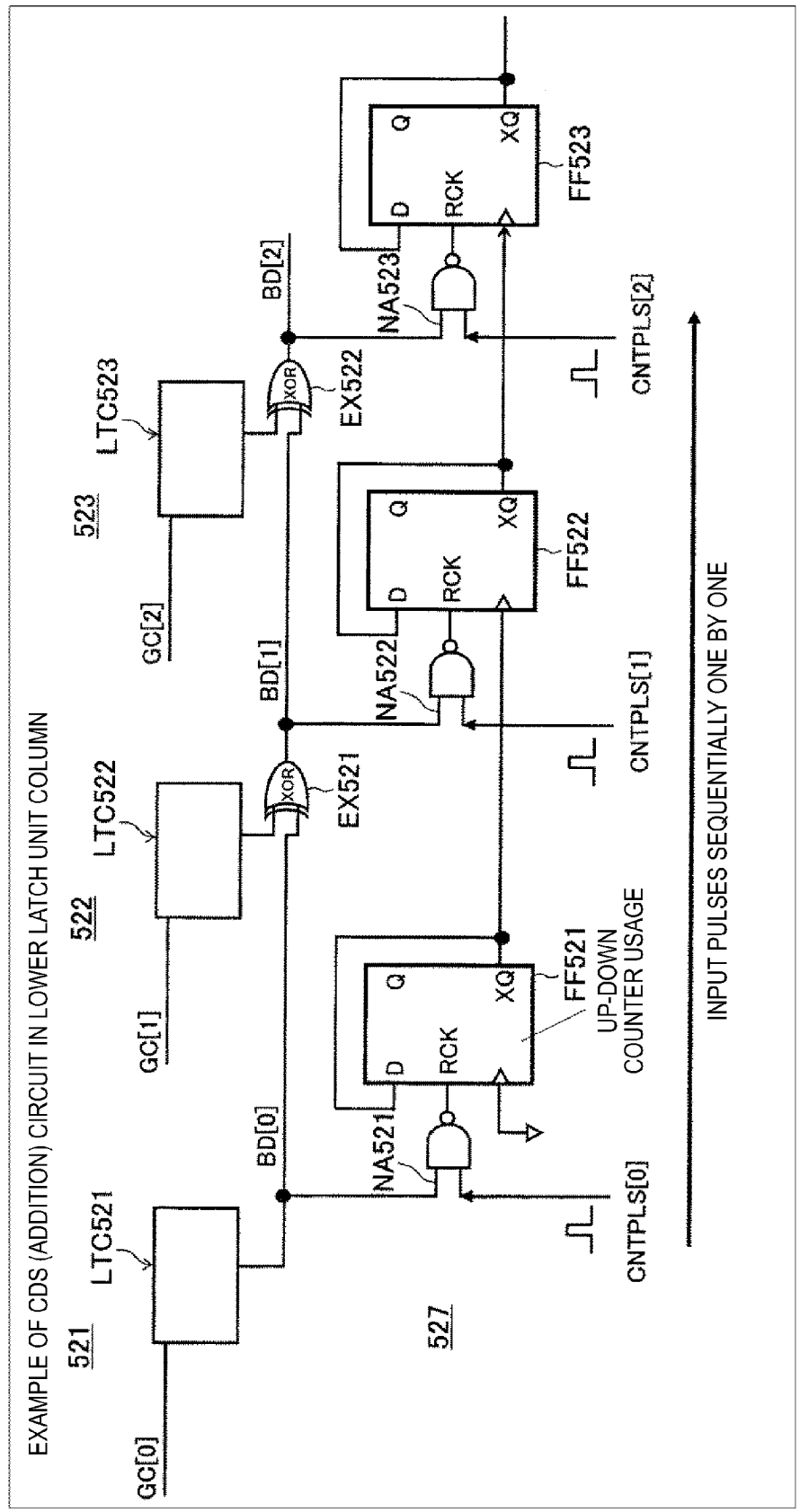
FIG. 34 is a circuit diagram illustrating an example configuration of a CDS processing unit performing addition processing and CDS processing on the latch data within the column for the lower-bit latch circuit.

FIG. 34 is a circuit diagram illustrating an example configuration of a CDS processing unit performing addition processing and CDS processing on the latch data within the column for the lower-bit latch circuit.

In addition to code latch units CLT 521 through LT52N (in this case, up to CLT 523 is illustrated), a CDS processing unit 527 includes flip-flops FF 521, FF 522, and FF 523 (FF 524 and FF 525) as up-down counters.

The CDS processing unit 527 includes a 2-input NAND gate NA 521, NA 522, NA 523 (NA 524 and NA 525), and an EXOR gate EX 521 and EX 522 (EX 523 and EX 524) as code conversion circuits.

This processing unit uses Gray code GC [0] latched by the code latch unit CL 521 in the least-significant lower-bit latch circuit 521 as the binary code BD [0] without making any changes.

The least-significant binary code [0] is supplied to the first input terminal of the NAND gate NA 521. A pulse signal CNTPLS [0] is supplied to the second input terminal of the NAND gate NA 521.

The output terminal of the NAND gate NA 521 is connected to a terminal RCK of the flip-flop FF 521.

In addition, an inverse output end XQ of the flip-flop FF 521 is connected to a data input terminal D of the same and a clock end of the next-stage flip-flop FF 522.

The flip-flop FF 521 outputs a carry when the latch data changes from 0 to 1.

The lower bits, excluding the least-significant bit, are converted into binary codes BD [1] through BD [5] by taking the exclusive logical sum (EXOR) of the Gray codes GC latched at this stage and the binary codes BD of the previous stage.

That is to say, the Gray code GC [1] latched to the code latch unit CLT 522 in the lower-bit latch circuit 522 is converted to the binary code BD [1] by taking the EXOR of the previous-stage binary code BD [0] at the EXOR gate EX 521.

The least-significant binary code [1] is supplied to the first input terminal of the NAND gate NA 522. The pulse signal CNTPLS [1] is supplied to the second input terminal of the NAND gate NA 522.

The output terminal of the NAND gate NA 522 is connected to the terminal RCK of the flip-flop FF 522.

In addition, an inverse output end XQ of the flip-flop FF 522 is connected to the data input terminal D of the same and the clock end of the next-stage flip-flop FF 523.

The flip-flop FF 522 outputs a carry when the latch data changes from 0 to 1.

That is to say, the Gray code GC [2] latched to the code latch unit CLT 523 in the lower-bit latch circuit 523 is converted to the binary code BD [2] by taking the EXOR of the previous-stage binary code BD [1] at the EXOR gate EX 522.

The least-significant binary code [2] is supplied to the first input terminal of the NAND gate NA 523. The pulse signal CNTPLS [2] is supplied to the second input terminal of the NAND gate NA 523.

The output terminal of the NAND gate NA 523 is connected to the terminal RCK of the flip-flop FF 523.

In addition, an inverse output end XQ of the flip-flop FF 522 is connected to the data input terminal D of the same and the clock end of the next-stage flip-flop FF 523.

The flip-flop FF 523 outputs a carry when the latch data changes from 0 to 1.

Hereafter, the same processing is performed at the stages for the lower-bit latch circuits 524 and 525.

Further, the pulse signals CNTPLS [0], [1], [2], [3], and [4] are input sequentially one by one.

As previously described, the first column ADC according to the present embodiment may obtain the advantages as illustrated below by adopting the control to intentionally offset the count start code.

That is to say, according to the present embodiment, the amount of IR drop due to counter operation is reduced, the amount of fluctuation in power source voltage is reduced, and operation at a low power source voltage is readily achieved For example, the configuration may include a logical sum (OR) taken from the code offset path and clock supply path of the multiple counters arranged in an array, and a pseudo count operation is performed before the counter clock supply to intentionally offset the count start code As a result, by dispersing the current consumed during the count operation, the amount of IR drop may be reduced and counter characteristic degradation may be mitigated, which improves image quality By intentionally offsetting the count start code, advantages include a reduction in the IR drop, a reduction in the amount of fluctuation in power source, and an improvement in the ability of operation at a low power source voltage Advantages include the capability to distribute the peak of the instantaneous current ΔI by intentionally offsetting the count start code, and avoiding increases in chip size due to adding pads The control to intentionally offset the count start code is simple and is processed during the period outside the count operation, which has no effect on counter characteristics and enables simple maintenance In addition, circuits do not have to be provisioned for each array, and so there is little impact on size.

The first column ADC 350 according to the present embodiment is configured as follows as most of the power consumed in normal column ADCs is due to the lower bits of ripple counters in each column.

The column ADC 350 does not perform lower-bit counter operations in each column and instead adopts a configuration in which output codes from the N-bit Gray code counter 400 that counts in synchronization with the reference clock PLLCK and is provisioned in a one-per-many columns arrangement, and these output codes are latched each column. As a result, the AC conversion value is determined.

Regarding the column ADC 350 according to the present embodiment, the reference clock PLLCK generated by the PLL circuit in the timing control circuit 340 is only input into several units of the Gray code counter.

For this reason, the wiring load is light and the operating frequency may be increased.

In addition, regarding the column ADC 350 according to the present embodiment, the power consumed may be suppressed slightly as lower-bit count operations are not performed every column.

Regarding the first column ADC 350 and the higher bits of the counter, ripple counter operations may be performed using codes (clocks) for the Nth bit of counter output.

As a result, digital CDS may be performed in columns, which enables suppression of the horizontal transfer wiring area.

In addition, the column ADC 350 may have a configuration that performs a so-called vertical (V) direction addition within columns regarding the latched lower bits by arranging an adder or similar in columns.

The column ADC 350 according to the present embodiment enables suppression of the power consumed to approximately ⅛ of that compared to a full-bit ripple counter method with the same temporal resolution.

According to the present embodiment, incorrect counts by counters due to inconsistencies in Gray and binary bits, which are characteristic of the composite counter method for Gray codes and binary codes, may also be prevented.

<2.8 Basic Configuration Example of First Column ADC>

Next, the second column ACD (column A/D converter) configured including a full-bit binary code counter will be described.

Figure 35:
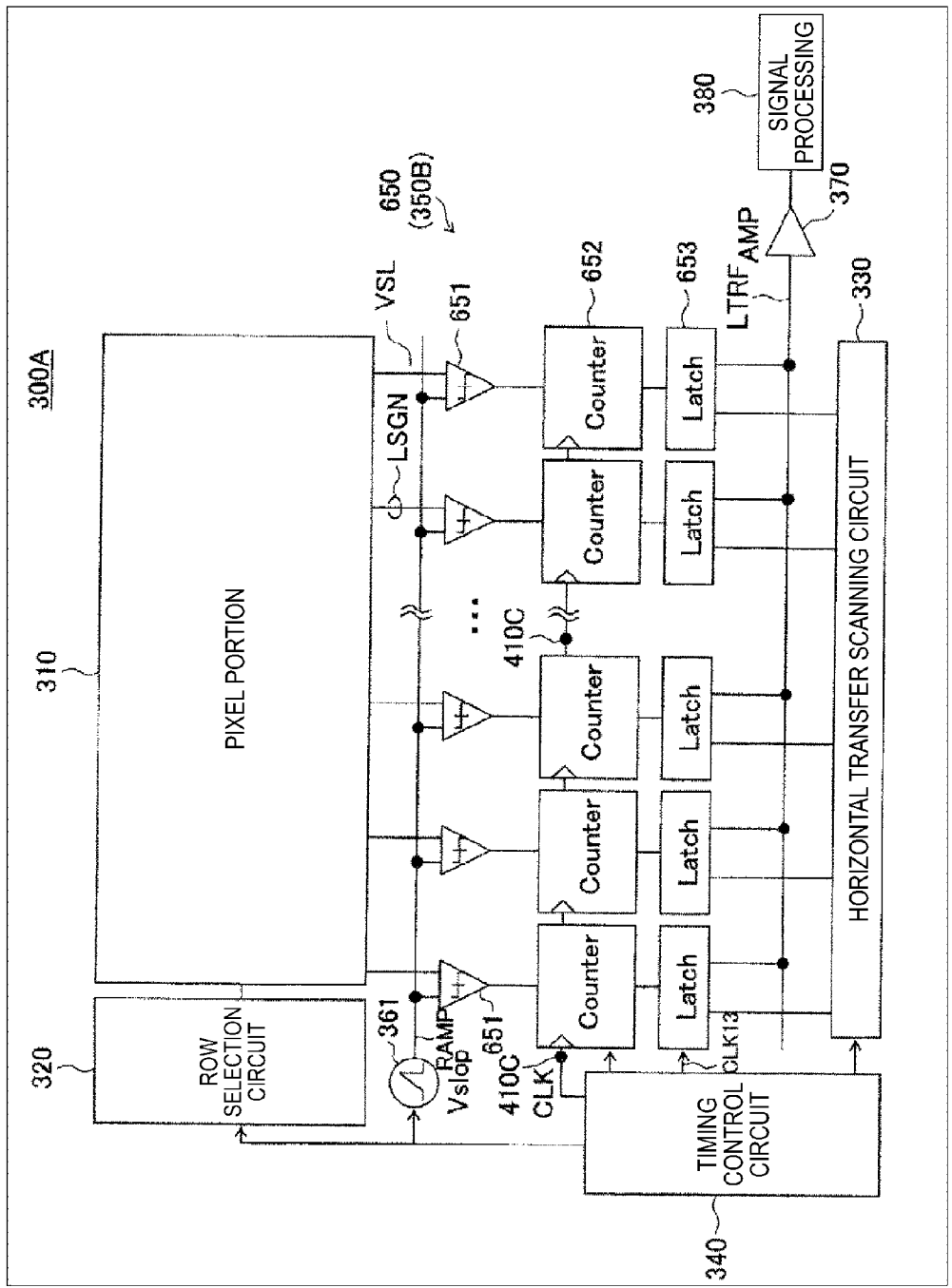
FIG. 35 is a diagram illustrating an example configuration of another main portion of the solid imaging device (CMOS image sensor) equipped with parallel column ADCs in FIG. 13 and is also a diagram illustrating an example of a basic configuration of a second column ADC (column A/D converter) according to the present embodiment.

FIG. 35 is a diagram illustrating an example configuration of another main portion of the solid imaging device (CMOS image sensor) equipped with parallel column ADCs in FIG. 13 and is also a diagram illustrating an example of a basic configuration of the second column ADC (column A/D converter) according to the present embodiment.

Reference numeral 650 is applied to the configuration of the second column ADC 350B for the description regarding FIG. 35.

The second column ADC 650 (350B) is disposed with multiple arrays of single slope ADCs that include a comparator 651, a counter 652, and a latch 653.

The comparator 651 compares a reference voltage Vslop, which is a ramp waveform (RAMP) generated by a DAC 361 in which the reference voltage changes in steps, and an analog signal obtained via a vertical signal line LSGN from pixels per row line.

The counter 652 counts the comparison time of the comparator 651.

The second column ADC 650 includes a function to convert an n-bit digital signal, is disposed per vertical signal line (column line), and is configured by parallel column ADC blocks.

The output from each latch 653 is connected, for example, to a horizontal transfer line LTRF that has a width of 2n bits.

In addition, a 2n number of amp circuits 370 and the signal processing circuit 380 are arranged corresponding to the horizontal transfer line LTRF.

The analog signal (potential Vsl) read from the signal line LSGN is compared to the reference voltage Vslop (a slope waveform with a changing inclination) by the comparator 651 arranged per column.

In this case, the counter 652 arranged per column similar to the comparator 651 operates, and the potential (analog signal) VSL from the signal line LSGN is converted to a digital signal by taking and changing the counter value having a one-to-one correspondence with the potential Vslop, which is the ramp waveform RAMP.

Changes of the reference voltage Vslop convert changes in potential to changes in time, and so is converted into a digital signal by counting this time by some frequency (clock).

When the analog electrical signal VSL and the reference voltage Vslop changes, the output of the comparator 651 inverts, the input clock for the counter 652 stops, and then the AD conversion is complete.

After the AD conversion period is complete, the data stored in the latch 353 is input by the horizontal transfer circuit 330 to the signal processing circuit 380 through the amp circuit 370, and a two-dimensional image is generated.

Parallel column output processing is performed in this way.

The control to intentionally offset the count start code is also applied to the second column ADC 650 in the same way as the first column ADC 350A.

Figure 36:
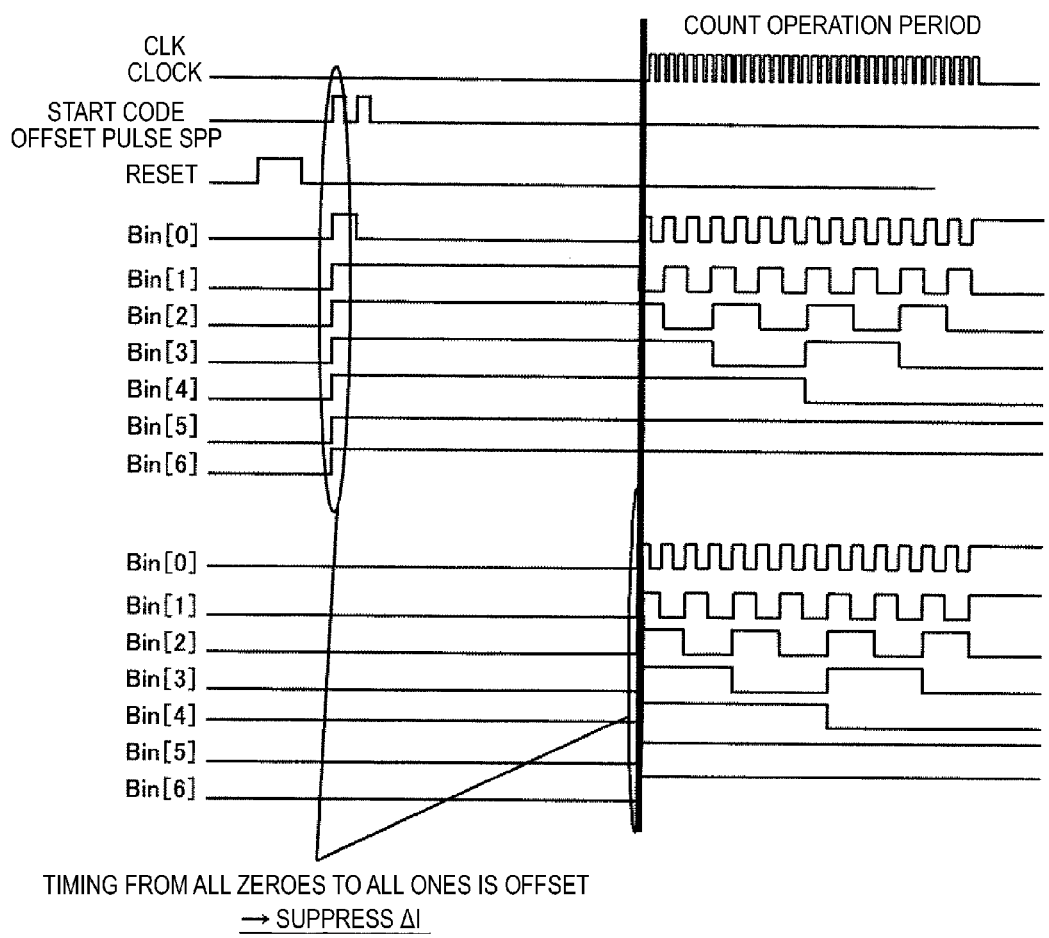
FIG. 36 is a diagram illustrating a specific timing chart of control that intentionally offsets the count start code applied to the second column ADC.

FIG. 36 is a diagram illustrating a specific timing chart of control that intentionally offsets the count start code applied to the second column ADC.

The control to intentionally offset the count start code is basically the same for the case of the first column ADC described with reference to FIG. 17.

That is to say, after a reset timing for the counter circuit, the control to intentionally offset the count start code inputs a different pulse value for each of a group of multiple columns functioning as a group beforehand, which is a simple method to offset the count start code.

In this case, for example, a generated start code offset pulse SPP is supplied to each count start offset unit 410C with a different pulse value under the control of the timing control circuit 340.

Due to this control and as illustrated in FIG. 18 and FIG. 19, regarding the full-bit binary code counter, a clock reflect timing is distributed to the higher-bit binary codes of the counter circuits corresponding to the multiple columns. For this reason, power fluctuations during counting may be suppressed.

In addition, the timing of for the simultaneous operation to change the counter circuits (Gray code counter according to the present example) corresponding to the multiple columns from all zeroes to all ones, which has the most significant power fluctuation, is distributed in the same way.

This point is advantageous for both the composite counter for lower-bit Gray codes and higher-bit binary codes and the full-bit binary code counter.

[First Configuration Example of Count Start Offset Unit 410C]

Figure 37:
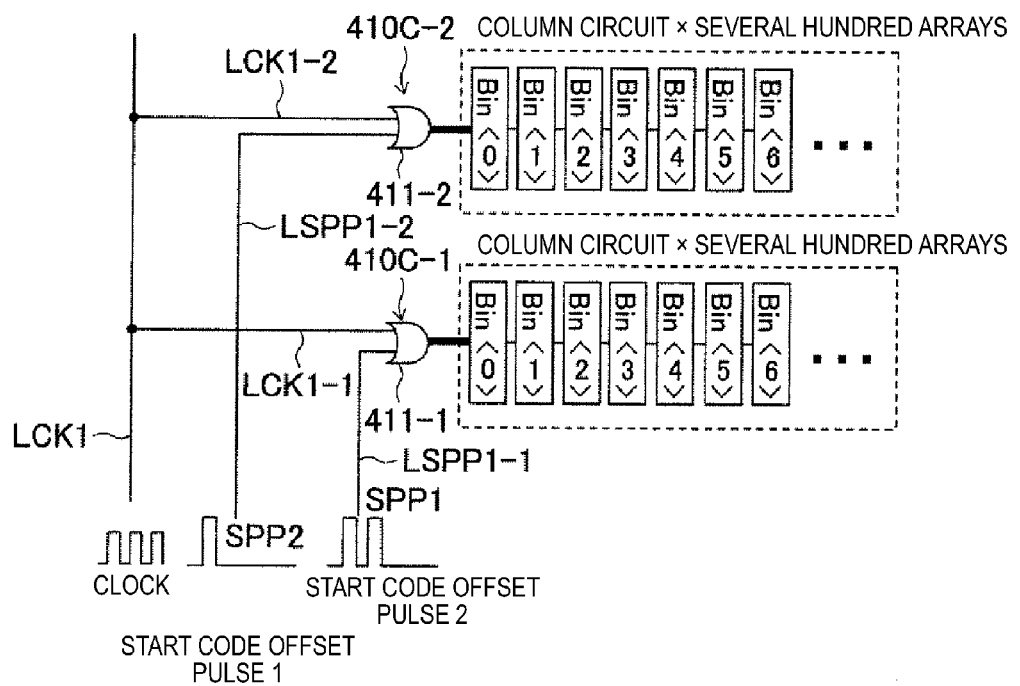
FIG. 37 is a diagram illustrating an example of a first configuration of a count start offset unit applicable to the second column ADC according to the present embodiment.

FIG. 37 is a diagram illustrating an example of a first configuration of a count start offset unit applicable to the second column ADC according to the present embodiment.

The first configuration example is similar to the configuration in FIG. 21.

That is to say, the configuration in FIG. 21 is provisioned with a clock supply path LCK1 and a code offset path LSPP1 in the counter circuit, and logical sum (OR) circuits 411-1 and 411-2 are disposed to enable a logical sum on both paths of the count start offset circuits 410C-1 and 410C-2.

In this case, detailed description will be omitted.

[Second Configuration Example of Count Start Offset Unit 410C]

Figure 38:
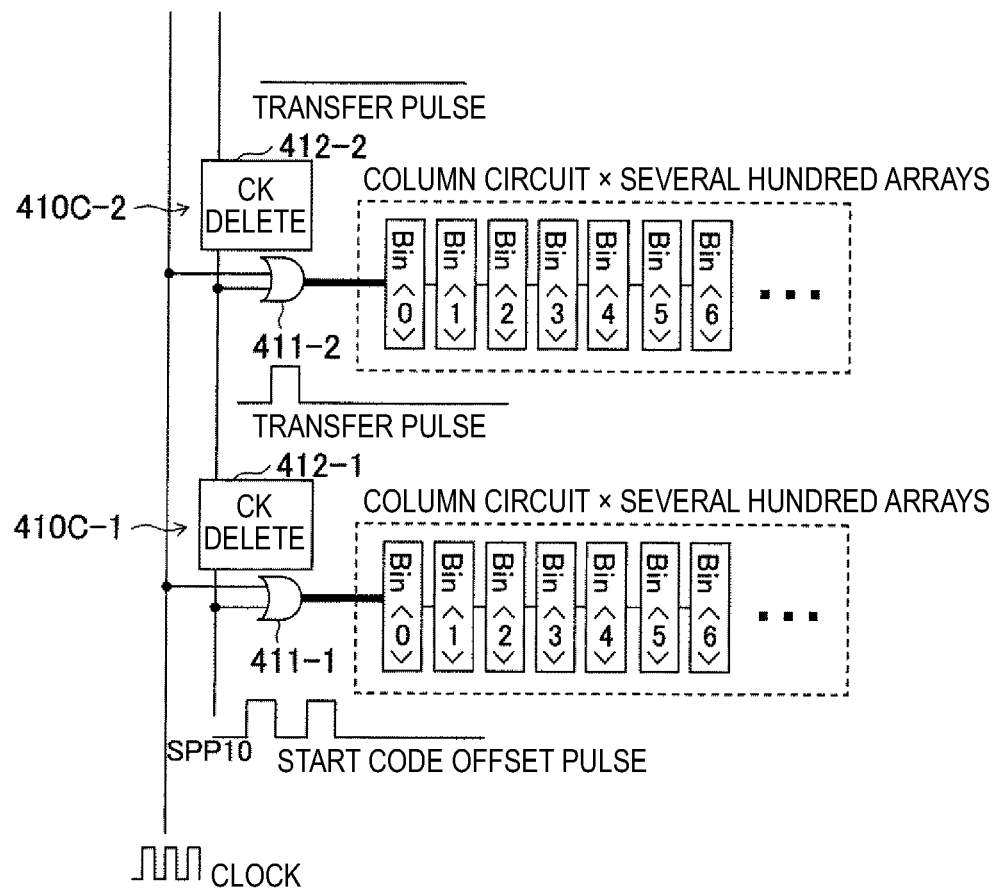
FIG. 38 is a diagram illustrating an example of a second configuration of a count start offset unit applicable to the second column ADC according to the present embodiment.

FIG. 38 is a diagram illustrating an example of a second configuration of a count start offset unit applicable to the second column ADC according to the present embodiment.

The second configuration example is similar to the configuration in FIG. 23.

According to the second configuration example, a code offset pulse SPP10 including multiple pulses is propagated to one main code offset path MLSPP1.

The main code offset path MLSPP1 branches to a secondary code offset path SLSSP1-1 and -2 at the input stage of the OR circuit 411-1 and -2 for each group.

According to the configuration in FIG. 23, the pulse value adjustment unit 412-1, 412-2, . . . are also disposed to adjust (delete) the number of pulses before the branched region of the main code offset path MLSPP1.

In this case, detailed description will be omitted.

[CDS Reading Method when Adopting Control to Intentionally Offset the Count Start Code]

Figure 39:
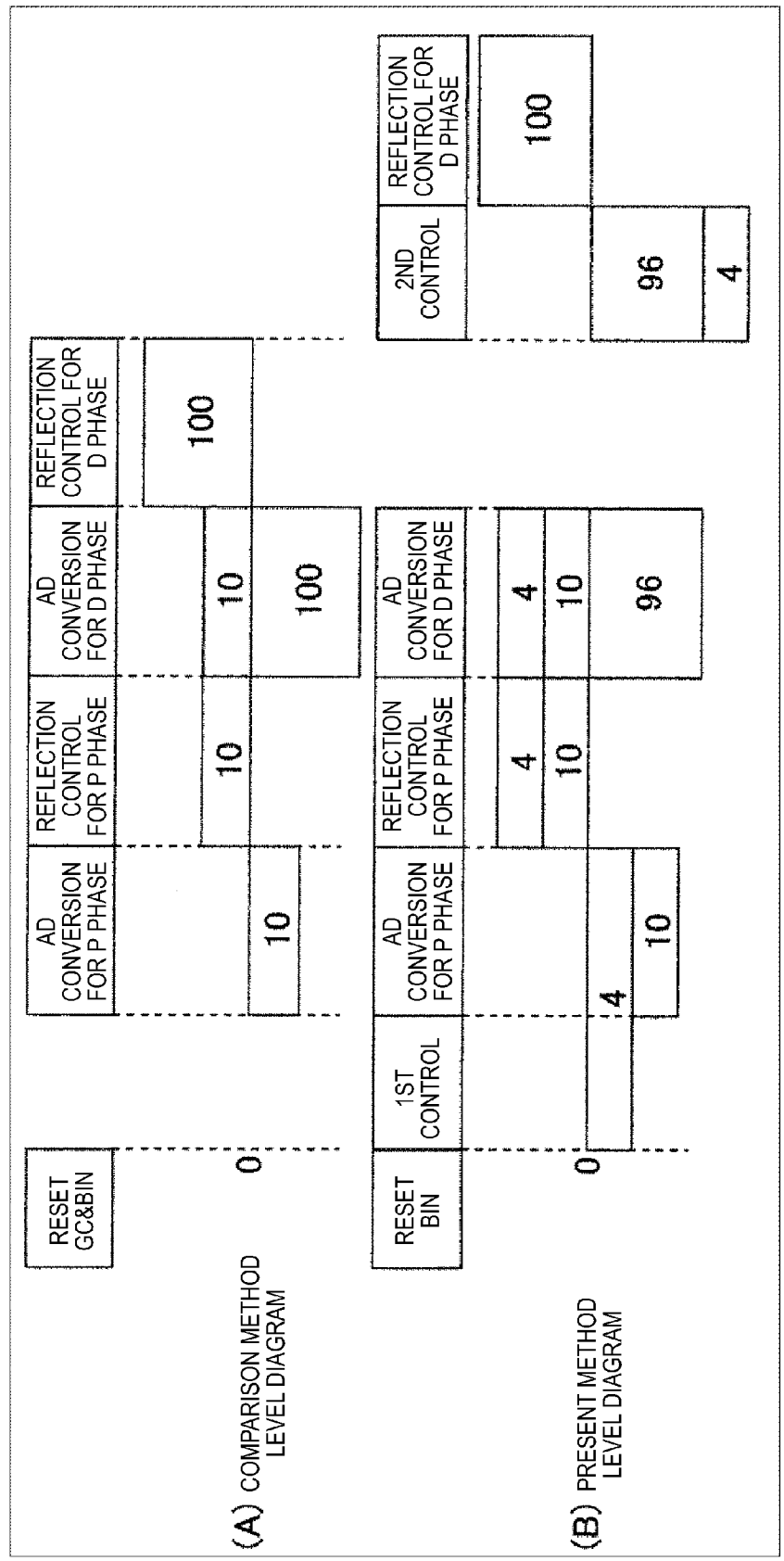
FIG. 39 is a diagram schematically illustrating the CDS read method when adopting and not adopting the control that intentionally offsets the count start code for the second column ADC.

FIGS. 39 (A) and (B) are diagrams schematically illustrating a CDS read method when adopting and not adopting the control that intentionally offsets the counter start code to the second column ADC.

FIG. 39 (A) illustrates the case when not adopting the control to intentionally offset the count start code, and FIG. 39 (B) illustrates the case when adopting the control to intentionally offset the count start code.

It is possible for the control to intentionally offset the count start code to read only the original signal by implementing a reset before reading the reference (first control in the drawing), reading the post-transfer signal, and then implementing offset control for the D phase (second control in the drawing).

This is because adding the offset control before the D-phase processing results in a return to the original regarding the second column ADC 650.

By adopting the control to intentionally offset the count start code, the second column ADC according to the present embodiment may obtain advantages similar to the advantages of the previously described first column ADC.

That is to say, according to the second column ADC, the amount of IR drop due to counter operation is reduced, the amount of fluctuation in power source voltage is reduced, and operation at a low power source voltage is readily achieved.

For example, the configuration may include a logical sum (OR) taken from the code offset path and clock supply path of the multiple counters arranged in an array, and a pseudo count operation is performed before the counter clock supply to intentionally offset the count start code.

As a result, by dispersing the current consumed during the count operation, the amount of IR drop may be reduced and counter characteristic degradation may be mitigated, which improves image quality.

By intentionally offsetting the count start code, advantages include a reduction in the IR drop, a reduction in the amount of fluctuation in power source, and an improvement in the ability of operation at a low power source voltage.

Advantages include the capability to distribute the peak of the instantaneous current ΔI by intentionally offsetting the count start code, and avoiding increases in chip size due to adding pads.

The control to intentionally offset the count start code is simple and is processed during the period outside the count operation, which has no effect on counter characteristics and enables simple maintenance.

In addition, circuits do not have to be provisioned for each array, and so there is little impact on size.

The laminated structure in FIG. 5 is adopted for the solid imaging device (CMOS image sensor) 300 and 300A functioning as the semiconductor device previously described.

According to the present embodiment and regarding this laminated structure, the pixel portion 310 is basically arranged on the first chip 110.

The row selection circuit 320, the horizontal transfer circuit 330, the timing control circuit 340, the column ADC 650 (350), the DAC (ramp signal generator) 361, the amp circuit (S/A) 370, the signal processing circuit 380, and the horizontal transfer line LTRF are arranged on the second chip 120.

In addition, a pixel drive signal, analog read signal from the pixel (sensor), power voltage, and so on are exchanged between the first chip 110 and the second chip 120 via a TCV formed on the first chip 110.

<3.1 Configuration Example of First Arrangement of the Solid Imaging Device>

A configuration example in which the configuration elements of the CMOS image sensor equipped with parallel column ADCs in FIG. 35 is arranged on the first chip and the second chip will be described.

Figure 40:
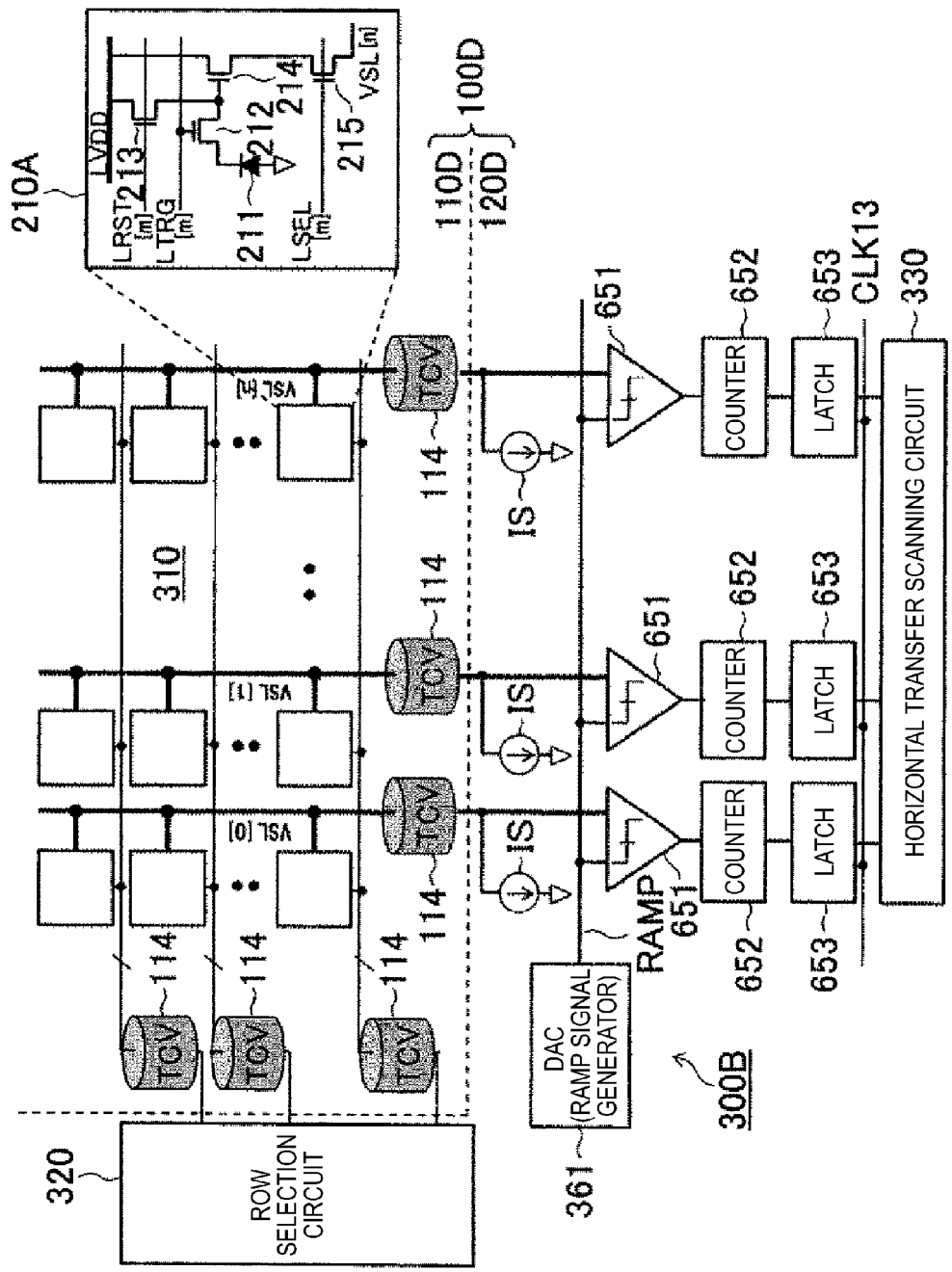
FIG. 40 is a diagram illustrating an example configuration of a first arrangement of a circuit regarding the CMOS image sensor equipped with parallel column ADCs according to the present embodiment.

FIG. 40 is a diagram illustrating an example configuration of a first arrangement of a circuit regarding the CMOS image sensor equipped with parallel column ADCs according to the present embodiment.

FIG. 40 illustrates a first chip 110D and a second chip 120D extending two-dimensionally so that the arrangement of circuits and other portions of the first chip 110A and the second chip 120A having a laminated structure may be readily understood.

The timing control circuit 340, amp circuit 370, and signal processing circuit 380 are omitted in FIG. 40. These circuits are also arranged on the second chip 120D.

Regarding this laminated structure as previously described, the pixel portion 310 is basically arranged on the first chip 110D.

The row selection circuit 320, the horizontal transfer circuit 330, the timing control circuit 340, the comparator 651 in the column ADC 650, the counter 652, the latch 653, and the DAC (ramp signal generator) 361 are arranged on the second chip 120D.

In addition, a pixel drive signal, analog read signal from the pixel (sensor), power voltage, and so on are exchanged between the first chip 110D and the second chip 120D via a TCV formed on the first chip 110D.

According to the present embodiment, amplifying transistors, etc. arranged on the first chip 110D and the constant current source IS forming the source follower are disposed to the second chip 120D side.

The example arrangement configuration in FIG. 40 is designed similarly to the example arrangement configuration in FIG. 9.

Regarding the solid imaging device (CMOS image sensor) 300B in FIG. 40, a transfer control signal TRG, which controls the on/off of the transfer transistors (transfer switches) output from the row selection circuit 320, functions in the same way as the first clock CLK 11 regarding FIG. 5.

Errors due to interference from adjacent TCVs as illustrated in FIG. 6 may be suppressed when transferring signals by controlling the generation timing of the corresponding ramp waveform to wait for a time until the VSL [m] has sufficiently settled.

Figure 41:
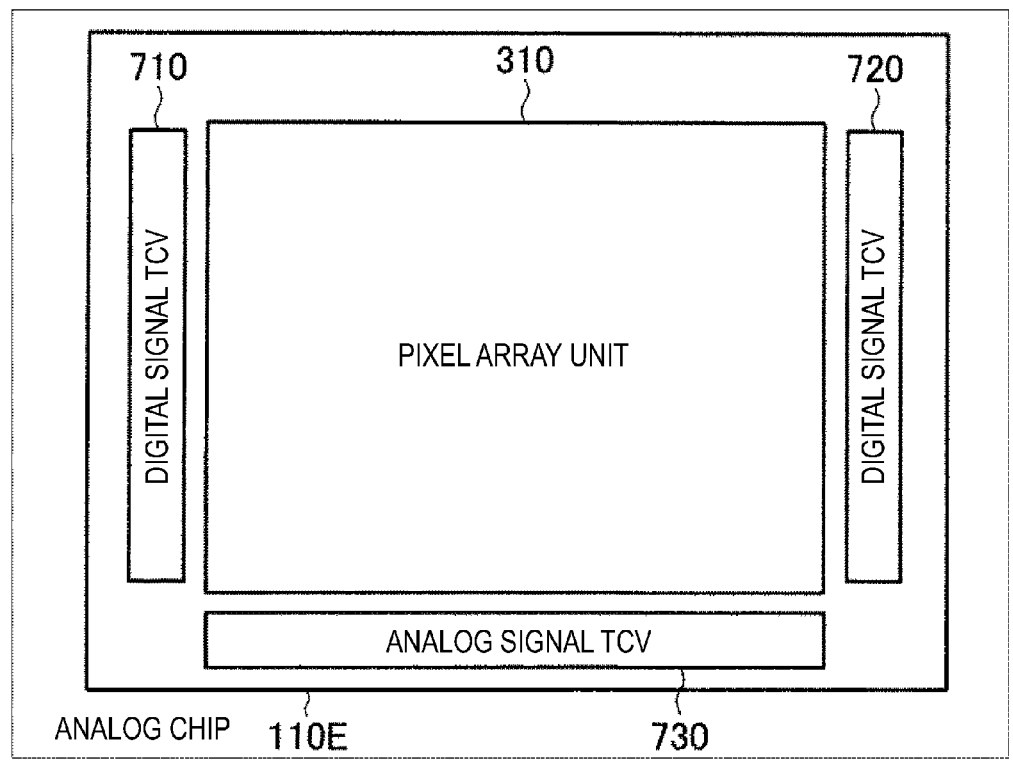
FIG. 41 is a diagram illustrating an example of centrally arranging a TCV for transmitting discrete time analog signals and separately arranging TCVs for transmitting digital signals.

FIG. 41 is a diagram illustrating an example of centrally arranging TCV for transmitting discrete time analog signals and separately arranging TCV for transmitting digital signals.

Interference from adjacent TCVs is suppressed by implementing a configuration such as previously described.

However, regarding the system in FIG. 40, for example, the output from the row selection circuit 320 is a typical digital signal for turning switches on and off, and interference from these signals to the signal line LSGN [n] is not readily reduced.

Therefore, according to the present technology and as illustrated in FIG. 41, it is effective to centrally arrange TCVs for transmitting discrete time analog signals and separately arranging TCV for transmitting digital signals.

According to the example in FIG. 41, a TCV arrangement region 710 and 720 for digital signals is formed on both the left and right sides of the pixel portion 310 in FIG. 41 regarding a first chip 110E.

In addition, a TCV arrangement region 730 for analog signals is formed on the lower side of the pixel portion 310 in FIG. 41.

<3.2 Configuration Example of Second Arrangement of the Solid Imaging Device>

Figure 42:
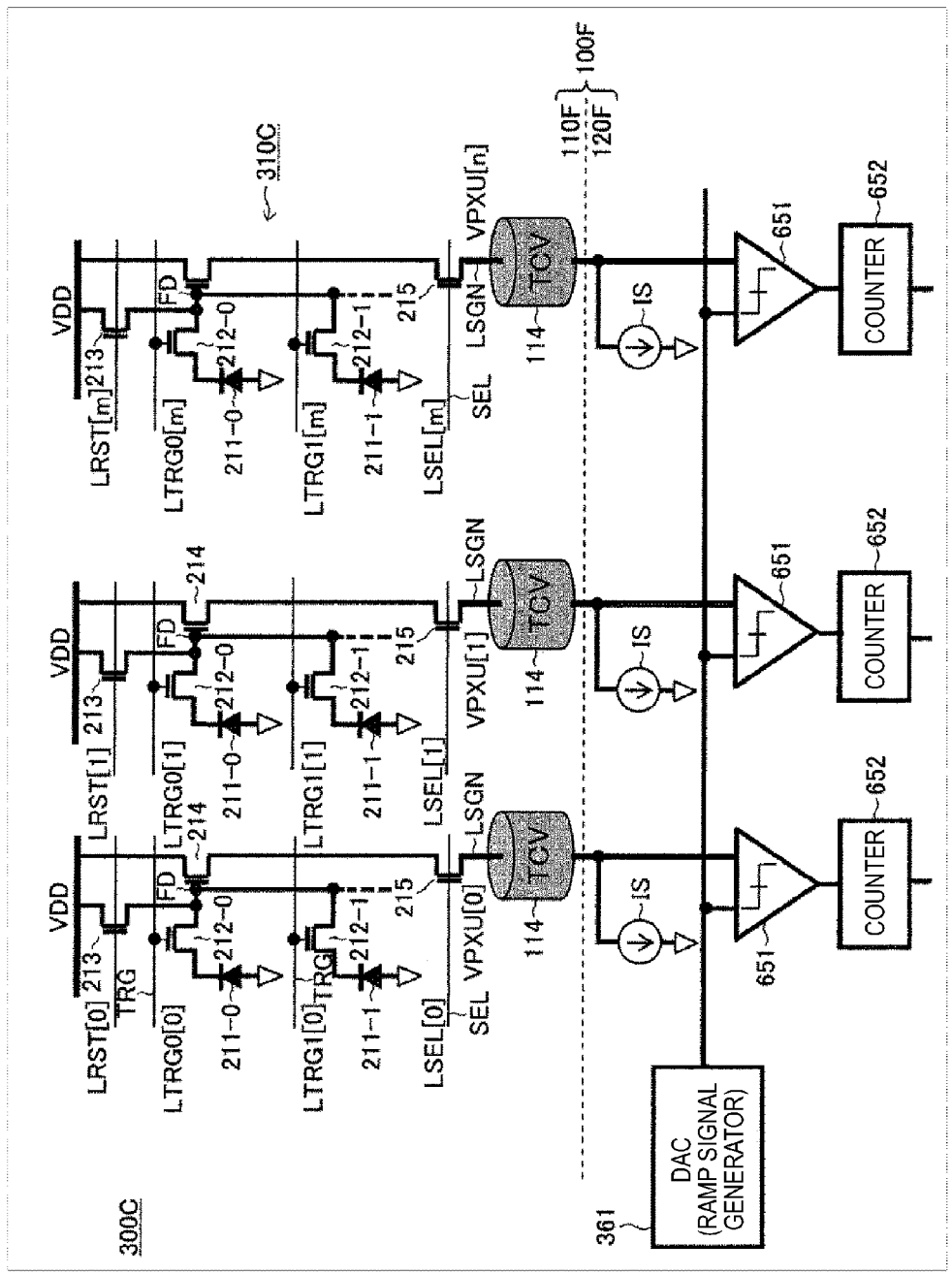
FIG. 42 is a diagram illustrating an example configuration of a second arrangement of a circuit regarding the CMOS image sensor equipped with parallel column ADCs according to the present embodiment.

FIG. 42 is a diagram illustrating an example configuration of a second arrangement of a circuit regarding the CMOS image sensor equipped with parallel column ADCs according to the present embodiment.

A CMOS image sensor 300C in FIG. 42 is an example of the pixel portion 310C having one floating diffusion FD common to multiple pixels.

According to the example in FIG. 42, the floating diffusion FD, the reset transistor 213, the amplifying transistor 214, and the selection transistor 215 are common for two pixels.

Each pixel is configured including the photoelectric conversion element (photodiode) 211 and the transfer transistor 212.

In this case as well, the pixel portion 310 is basically arranged on a first chip 110F, and other configurations are similar to that in FIG. 40.

<3.3 Configuration Example of Third Arrangement of the Solid Imaging Device>

Figure 43:
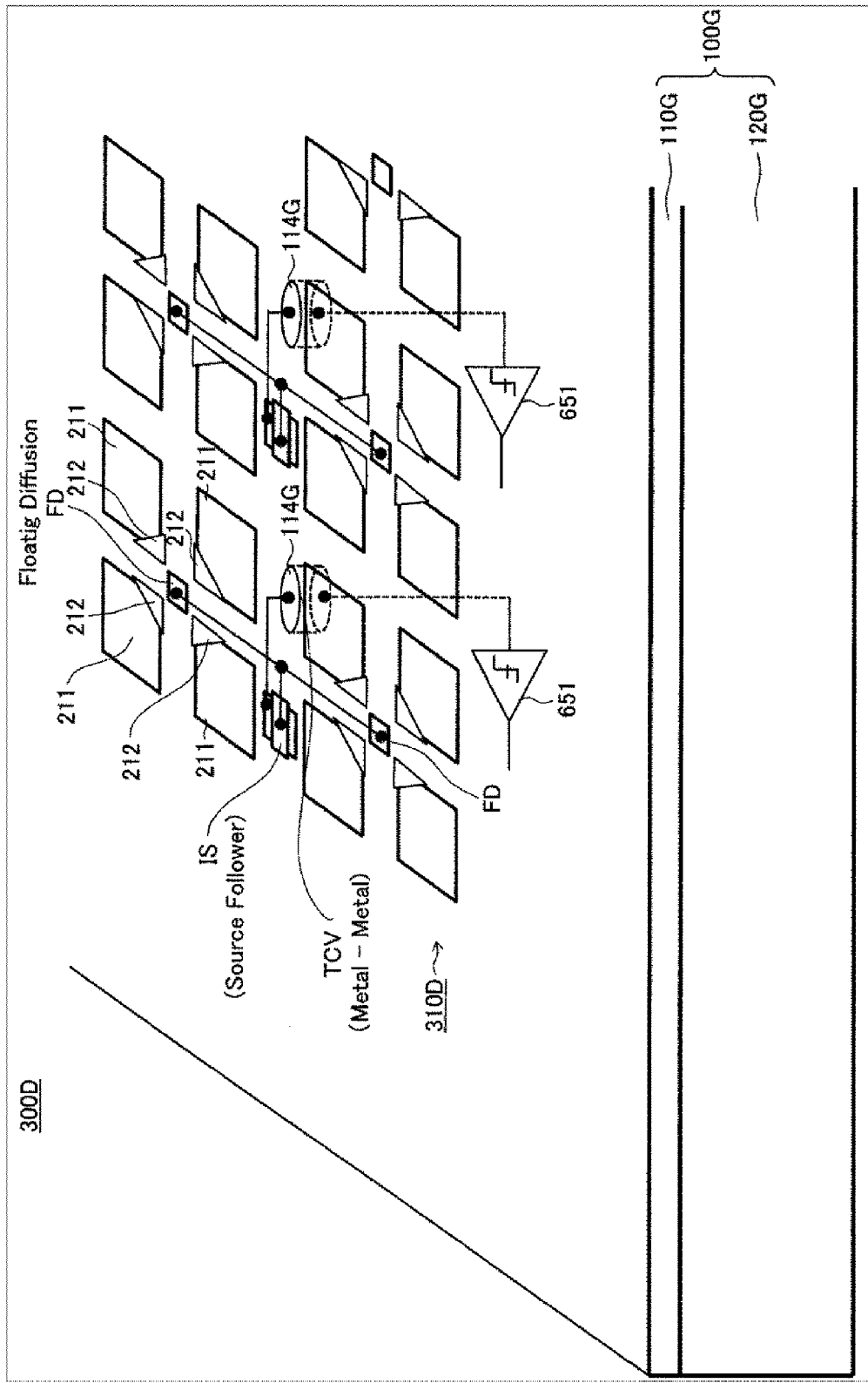
FIG. 43 is a diagram illustrating an example configuration of a third arrangement of a circuit regarding the CMOS image sensor equipped with parallel column ADCs according to the present embodiment.

FIG. 43 is a diagram illustrating an example configuration of a third arrangement of a circuit regarding the CMOS image sensor equipped with parallel column ADCs according to the present embodiment.

Similar to that in FIG. 42, a CMOS image sensor 300D in FIG. 43 is an example of the pixel portion 310D having one floating diffusion FD common to multiple pixels.

In this case as well, the pixel portion 310D is basically arranged on a first chip 110G.

According to this example, a TCV 114G is formed near the common region.

The TCV 114G is formed by a connection with metal (copper, for example) connecting electrodes formed on the first chip 110G and the second chip 120G. The pixel signal output to the signal line LSGN to the comparator 651 on the second chip 120G side through the TCV 114G.

The solid imaging device having a configuration and advantages such as previously described may be applied as an imaging device to a digital camera or video camera.

<4. Configuration Example of Camera System>

Figure 44:
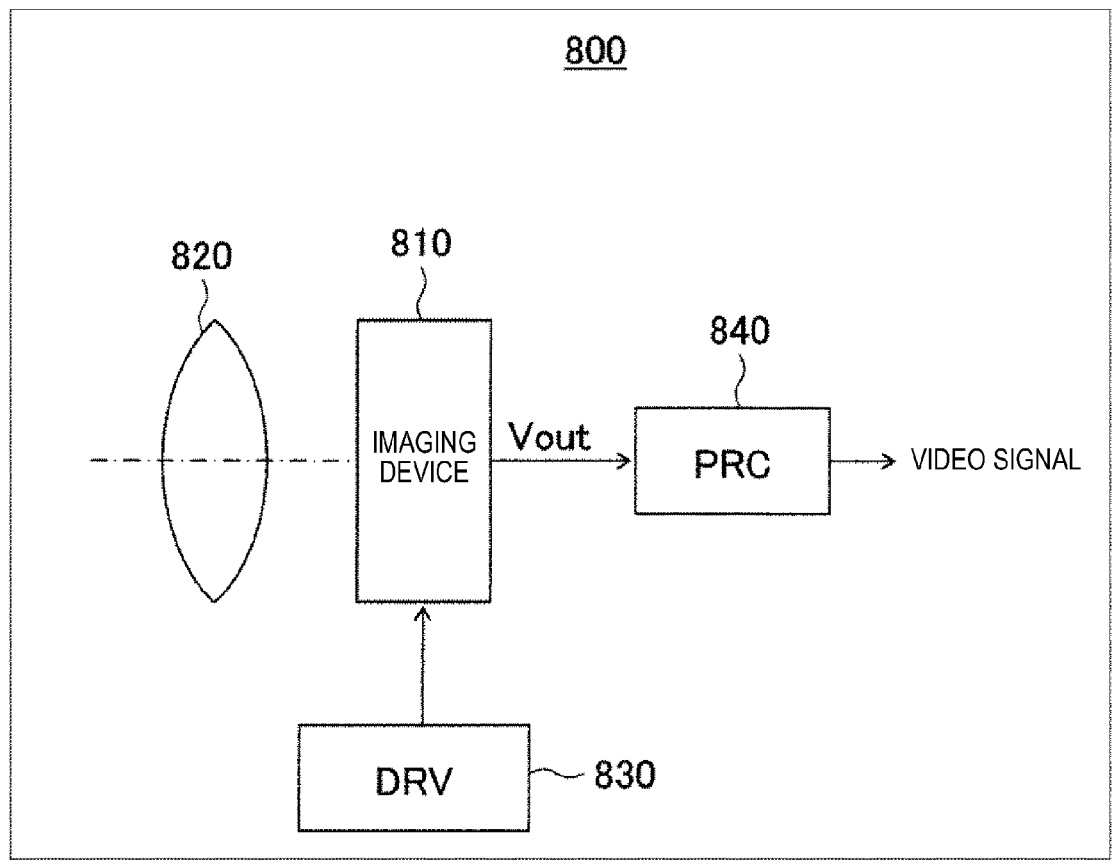
FIG. 44 is a diagram illustrating an example configuration of a camera system to which the solid imaging device according to the embodiments of the present invention is applied.

FIG. 44 is a diagram illustrating an example configuration of a camera system to which the solid imaging device according to the embodiments of the present invention is applied.

As illustrated in FIG. 44, a camera system 800 includes an imaging device 810 to which the solid imaging device 300 according to the present embodiment is applicable.

The camera system 800 includes a lens 820 that forms incident light (image light) on an imaging surface, for example, as an optical system that guides incident light (forms a subject image) on an imaging region of the imaging device 810.

The camera system 800 further includes a drive circuit (DRV) 830 that drives the imaging device 810 and a signal processing circuit (PRC) 840 that processing the signal output from the imaging device 830.

The drive circuit 830 includes a timing generator (not illustrated) that generates various timing signals including start pulses and clock pulses to drive the circuits internal to the imaging device 810, and so drives the imaging device 810 by a predetermined timing signal.

In addition, the signal processing circuit 840 conducts predetermined signal processing on the signal output from the imaging device 810.

The image signal processed by the signal processing circuit 840 is recorded to a recording medium such as memory, for example. The image information recorded on the recording medium is hard copied by a printer or other device. In addition, the image signal processed by the signal processing circuit 840 is displayed on a monitor made from a liquid crystal display or other device as a moving image.

As previously described, a high-precision camera may be achieved by equipping the previously described solid imaging device 300 as the imaging device 810 to an imaging device such as a digital still camera or other device.

Additionally, the present technology may also be configured as below.

(1)

A column A/D converter including:

a plurality of column processing units including an analog-digital (A/D) conversion function to convert analog signals into digital signals;

a plurality of counters configured to generate digital codes in response to a reference clock and arranged corresponding to each or a set of the columns; and a count start offset unit configured to trigger a pseudo count operation in each of the counters and to offset a count start code for at least two or more counters among the plurality of counters before the reference clock is supplied to the counters.

(2)

The column A/D converter according to (1), wherein the count start offset unit inputs a code offset pulse with a different pulse value into each counter before the reference clock is supplied to the counters.

(3)

The column A/D converter according to (1) or (2), wherein the count start offset unit includes a logical circuit configured to select the reference clock and the code offset pulse and to input the selected reference clock and code offset pulse into the counters.

(4)

The column A/D converter according to (3), wherein the code offset pulse with a different pulse value is supplied to the corresponding logical circuit through each of different code offset paths.

(5)

The column A/D converter according to (3), wherein the count start offset unit includes a pulse value adjustment unit configured to adjust the pulse value of the code offset pulses propagated to the code offset paths and to supply the adjusted the pulse value to the corresponding logical circuit.

(6)

The column A/D converter according to any one of (1) to (5), wherein the code counter generates the digital code by count processing based on the reference clock, and wherein each of the plurality of column processing units includes a plurality of comparators configured to compare a reference voltage having a ramp waveform in which the voltage value changes over time and the input voltage, and a latch counter unit configured to latch digital codes generated by the code counter in response to an inverted output signal from the comparator which acts as trigger when the output signal from the comparator is inverted.

(7)

A column A/D conversion method including:

when performing AD conversion regarding a plurality of column processing units each including an analog-digital (A/D) conversion function to convert analog signals into digital signals, and including a counter, triggering a pseudo count operation in the counter and offsetting a count start code for at least two or more counters among the plurality of counters before the reference clock is supplied to the counter; and generating digital codes in response to the reference clock in the counter and performing AD conversion using the digital codes.

(8)

The column A/D conversion method according to (7), wherein a code offset pulse with a different pulse value is supplied to the corresponding counter.

(9)

The column A/D conversion method according to (8), wherein the code offset pulse with a different pulse value is supplied to the corresponding counter through each of different code offset paths.

(10)

The column A/D conversion method according to (8), wherein the pulse value of the code offset pulses propagated to the code offset paths is adjusted and supplied to the corresponding counter.

(11)

A solid imaging device including:

a pixel portion in which a plurality of pixels performing photoelectric conversion are arranged in a matrix; and a pixel signal reading unit configured to read pixel signals per unit of a plurality of pixels from the pixel portion, wherein the pixel signal reading unit includes a column A/D converter to convert read analog signals into digital signals, and wherein the column A/D converter includes a plurality of column processing units including an analog-digital (A/D) conversion function to convert analog signals into digital signals, a plurality of counters configured to generate digital codes in response to a reference clock and arranged corresponding to each or a set of the columns, and a count start offset unit configured to trigger a pseudo count operation in the counters and to offset a count start code for at least two or more counters among the plurality of counters before the reference clock is supplied to the counters.

(12)

A solid imaging device including:

a pixel portion in which a plurality of pixels performing photoelectric conversion are arranged in a matrix;

a pixel signal reading unit configured to read pixel signals per unit of a plurality of pixels from the pixel portion;

a first chip; and a second chip, wherein the pixel signal reading unit includes a column A/D converter to convert read analog signals into digital signals, wherein the column A/D converter includes a plurality of column processing units including an analog-digital (A/D) conversion function to convert analog signals into digital signals, a plurality of counters configured to generate digital codes in response to a reference clock and arranged corresponding to each or a set of the columns, and a count start offset unit configured to trigger a pseudo count operation in the counters and to offset a count start code for at least two or more counters among the plurality of counters before the reference clock is supplied to the counters, wherein the first chip and the second chip are bonded having a laminated structure, wherein the first chip is disposed with a signal line to transfer analog pixel signals discretized by the pixel array unit and time, wherein the second chip is disposed with the pixel signal reading unit, and wherein wiring between the first chip and the second chip is connected by the via.

(13)

The solid imaging device according to (11) or (12), wherein the count start offset unit inputs a code offset pulse with a different pulse value into each counter before the reference clock is supplied to the counters.

(14)

The solid imaging device according to any one of (11) to (13), wherein the count start offset unit includes a logical circuit configured to select the reference clock and the code offset pulse and to input the selected reference clock and code offset pulse into the counters.

(15)

The solid imaging device according to (14), wherein the code offset pulse with a different pulse value is supplied to the corresponding logical circuit through each of different code offset paths.

(16)

The solid imaging device according to (14), wherein the count start offset unit includes a pulse value adjustment unit configured to adjust the pulse value of the code offset pulses propagated to the code offset paths and to supply the adjusted pulse value to the corresponding logical circuit.

(17)

The solid imaging device according to any one of (11) to (16), wherein the code counter generates the digital code by count processing based on the reference clock, and wherein each of the plurality of column processing units includes a plurality of comparators configured to compare a reference voltage having a ramp waveform in which the voltage value changes over time and the input voltage, and a latch counter unit configured to latch digital codes generated by the code counter in response to an inverted output signal from the comparator which acts as trigger when the output signal from the comparator is inverted.

(18)

A camera system including:

a solid imaging device; and an optical system configured to image a subject on the solid imaging device, wherein the solid imaging device includes a pixel portion in which a plurality of pixels performing photoelectric conversion are arranged in a matrix, and a pixel signal reading unit configured to read pixel signals per unit of a plurality of pixels from the pixel portion, wherein the pixel signal reading unit includes a column A/D converter to convert read analog signals into digital signals, and wherein the column A/D converter includes
a plurality of column processing units including an analog-digital (A/D) conversion function to convert analog signals into digital signals,
a plurality of counters configured to generate digital codes in response to a reference clock and arranged corresponding to each or a set of the columns, and
a count start offset unit configured to trigger a pseudo count operation in the counters and to offset a count start code for at least two or more counters among the plurality of counters before the reference clock is supplied to the counters.

(19)
A camera system including:
a solid imaging device; and
an optical system configured to image a subject on the solid imaging device,
wherein the solid imaging device includes
a pixel portion in which a plurality of pixels performing photoelectric conversion are arranged in a matrix,
a pixel signal reading unit configured to read pixel signals per unit of a plurality of pixels from the pixel portion,
a first chip, and
a second chip,
wherein the pixel signal reading unit includes
a column A/D converter to convert read analog signals into digital signals,
wherein the column A/D converter includes
a plurality of column processing units including an analog-digital (A/D) conversion function to convert analog signals into digital signals,
a plurality of counters configured to generate digital codes in response to a reference clock and arranged corresponding to each or a set of the columns, and
a count start offset unit configured to trigger a pseudo count operation in the counters and to offset a count start code for at least two or more counters among the plurality of counters before the reference clock is supplied to the counters,
wherein the first chip and the second chip are bonded having a laminated structure,
wherein the first chip is disposed with a signal line to transfer analog pixel signals discretized by the pixel array unit and time,
wherein the second chip is disposed with the pixel signal reading unit, and
wherein wiring between the first chip and the second chip is connected by the via.

REFERENCE SIGNS LIST 100, 100A-100G semiconductor device
110, 110A-110G first chip (analog chip)
111 (-0, -1, . . . ) sensor
112 (-0, -1, . . . ) sample and hold (SH) circuit
113 (-0, -1, . . . ) amp
114 (-0, -1, . . . ) TCV (via)
115 (-0, -1, . . . ) sampling switch
120, 120A-120G second chip (logic chip, digital chip)
121 (-0, -1, . . . ) sampling switch
122 (-0, -1, . . . ) quantizer
123 signal processing circuit
124 (-0, -1, . . . ) comparator
125 (-0, -1, . . . ) counter
200 solid imaging device
210 pixel portion
220 row selection circuit
230 column reading circuit
300, 300A-300C solid imaging device
310 pixel portion
320 row selection circuit
330 horizontal transfer scanning circuit
340 timing control circuit
350 column ADC (350-1-350-P: ADC block)
360 DAC (ramp signal generator)
370 amp circuit (S/A)
380 signal processing circuit
LTRF horizontal transfer line
400 (400-1-400-P) gray code counter
500 column processing unit
510 comparator
520 lower-bit latch unit
530 higher-bit latch unit (higher-bit counter unit)
800 camera system
650 column ADC
651 comparator
652 counter
653 latch
710, 720 digital signal TCV arrangement region
730 analog signal TCV arrangement region
810 imaging device
820 lens
830 drive circuit
840 signal processing circuit

The invention claimed is:
1. A column A/D converter comprising:
a plurality of column processing units including an analog-digital (A/D) conversion function to convert analog signals into digital signals;
a plurality of counters configured to generate digital codes in response to a reference clock and arranged corresponding to each or a set of the columns; and
a count start offset unit configured to trigger a pseudo count operation in each of the counters and to offset a count start code for at least two or more counters among the plurality of counters before the reference clock is supplied to the counters.
2. The column A/D converter according to claim 1, wherein the count start offset unit inputs a code offset pulse with a different pulse value into each counter before the reference clock is supplied to the counters.
3. The column A/D converter according to claim 1, wherein the code counter generates the digital code by count processing based on the reference clock, and
wherein each of the plurality of column processing units includes
a plurality of comparators configured to compare a reference voltage having a ramp waveform in which the voltage value changes over time and the input voltage, and
a latch counter unit configured to latch digital codes generated by the code counter in response to an inverted output signal from the comparator which acts as trigger when the output signal from the comparator is inverted.
4. The column A/D converter according to claim 1, wherein the count start offset unit includes a logical circuit configured to select the reference clock and the code offset pulse and to input the selected reference clock and code offset pulse into the counters.
5. The column A/D converter according to claim 4, wherein the code offset pulse with a different pulse value is supplied to the corresponding logical circuit through each of different code offset paths.

6. The column A/D converter according to claim 4,
wherein the count start offset unit includes a pulse value adjustment unit configured to adjust the pulse value of the code offset pulses propagated to the code offset paths and to supply the adjusted the pulse value to the corresponding logical circuit.

7. A column A/D conversion method comprising:
when performing AD conversion regarding a plurality of column processing units each including an analog-digital (A/D) conversion function to convert analog signals into digital signals, and including a counter,
triggering a pseudo count operation in the counter and offsetting a count start code for at least two or more counters among the plurality of counters before the reference clock is supplied to the counter; and
generating digital codes in response to the reference clock in the counter and performing AD conversion using the digital codes.

8. The column A/D conversion method according to claim 7,
wherein a code offset pulse with a different pulse value is supplied to the corresponding counter.

9. The column A/D conversion method according to claim 8,
wherein the code offset pulse with a different pulse value is supplied to the corresponding counter through each of different code offset paths.

10. The column A/D conversion method according to claim 8,
wherein the pulse value of the code offset pulses propagated to the code offset paths is adjusted and supplied to the corresponding counter.

11. A solid imaging device comprising:
a pixel portion in which a plurality of pixels performing photoelectric conversion are arranged in a matrix; and
a pixel signal reading unit configured to read pixel signals per unit of a plurality of pixels from the pixel portion,
wherein the pixel signal reading unit includes a column A/D converter to convert read analog signals into digital signals, and
wherein the column A/D converter includes
a plurality of column processing units including an analog-digital (A/D) conversion function to convert analog signals into digital signals,
a plurality of counters configured to generate digital codes in response to a reference clock and arranged corresponding to each or a set of the columns, and
a count start offset unit configured to trigger a pseudo count operation in the counters and to offset a count start code for at least two or more counters among the plurality of counters before the reference clock is supplied to the counters.

12. The solid imaging device according to claim 11,
wherein the count start offset unit inputs a code offset pulse with a different pulse value into each counter before the reference clock is supplied to the counters.

13. The solid imaging device according to claim 11,
wherein the code counter generates the digital code by count processing based on the reference clock, and
wherein each of the plurality of column processing units includes
a plurality of comparators configured to compare a reference voltage having a ramp waveform in which the voltage value changes over time and the input voltage, and
a latch counter unit configured to latch digital codes generated by the code counter in response to an inverted output signal from the comparator which acts as trigger when the output signal from the comparator is inverted.

14. The solid imaging device according to claim 11,
wherein the count start offset unit includes a logical circuit configured to select the reference clock and the code offset pulse and to input the selected reference clock and code offset pulse into the counters.

15. The solid imaging device according to claim 14,
wherein the code offset pulse with a different pulse value is supplied to the corresponding logical circuit through each of different code offset paths.

16. The solid imaging device according to claim 14,
wherein the count start offset unit includes a pulse value adjustment unit configured to adjust the pulse value of the code offset pulses propagated to the code offset paths and to supply the adjusted pulse value to the corresponding logical circuit.

17. A solid imaging device comprising:
a pixel portion in which a plurality of pixels performing photoelectric conversion are arranged in a matrix;
a pixel signal reading unit configured to read pixel signals per unit of a plurality of pixels from the pixel portion;
a first chip; and
a second chip,
wherein the pixel signal reading unit includes
a column A/D converter to convert read analog signals into digital signals,
wherein the column A/D converter includes
a plurality of column processing units including an analog-digital (A/D) conversion function to convert analog signals into digital signals,
a plurality of counters configured to generate digital codes in response to a reference clock and arranged corresponding to each or a set of the columns, and
a count start offset unit configured to trigger a pseudo count operation in the counters and to offset a count start code for at least two or more counters among the plurality of counters before the reference clock is supplied to the counters,
wherein the first chip and the second chip are bonded having a laminated structure,
wherein the first chip is disposed with a signal line to transfer analog pixel signals discretized by the pixel array unit and time,
wherein the second chip is disposed with the pixel signal reading unit, and
wherein wiring between the first chip and the second chip is connected by the via.

18. A camera system comprising:
a solid imaging device; and
an optical system configured to image a subject on the solid imaging device,
wherein the solid imaging device includes
a pixel portion in which a plurality of pixels performing photoelectric conversion are arranged in a matrix, and
a pixel signal reading unit configured to read pixel signals per unit of a plurality of pixels from the pixel portion,
wherein the pixel signal reading unit includes a column A/D converter to convert read analog signals into digital signals, and
wherein the column A/D converter includes
a plurality of column processing units including an analog-digital (A/D) conversion function to convert analog signals into digital signals, a plurality of counters configured to generate digital codes in response to a reference clock and arranged corresponding to each or a set of the columns, and a count start offset unit configured to trigger a pseudo count operation in the counters and to offset a count start code for at least two or more counters among the plurality of counters before the reference clock is supplied to the counters.

19. A camera system comprising:

a solid imaging device; and an optical system configured to image a subject on the solid imaging device, wherein the solid imaging device includes a pixel portion in which a plurality of pixels performing photoelectric conversion are arranged in a matrix, a pixel signal reading unit configured to read pixel signals per unit of a plurality of pixels from the pixel portion, a first chip, and a second chip, wherein the pixel signal reading unit includes a column A/D converter to convert read analog signals into digital signals, wherein the column A/D converter includes a plurality of column processing units including an analog-digital (A/D) conversion function to convert analog signals into digital signals, a plurality of counters configured to generate digital codes in response to a reference clock and arranged corresponding to each or a set of the columns, and a count start offset unit configured to trigger a pseudo count operation in the counters and to offset a count start code for at least two or more counters among the plurality of counters before the reference clock is supplied to the counters, wherein the first chip and the second chip are bonded having a laminated structure, wherein the first chip is disposed with a signal line to transfer analog pixel signals discretized by the pixel array unit and time, wherein the second chip is disposed with the pixel signal reading unit, and wherein wiring between the first chip and the second chip is connected by the via.

* * * * *